(12) United States Patent
Takeuchi et al.

(10) Patent No.: US 12,453,134 B2
(45) Date of Patent: *Oct. 21, 2025

(54) SEMICONDUCTOR DEVICE

(71) Applicant: Semiconductor Energy Laboratory Co., Ltd., Atsugi (JP)

(72) Inventors: Toshihiko Takeuchi, Atsugi (JP); Naoto Yamade, Isehara (JP); Yutaka Okazaki, Isehara (JP); Sachiaki Tezuka, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/638,997

(22) Filed: Apr. 18, 2024

(65) Prior Publication Data

US 2024/0304728 A1 Sep. 12, 2024

Related U.S. Application Data

(63) Continuation of application No. 17/895,126, filed on Aug. 25, 2022, now Pat. No. 11,967,649, which is a
(Continued)

(30) Foreign Application Priority Data

Jun. 8, 2018 (JP) .................................. 2018-110077

(51) Int. Cl.
*H10D 30/69* (2025.01)
*H10B 12/00* (2023.01)
(Continued)

(52) U.S. Cl.
CPC ......... *H10D 30/6756* (2025.01); *H10B 12/00* (2023.02); *H10D 30/69* (2025.01);
(Continued)

(58) Field of Classification Search
CPC . H01L 27/0629; H01L 27/088; H01L 27/108; H01L 29/792
See application file for complete search history.

(56) References Cited

U.S. PATENT DOCUMENTS 8,637,864 B2 1/2014 Saito et al.
8,860,022 B2 10/2014 Sasaki et al.
(Continued)

FOREIGN PATENT DOCUMENTS

CN 104810375 A 7/2015
JP 2011-151383 A 8/2011
(Continued)

OTHER PUBLICATIONS

International Search Report (Application No. PCT/IB2019/054361) Dated Aug. 20, 2019.
(Continued)

*Primary Examiner* — Trang Q Tran
(74) *Attorney, Agent, or Firm* — Eric J. Robinson; Robinson Intellectual Property Law Office, P.C.

(57) ABSTRACT

The semiconductor device includes a first conductor and a second conductor; a first insulator to a third insulator; and a first oxide to a third oxide. The first conductor is disposed to be exposed from a top surface of the first insulator. The first oxide is disposed over the first insulator and the first conductor. A first opening reaching the first conductor is provided in the first oxide. The second oxide is disposed over the first oxide. The second oxide comprises a first region, a second region, and a third region positioned between the first region and the second region. The third oxide is disposed over the second oxide. The second insulator is disposed over the third oxide. The second conductor is disposed over the second insulator. The third insulator is
(Continued)

disposed to cover the first region and the second region and to be in contact with the top surface of the first insulator.

5 Claims, 28 Drawing Sheets

Related U.S. Application Data continuation of application No. 17/056,072, filed as application No. PCT/IB2019/054361 on May 27, 2019, now Pat. No. 11,495,691.

(51) Int. Cl.
    *H10D 30/67*     (2025.01)
    *H10D 84/01*     (2025.01)
    *H10D 84/03*     (2025.01)
    *H10D 84/80*     (2025.01)
    *H10D 84/83*     (2025.01)
    *H10D 86/40*     (2025.01)
    *H10D 86/60*     (2025.01)

(52) U.S. Cl.
    CPC ....... *H10D 84/0126* (2025.01); *H10D 84/038* (2025.01); *H10D 84/811* (2025.01); *H10D 84/83* (2025.01); *H10D 86/481* (2025.01); *H10D 86/60* (2025.01)

(56) References Cited

U.S. PATENT DOCUMENTS

| | | |
|---|---|---|
| 9,166,019 B2 | 10/2015 | Saito et al. |
| 9,443,872 B2 | 9/2016 | Miyairi |
| 9,673,224 B2 | 6/2017 | Yamazaki et al. |
| 9,799,685 B2 | 10/2017 | Miyairi |
| 10,050,152 B2 | 8/2018 | Yamazaki |
| 10,096,489 B2 | 10/2018 | Yamazaki et al. |
| 2007/0090456 A1 | 4/2007 | Lee |
| 2009/0145629 A1 | 6/2009 | Mikami et al. |
| 2013/0092925 A1 | 4/2013 | Saito et al. |
| 2015/0221774 A1 | 8/2015 | Yamazaki et al. |
| 2015/0228799 A1 | 8/2015 | Koezuka et al. |
| 2015/0255310 A1 | 9/2015 | Yamazaki et al. |
| 2015/0255490 A1 | 9/2015 | Miyairi |
| 2016/0284858 A1 | 9/2016 | Yamazaki et al. |
| 2016/0322388 A1 | 11/2016 | Ma et al. |
| 2017/0125450 A1 | 5/2017 | Hodo et al. |
| 2017/0179293 A1 | 6/2017 | Yamazaki |
| 2020/0203345 A1 | 6/2020 | Matsuzaki et al. |
| 2021/0020667 A1 | 1/2021 | Yamazaki et al. |

FOREIGN PATENT DOCUMENTS

| | | |
|---|---|---|
| JP | 2012-257187 A | 12/2012 |
| JP | 2013-080915 A | 5/2013 |
| JP | 2013-102149 A | 5/2013 |
| JP | 2013-243352 A | 12/2013 |
| JP | 2015-109433 A | 6/2015 |
| JP | 2015-181162 A | 10/2015 |
| JP | 2015-188070 A | 10/2015 |
| JP | 2016-149552 A | 8/2016 |
| JP | 2017-112374 A | 6/2017 |
| KR | 2013-0040137 A | 4/2013 |
| KR | 2013-0136888 A | 12/2013 |
| WO | WO-2015/060133 | 4/2015 |
| WO | WO-2016/203341 | 12/2016 |

OTHER PUBLICATIONS

Written Opinion (Application No. PCT/IB2019/054361) Dated Aug. 20, 2019.

SEMICONDUCTOR DEVICE

TECHNICAL FIELD

One embodiment of the present invention relates to a semiconductor device and a method of manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed and LSI, CPUs, and memories are mainly used. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of LSI, CPUs, memories, and the like is mounted on a circuit board, for example, a printed wiring board, to be used as one of components of a variety of electronic devices.

A technique of forming a transistor with use of a semiconductor thin film formed over a substrate having an insulating surface has been attracting attention. Such a transistor is widely used in electronic devices such as an integrated circuit (IC) and an image display device (also simply referred to as a display device). A silicon-based semiconductor material is widely known as a semiconductor thin film that can be used in the transistor; in addition, an oxide semiconductor has been attracting attention as another material.

It is known that a transistor using an oxide semiconductor has an extremely low leakage current in a non-conduction state. For example, a low-power-consumption CPU utilizing a feature of a low leakage current of the transistor using an oxide semiconductor is disclosed (see Patent Document 1). Furthermore, a memory device that can retain stored contents for a long time by utilizing a characteristic of a low leakage current of a transistor using an oxide semiconductor is disclosed, for example (see Patent Document 2).

In recent years, demand for an integrated circuit with higher density has risen with reductions in the size and weight of electronic devices. Furthermore, improvement in the productivity of a semiconductor device including an integrated circuit has been required.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device that can be scaled down or highly integrated. Another object of one embodiment of the present invention is to provide a semiconductor device with favorable electrical characteristics. Another object of one embodiment of the present invention is to provide a semiconductor device with high on-state current. Another object of one embodiment of the present invention is to provide a semiconductor device with excellent frequency characteristics. Another object of one embodiment of the present invention is to provide a highly reliable semiconductor device. Another object of one embodiment of the present invention is to provide a semiconductor device with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device capable of reducing power consumption. Another object of one embodiment of the present invention is to provide a novel semiconductor device.

Note that the description of these objects does not disturb the existence of other objects. One embodiment of the present invention does not necessarily achieve all of these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including: a first conductor and a second conductor; a first insulator to a third insulator; and a first oxide to a third oxide. The first conductor is disposed to be exposed from a top surface of the first insulator. The first oxide is disposed over the first insulator and the first conductor. A first opening reaching the first conductor is provided in the first oxide. The second oxide is disposed over the first oxide. The second oxide comprises a first region, a second region, and a third region positioned between the first region and the second region. The resistance of the first region and the second region is lower than the resistance of the third region. The second region of the second oxide is in contact with a top surface of the first conductor via the first opening. The third oxide is disposed over the second oxide such that at least part of the second oxide overlaps with the third region. The second insulator is disposed over the third oxide. The second conductor is disposed over the second insulator. The third insulator is disposed to cover the first region and the second region and to be in contact with the top surface of the first insulator.

Another embodiment of the present invention is a conductor device including: a first conductor and a second conductor; a first insulator to a third insulator; and a first oxide to a third oxide. The first oxide is disposed over the first insulator. The first conductor is disposed to be exposed from a top surface of the first insulator. The second oxide is disposed over the first oxide. The second oxide comprises a first region, a second region, and a third region positioned between the first region and the second region. The resistance of the first region and the second region is lower than the resistance of the third region. The second region of the second oxide is in contact with a top surface of the first conductor. The third oxide is disposed over the second oxide such that at least part of the second oxide overlaps with the third region. The second insulator is disposed over the third oxide. The second conductor is disposed over the second insulator. The third insulator is disposed to cover the first region and the second region and to be in contact with the top surface of the first insulator.

Another embodiment of the present invention is a conductor device including: a first conductor and a second conductor; a first insulator to a third insulator; and a first oxide to a third oxide. The first conductor is disposed to be exposed from a top surface of the first insulator. The first oxide is disposed over the first insulator and the first conductor. The second oxide is disposed over the first oxide. Each of the first oxide and the second oxide comprises a first region, a second region, and a third region positioned between the first region and the second region. The resistance of the first region and the second region is lower than the resistance of the third region. The second region of the first oxide is in contact with a top surface of the first conductor. The third oxide is disposed over the second oxide such that at least part of the second oxide overlaps with the third region. The second insulator is disposed over the third oxide. The second conductor is disposed over the second insulator. The third insulator is disposed to cover the first region and the second region and to be in contact with the top surface of the first insulator.

In the above, the first region and the second region preferably include one of phosphorus and boron. In the above, the first region and the second region may include a larger amount of oxygen vacancies than the third region.

The above semiconductor device preferably further includes a fourth insulator disposed over the third insulator and a fifth insulator disposed in contact with a top surface of the fourth insulator, a top surface of the third oxide, a top surface of the second insulator, and a top surface of the second conductor. The third oxide, the second insulator, and the second conductor are preferably disposed between the first region and the second region. The above semiconductor device preferably further includes a third conductor disposed under the first insulator such that at least part of the third conductor overlaps with the second conductor. The above semiconductor device preferably further includes a sixth insulator disposed between the third insulator and the fourth insulator. In the above semiconductor device, the first oxide and the second oxide preferably include In, an element M (M is Al, Ga, Y, or Sn), and Zn.

In the above semiconductor device, a capacitor may be provided under the first conductor, and one electrode of the capacitor may be electrically connected to the first conductor. In the above semiconductor device, a transistor formed over a silicon substrate may be provided under the capacitor.

Effect of the Invention

One embodiment of the present invention can provide a semiconductor device that can be scaled down or highly integrated. One embodiment of the present invention can provide a semiconductor device with favorable electrical characteristics. One embodiment of the present invention can provide a semiconductor device with high on-state current. One embodiment of the present invention can provide a semiconductor device with excellent frequency characteristics. One embodiment of the present invention can provide a highly reliable semiconductor device. One embodiment of the present invention can provide a semiconductor device with high productivity.

One embodiment of the present invention can provide a semiconductor device capable of retaining data for a long time. One embodiment of the present invention can provide a semiconductor device capable of high-speed data writing. One embodiment of the present invention can provide a semiconductor device with high design flexibility. One embodiment of the present invention can provide a semiconductor device capable of reducing power consumption. One embodiment of the present invention can provide a novel semiconductor device.

Note that the description of these effects does not disturb the existence of other effects. One embodiment of the present invention does not necessarily have all of these effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
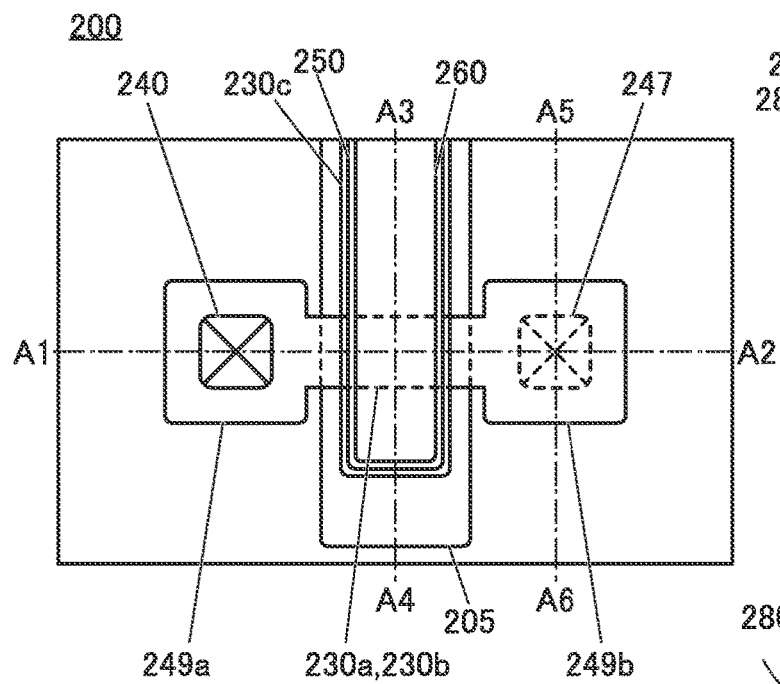
FIG. 1(A) to FIG. 1(D) are a top view and cross-sectional views of a semiconductor device of one embodiment of the present invention.

Hereinafter, embodiments will be described with reference to the drawings. Note that embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes, values, or the like shown in the drawings. For example, in the actual manufacturing process, a layer, a resist mask, or the like might be unintentionally reduced in size by treatment such as etching, which might not be reflected in the drawings for easy understanding. In the drawings, the same reference numerals are used for the same portions or portions having similar functions in different drawings, and repeated description thereof is omitted in some cases. Furthermore, the same hatch pattern is used for the portions having similar functions, and the portions are not especially denoted by reference numerals in some cases.

In particular, in a top view (also referred to as a "plan view"), a perspective view, or the like, the description of some components might be omitted for easy understanding of the invention. In addition, the description of some hidden lines and the like might be omitted.

In this specification and the like, the ordinal numbers such as first and second are used for convenience and do not denote the order of steps or the stacking order of layers. Therefore, for example, description can be made when "first" is replaced with "second", "third", or the like as appropriate. In addition, the ordinal numbers in this specification and the like are not necessarily the same as the ordinal numbers used to specify one embodiment of the present invention.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current is changed in circuit operation, for example. Therefore, the terms "source" and "drain" can sometimes be used interchangeably in this specification and the like.

Note that in this specification and the like, depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

Furthermore, in this specification, the simple term "channel width" refers to an apparent channel width in some cases. Alternatively, in this specification, the simple term "channel width" refers to an effective channel width in some cases. Note that the values of a channel length, a channel width, an effective channel width, an apparent channel width, and the like can be determined, for example, by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. In addition, in the case of an oxide semiconductor, oxygen vacancies are formed by entry of impurities, for example. Furthermore, when the semiconductor is silicon, examples of an impurity which changes characteristics of the semiconductor include oxygen, Group 1 elements except hydrogen, Group 2 elements, Group 13 elements, and Group 15 elements.

In this specification and the like, silicon oxynitride is a substance in which oxygen content is higher than nitrogen content in its composition. Moreover, silicon nitride oxide is a substance in which nitrogen content is higher than oxygen content in its composition.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, "parallel" indicates a state where two straight lines are placed at an angle of greater than or equal to −10° and less than or equal to 10°. Thus, the case where the angle is greater than or equal to −5° and less than or equal to 5° is also included. Furthermore, "substantially parallel" indicates a state where two straight lines are placed at an angle of greater than or equal to −30° and less than or equal to 30°. Moreover, "perpendicular" indicates a state where two straight lines are placed at an angle of greater than or equal to 80° and less than or equal to 100°. Thus, the case where the angle is greater than or equal to 85° and less than or equal to 95° is also included. In addition, "substantially perpendicular" indicates a state where two straight lines are placed at an angle of greater than or equal to 60° and less than or equal to 120°.

Note that in this specification, a barrier film means a film having a function of inhibiting the passage of oxygen and impurities such as water and hydrogen, and the barrier film having conductivity is referred to as a conductive barrier film in some cases.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that current per micrometer of channel width flowing through a transistor when a potential is not applied to a gate or a ground potential is applied to the gate is $1 \times 10^{-20}$ A or lower at room temperature, $1 \times 10^{-18}$ A or lower at 85° C., or $1 \times 10^{-16}$ A or lower at 125° C.

Embodiment 1

An example of a semiconductor device including a transistor 200 of one embodiment of the present invention is described below.

<Structure Example of Semiconductor Device>

FIG. 1(A), FIG. 1(B), FIG. 1(C), and FIG. 1(D) are a top view and cross-sectional views of the transistor 200 of one embodiment of the present invention and the periphery of the transistor 200.

Figure 1C:
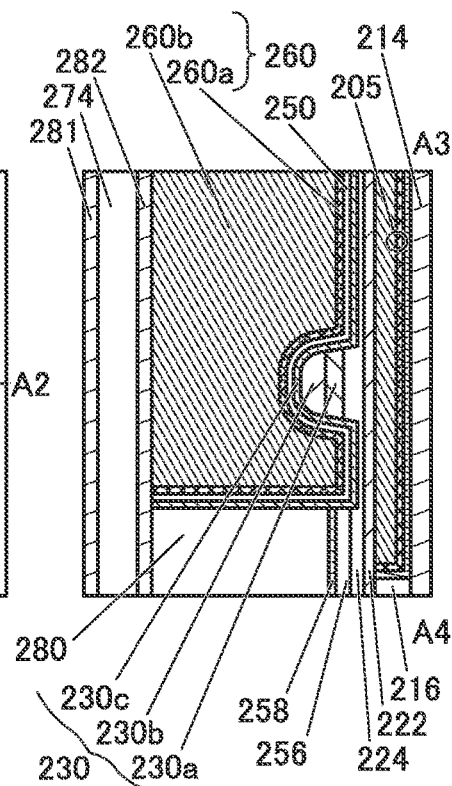
Figure 1B:
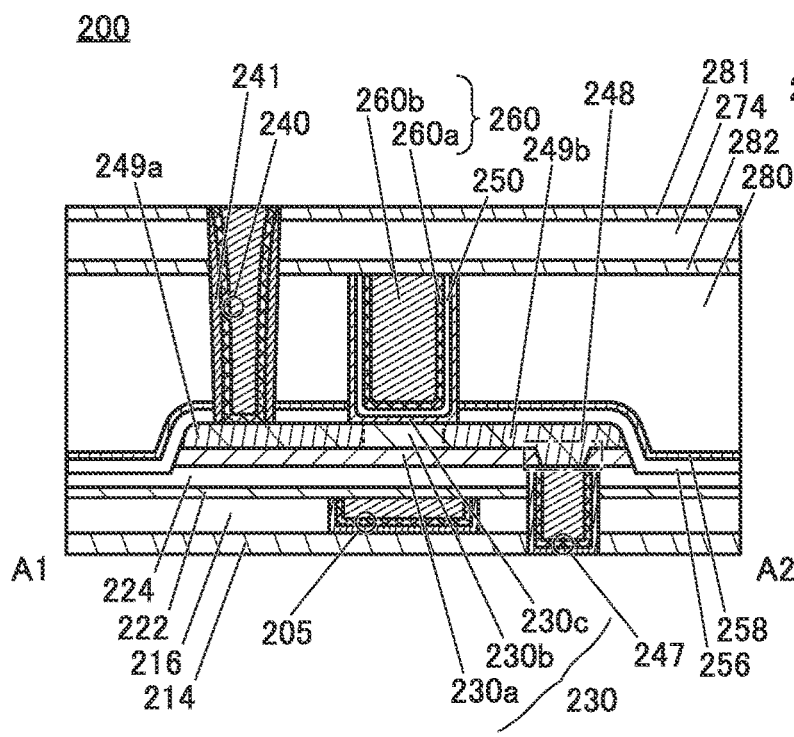
Figure 1D:
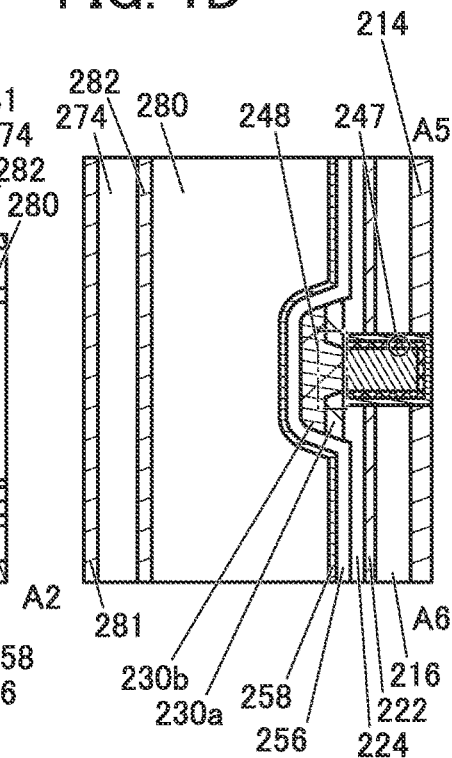

FIG. 1(A) is a top view of the semiconductor device including the transistor 200. FIG. 1(B), FIG. 1(C), and FIG. 1(D) are cross-sectional views of the semiconductor device. Here, FIG. 1(B) is a cross-sectional view of a portion indicated by the dashed-dotted line A1-A2 in FIG. 1(A), and is also a cross-sectional view in the channel length direction of the transistor 200. FIG. 1(C) is a cross-sectional view of a portion indicated by the dashed-dotted line A3-A4 in FIG. 1(A), and is also a cross-sectional view in the channel width direction of the transistor 200. FIG. 1(D) is a cross-sectional view of a portion indicated by the dashed-dotted line A5-A6 in FIG. 1(A), and is also a cross-sectional view in the channel width direction of a source region or a drain region of the transistor 200. Note that for simplification of the drawing, some components are not illustrated in the top view in FIG. 1(A).

The semiconductor device of one embodiment of the present invention includes an insulator 214 over a substrate (not illustrated), the transistor 200 over the insulator 214, an insulator 280 over the transistor 200, an insulator 282 over the insulator 280, an insulator 274 over the insulator 282, and an insulator 281 over the insulator 274. The insulator 214, the insulator 280, the insulator 282, the insulator 274, and the insulator 281 function as interlayer films. In addition, a conductor 247 is provided so as to be embedded in the transistor 200. The conductor 247 is electrically connected to the transistor 200 and functions as a plug. Furthermore, a conductor 240 that is electrically connected to the transistor 200 and functions as a plug is provided. Note that an insulator 241 is provided in contact with a side surface of the conductor 240 functioning as a plug.

The insulator 241 is provided in contact with an inner wall of an opening in an insulator 256, an insulator 258, the insulator 280, the insulator 282, the insulator 274, and the insulator 281; a first conductor of the conductor 240 is provided in contact with a side surface of the insulator 241; and a second conductor of the conductor 240 is provided on the inner side thereof. Here, the top surface of the conductor 240 and the top surface of the insulator 281 can be substantially level with each other. Note that although the transistor 200 having a structure in which the first conductor of the conductor 240 and the second conductor of the conductor 240 are stacked is illustrated, the present invention is not limited thereto. For example, the conductor 240 may be provided as a single layer or provided to have a stacked-layer structure of three or more layers. When a component has a stacked-layer structure, layers may be distinguished by ordinal numbers corresponding to the formation order.

[Transistor 200]

As illustrated in FIG. 1, the transistor 200 includes the insulator 216 over the insulator 214; a conductor 205 (a conductor 205a and a conductor 205b) positioned so as to be embedded in the insulator 216; an insulator 222 over the insulator 216 and the conductor 205; an insulator 224 over the insulator 222; an oxide 230a over the insulator 224; an oxide 230b over the oxide 230a; an oxide 230c over the oxide 230b; an insulator 250 over the oxide 230c; a conductor 260 (a conductor 260a and a conductor 260b) positioned over the insulator 250 and overlapping with the oxide 230c; the insulator 256 in contact with part of a top surface of the insulator 224, a side surface of the oxide 230a, a side surface of the oxide 230b, and a top surface of the oxide 230b; and the insulator 258 in contact with a top surface of the insulator 256. The conductor 260 includes the conductor 260a and the conductor 260b, and the conductor 260a is positioned so as to cover the bottom surface and a side surface of the conductor 260b. Note that, as illustrated in FIG. 1(B), a top surface of the conductor 260 is substantially aligned with a top surface of the oxide 230c, a top surface of the insulator 250, and a top surface of the insulator 280. The insulator 282 is in contact with the top surface of each of the conductor 260, the oxide 230c, the insulator 250, and the insulator 280.

Here, the oxide 230b includes a region 249a and a region 249b which are apart from each other. The resistance of the region 249a and the region 249b is lower than that of a region positioned between the region 249a and the region 249b. The region 249a functions as one of the source region and the drain region of the transistor 200, and the region 249b functions as the other of the source region and the drain region of the transistor 200. At least part of the oxide 230c overlaps with the region between the region 249a and the region 249b. Hereinafter, the region 249a and the region 249b are collectively referred to as a region 249 in some cases.

The conductor 247 is provided to be exposed from the top surface of the insulator 224. For example, the conductor 247 may be provided to be embedded in an opening formed in the insulator 214, the insulator 216, the insulator 222, and the insulator 224. It is preferable that at least part of the top surface of the conductor 247 be exposed from the insulator 224, and the top surface of the conductor 247 be substantially aligned with the top surface of the insulator 224.

Here, the conductor 247 functions as a plug in order to electrically connect the transistor 200 to a circuit element such as a switch, a transistor, a capacitor, an inductor, a resistor, or a diode, a wiring, an electrode, or a terminal, which is provided below the insulator 214. For example, a structure can be employed in which the conductor 247 is electrically connected to one electrode of a capacitor provided below the insulator 214. Alternatively, a structure can be employed in which the conductor 247 is electrically connected to a gate of a transistor provided below the insulator 214, for example.

An opening 248 from which at least part of the conductor 247 is exposed is formed in the oxide 230a. In the region 249b, the oxide 230b is in contact with at least part of the top surface of the conductor 247 via the opening 248. By connecting the region 249b in the oxide 230b and the conductor 247 in such a manner, electrical resistance between the conductor 247 and a source or a drain of the transistor 200 can be reduced.

With such a structure, frequency characteristics of the semiconductor device including the transistor 200 can be improved and favorable electric characteristics can be obtained.

It is preferable that, at least part of a circuit element such as a switch, a transistor, a capacitor, an inductor, a resistor, or a diode, a wiring, an electrode, or a terminal, which is electrically connected to the conductor 247, overlap with the oxide 230. This can reduce the area occupied by the transistor 200 and the circuit element, the wiring, the electrode, or the terminal in the top view; thus, the semiconductor device of this embodiment can be miniaturized or highly integrated.

Although the conductor 247 is provided below the region 249b in FIGS. 1(A) and 1(B), the semiconductor device described in this embodiment is not limited thereto. For example, the conductor 247 may be provided below the region 249a, or the conductor 247 may be provided below both the region 249a and the region 249b.

It is preferable that the insulator 222, the insulator 258, and the insulator 282 have a function of inhibiting diffusion of hydrogen (e.g., at least one of a hydrogen atom, a hydrogen molecule, and the like). In addition, it is preferable that the insulator 222, the insulator 258, and the insulator 282 have a function of inhibiting diffusion of oxygen (e.g., at least one of an oxygen atom, an oxygen molecule, and the like). For example, it is preferable that the insulator 222, the insulator 258, and the insulator 282 each have a lower permeability of one or both of oxygen and hydrogen than the insulator 224. It is preferable that the insulator 222, the insulator 258, and the insulator 282 each have a lower permeability of one or both of oxygen and hydrogen than the insulator 250. It is preferable that the insulator 222, the insulator 258, and the insulator 282 each have a lower permeability of one or both of oxygen and hydrogen than the insulator 280.

The oxide 230 preferably includes the oxide 230a over the insulator 224, the oxide 230b over the oxide 230a, and the oxide 230c which is placed over the oxide 230b and at least partly in contact with the top surface of the oxide 230b.

The transistor 200 described here has a structure in which the oxide 230 has a three-layer stacked structure of the oxide 230a, the oxide 230b, and the oxide 230c in a region where a channel is formed (hereinafter also referred to as a channel formation region) and its vicinity; however, the present invention is not limited thereto. For example, the oxide 230 may have a structure in which a single-layer structure of the oxide 230b, a two-layer structure of the oxide 230b and the oxide 230a, a two-layer structure of the oxide 230b and the oxide 230c, or a stacked-layer structure of four or more layers is provided. Alternatively, each of the oxide 230a, the oxide 230b, and the oxide 230c may have a stacked-layer structure of two or more layers. Although the transistor 200 described here has a structure in which the conductor 260 has a stacked-layer structure of two layers, the present invention is not limited thereto. For example, the conductor 260 may have a single-layer structure or a stacked-layer structure of three or more layers.

Here, the conductor 260 functions as a gate electrode of the transistor and the region 249a and the region 249b function as the source region and the drain region. In the transistor 200, the conductor 260 functioning as the gate electrode is formed in a self-aligned manner to fill an opening formed in the insulator 280 and the like. The formation of the conductor 260 in this manner allows the conductor 260 to be surely placed in a region between the region 249a and the region 249b without alignment.

In the transistor 200, a metal oxide functioning as an oxide semiconductor (hereinafter, also referred to as an oxide semiconductor) is preferably used as the oxide 230 (the oxide 230a, the oxide 230b, and the oxide 230c) including a channel formation region.

The transistor 200 using an oxide semiconductor in a channel formation region has an extremely low leakage current (off-state current) in a non-conduction state; thus, a semiconductor device with low power consumption can be provided. An oxide semiconductor can be deposited by a sputtering method or the like and thus can be used for the transistor 200 included in a highly integrated semiconductor device.

For example, as the oxide 230, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. An In—Ga oxide or an In—Zn oxide may also be used as the oxide 230.

Here, the carrier density of the oxide 230 is increased and the resistance thereof is lowered in some cases when an element that forms an oxygen vacancy or an element that is bonded to an oxygen vacancy is added to the oxide 230. Typical examples of the element include boron and phosphorus. Hydrogen, carbon, nitrogen, fluorine, sulfur, chlorine, titanium, a rare gas, and the like can be used as well as boron and phosphorus. Typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added to the oxide 230. Among the above-described elements, boron and phosphorus are preferable as the element to be added. Since an apparatus in a manufacturing line for amorphous silicon or low-temperature polysilicon can be used for the addition of boron or phosphorus, capital investment can be reduced. The concentration of the above element is measured by secondary ion mass spectrometry (SIMS) or the like.

In particular, an element that easily forms an oxide is preferably used as an element to be added to the oxide 230. Typical examples of the element include boron, phosphorus, aluminum, and magnesium. The element added to the oxide 230 can deprive oxygen in the oxide 230 to form an oxide. As a result, many oxygen vacancies are generated in the oxide 230. When the oxygen vacancies and hydrogen in the oxide 230 are bonded to each other, carriers are generated, and accordingly, a region with extremely low resistance is formed. The element added to the oxide 230 exists in the state of a stable oxide in the oxide 230; thus, even when treatment that requires a high temperature is performed in a later step, the element is not easily released from the oxide 230. That is, with the use of an element that easily forms an oxide as an element to be added to the oxide 230, a region whose resistance is not easily increased even through a high-temperature process can be formed in the oxide 230.

Figure 2:
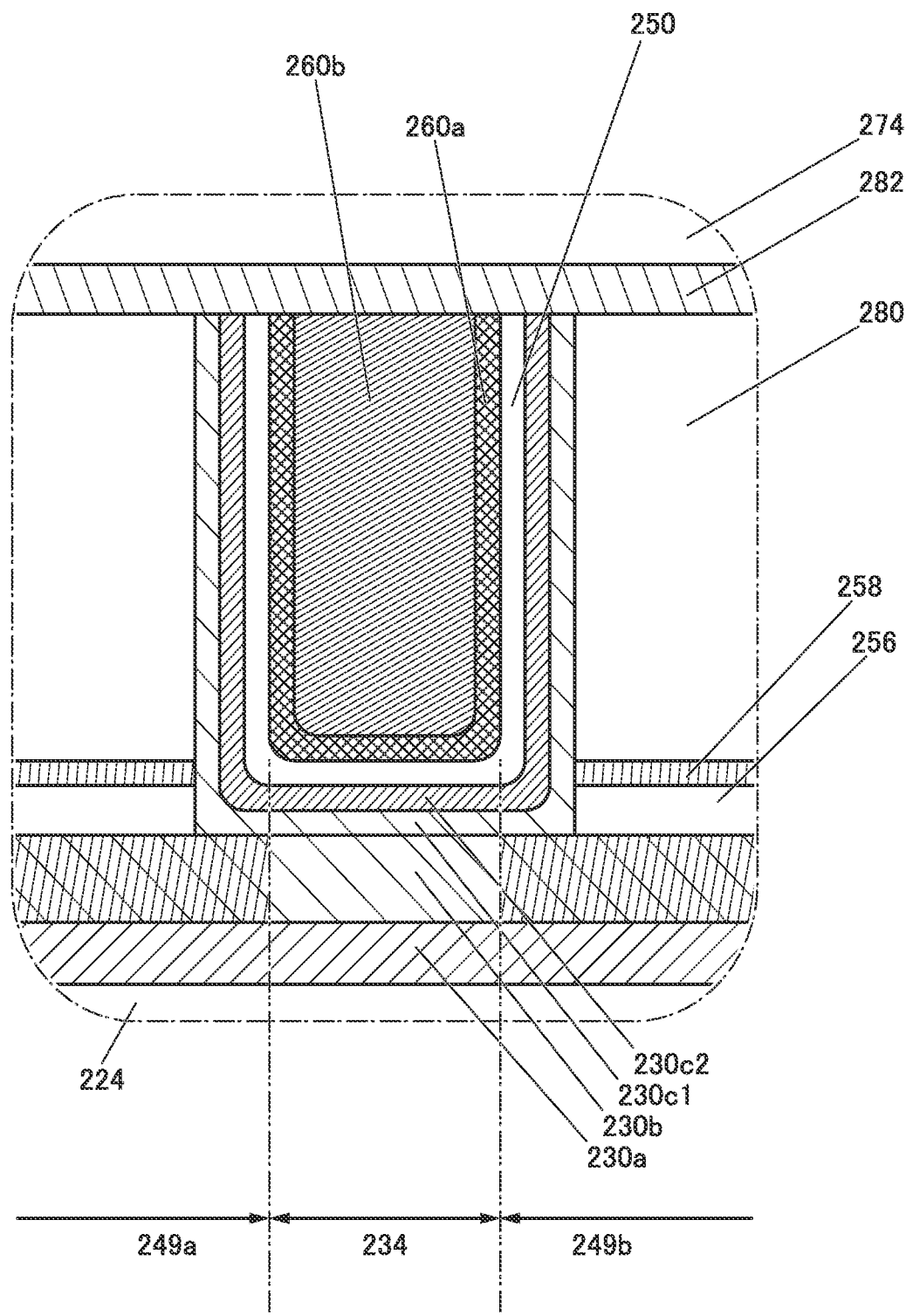
FIG. 2 is a cross-sectional view of a semiconductor device of one embodiment of the present invention.
Figure 3A:
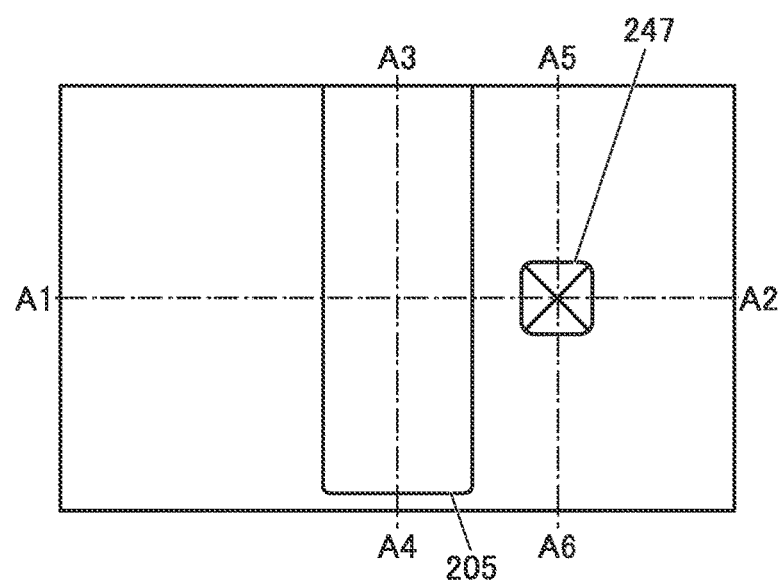
FIG. 3(A) to FIG. 3(D) are a top view and cross-sectional views illustrating a method of manufacturing a semiconductor device of one embodiment of the present invention.
Figure 3C:
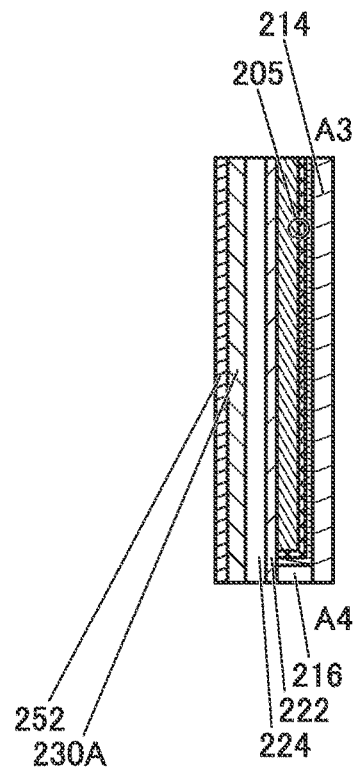
Figure 3B:
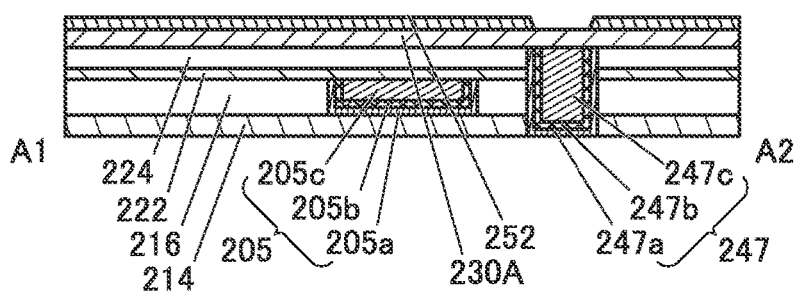
Figure 3D:
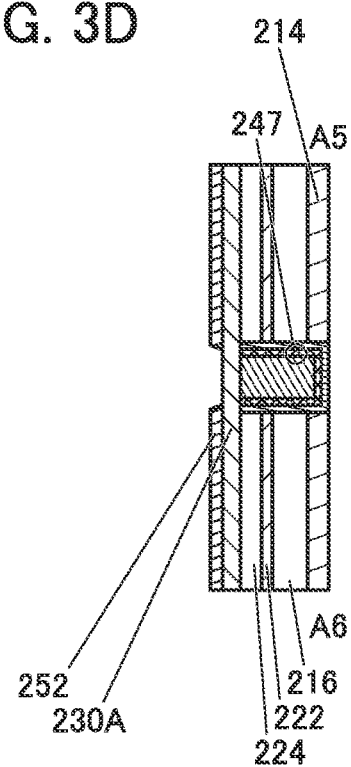
Figure 4A:
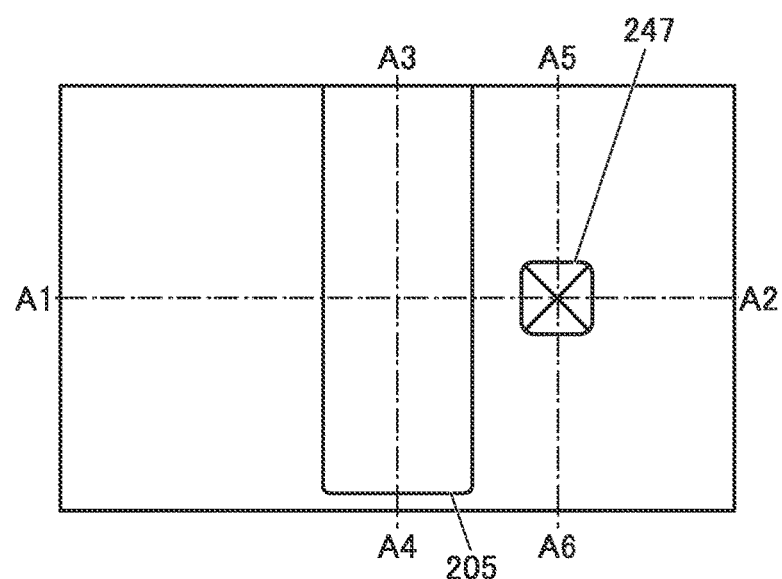
FIG. 4(A) to FIG. 4(D) are a top view and cross-sectional views illustrating a method of manufacturing a semiconductor device of one embodiment of the present invention.
Figure 4C:
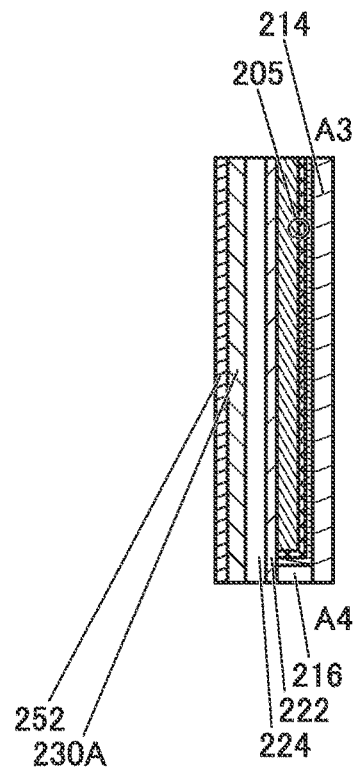
Figure 4B:
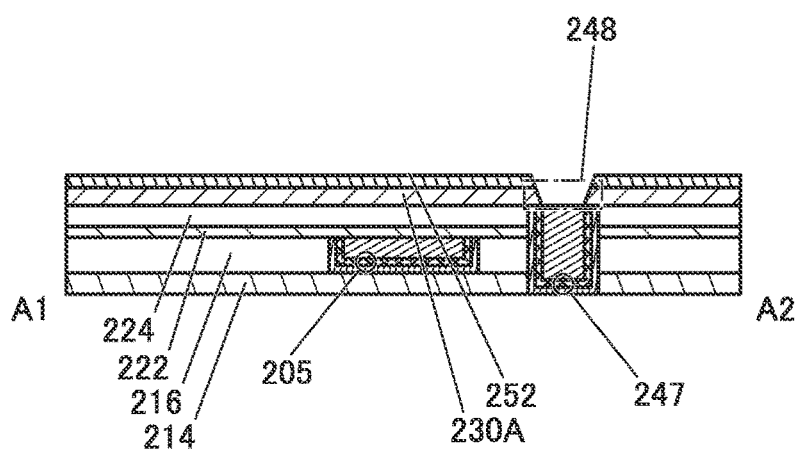
Figure 4D:
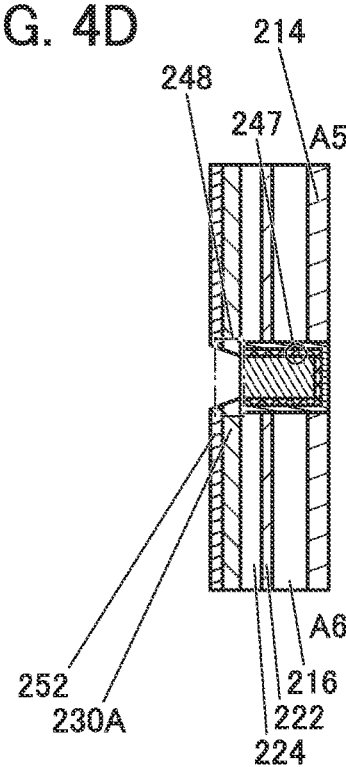
Figure 5A:
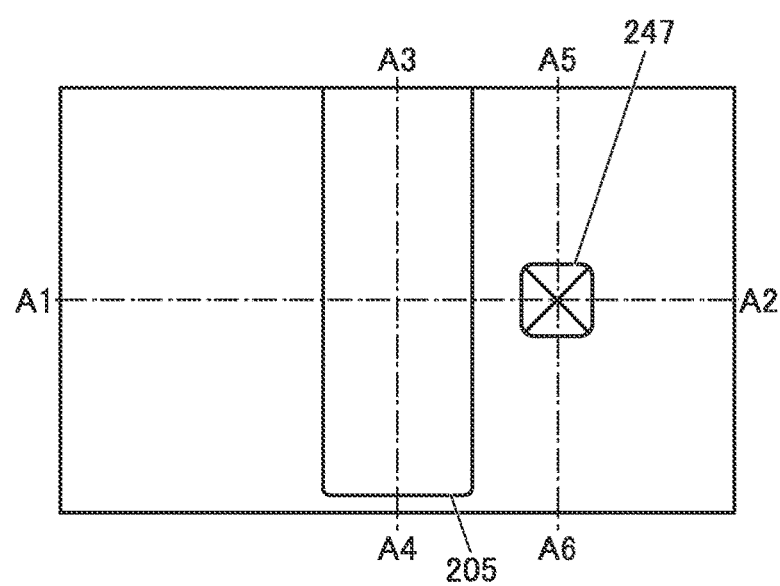
FIG. 5(A) to FIG. 5(D) are a top view and cross-sectional views illustrating a method of manufacturing a semiconductor device of one embodiment of the present invention.
Figure 5C:
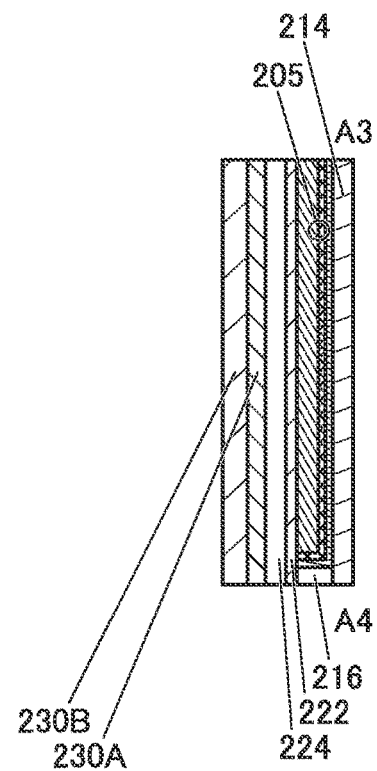
Figure 5B:
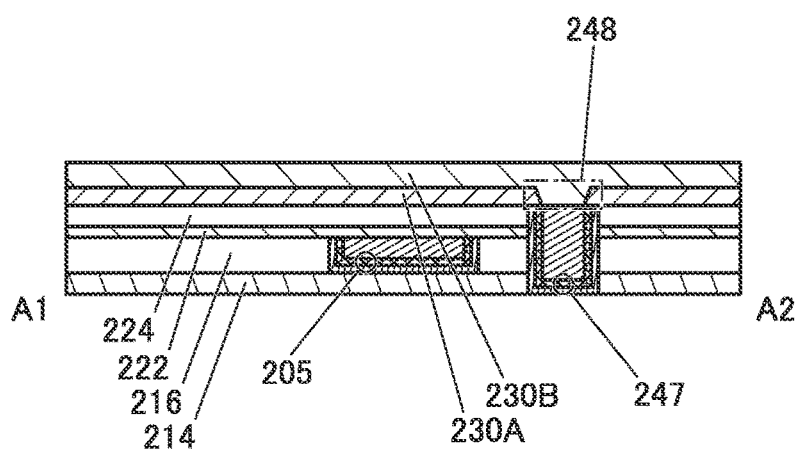
Figure 5D:
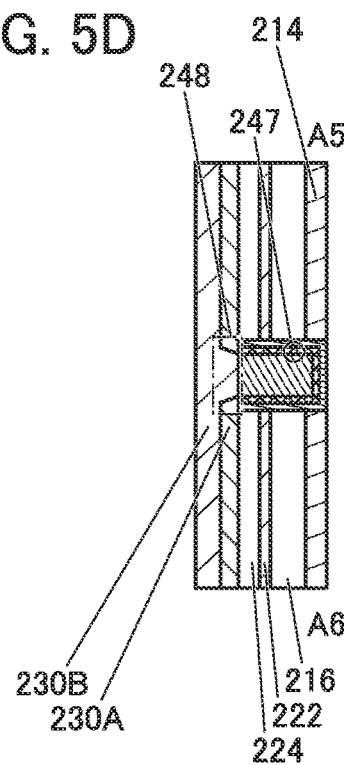
Figure 6A:
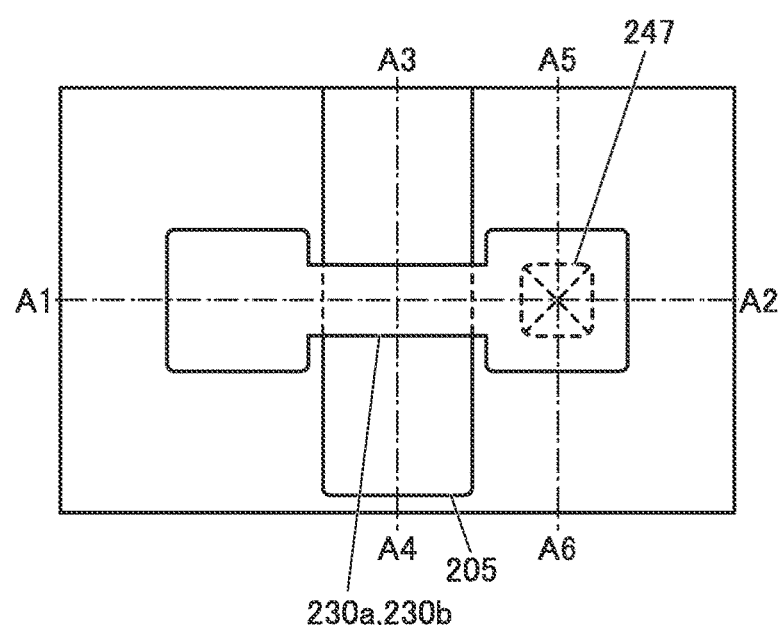
FIG. 6(A) to FIG. 6(D) are a top view and cross-sectional views illustrating a method of manufacturing a semiconductor device of one embodiment of the present invention.
Figure 6C:
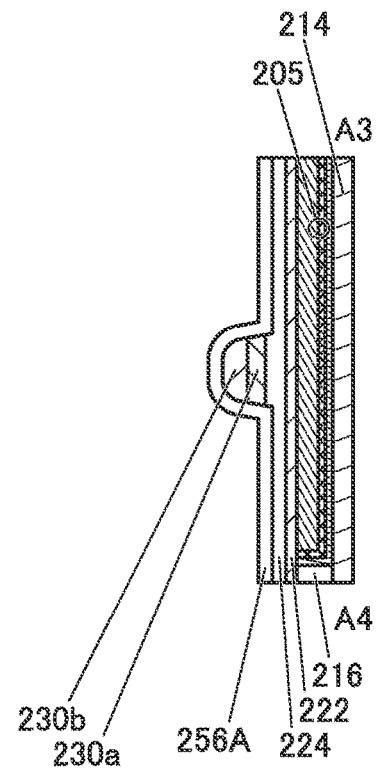
Figure 6B:
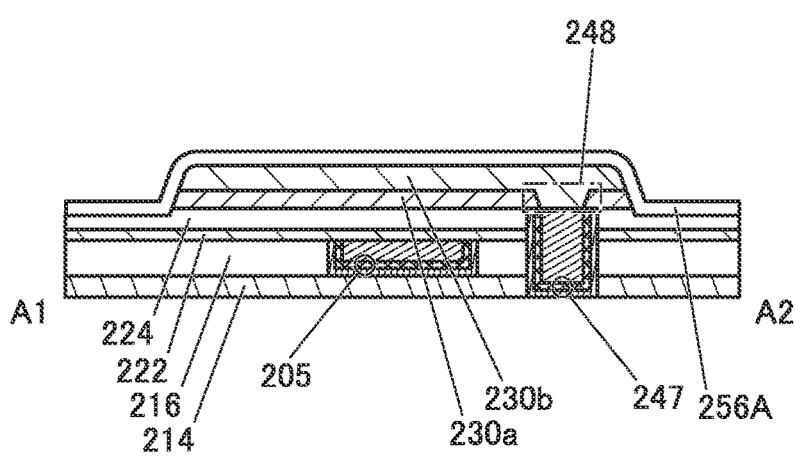
Figure 6D:
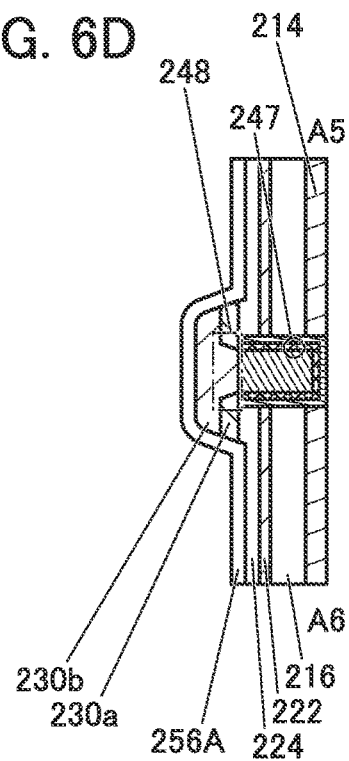
Figure 7A:
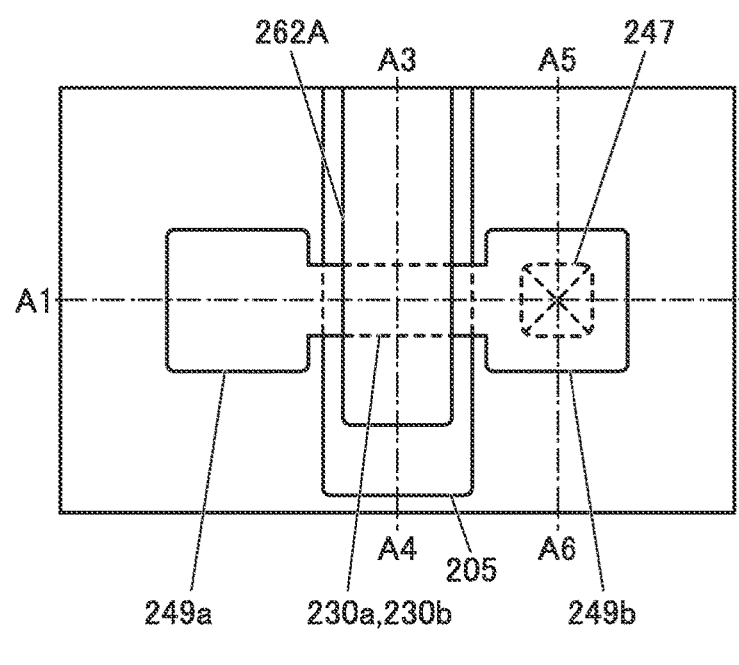
FIG. 7(A) to FIG. 7(D) are a top view and cross-sectional views illustrating a method of manufacturing a semiconductor device of one embodiment of the present invention.
Figure 7C:
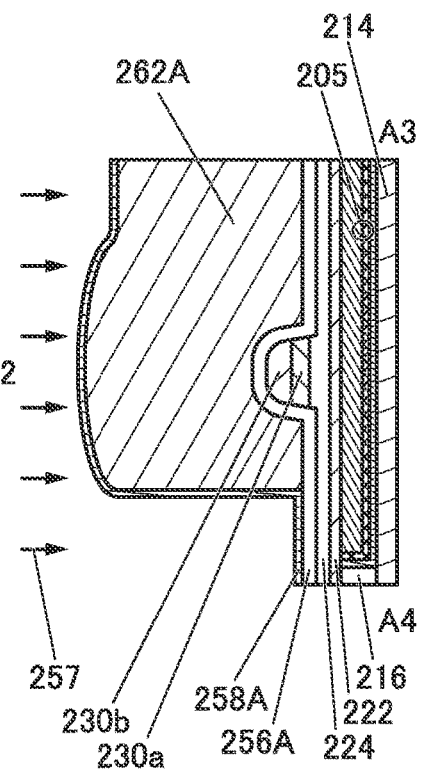
Figure 7B:
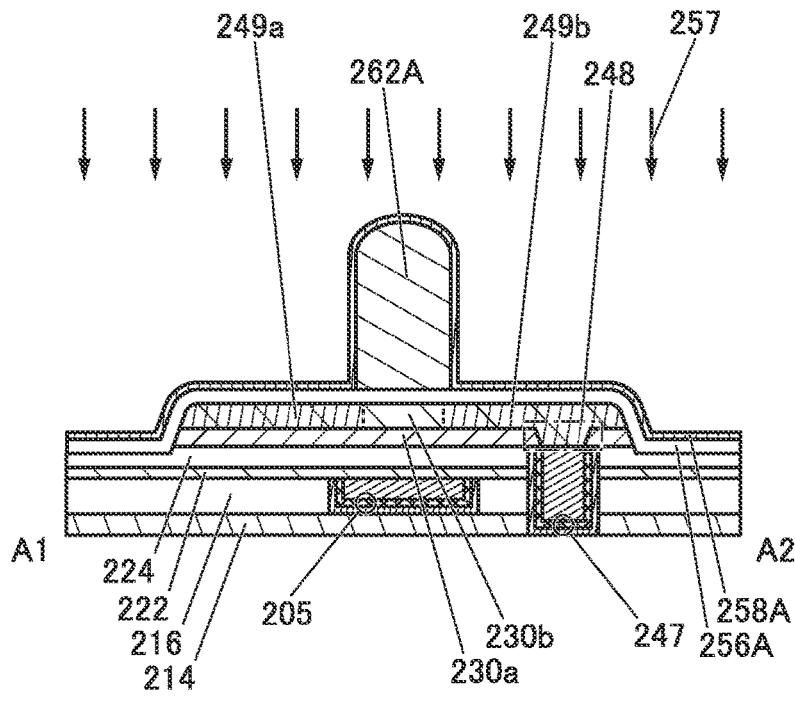
Figure 7D:
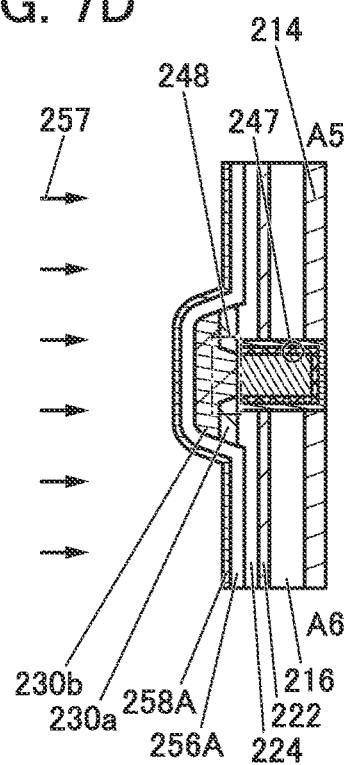
Figure 8A:
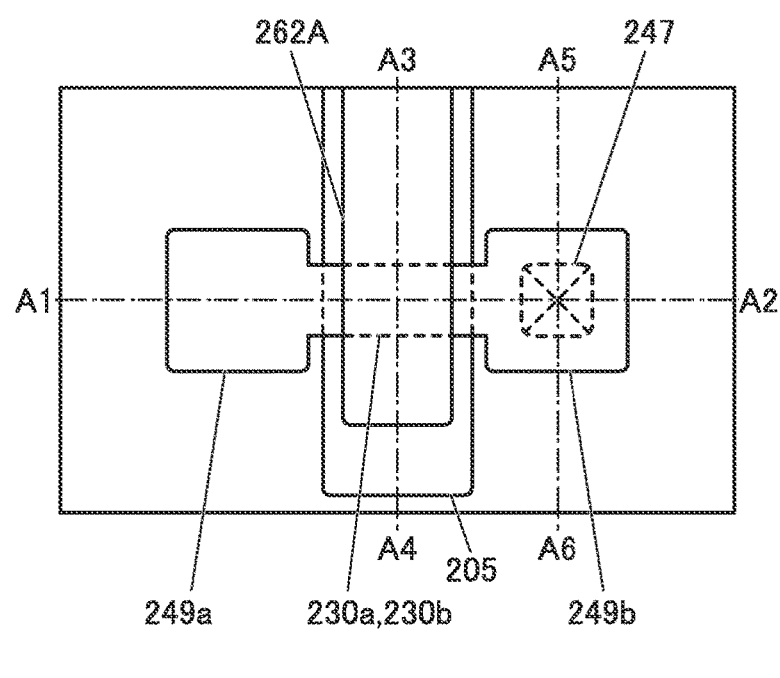
FIG. 8(A) to FIG. 8(D) are a top view and cross-sectional views illustrating a method of manufacturing a semiconductor device of one embodiment of the present invention.
Figure 8C:
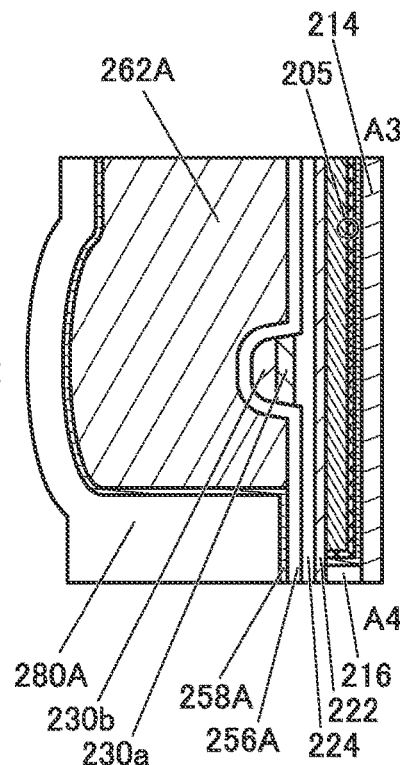
Figure 8B:
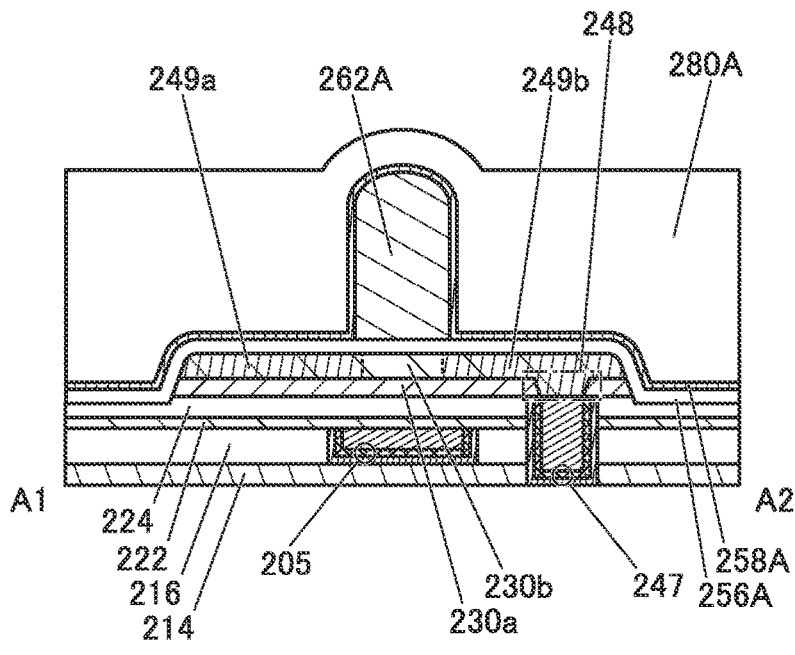
Figure 8D:
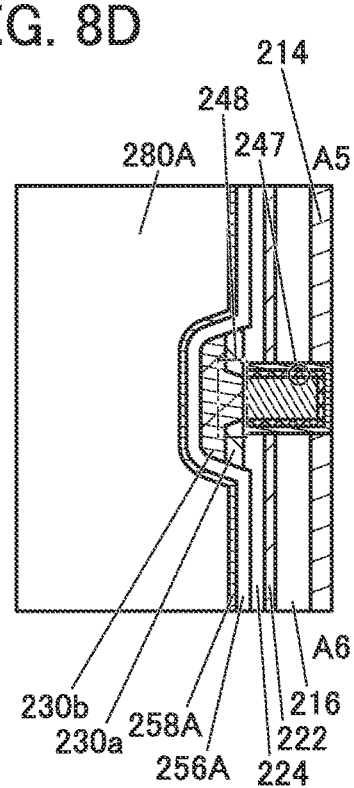
Figure 9A:
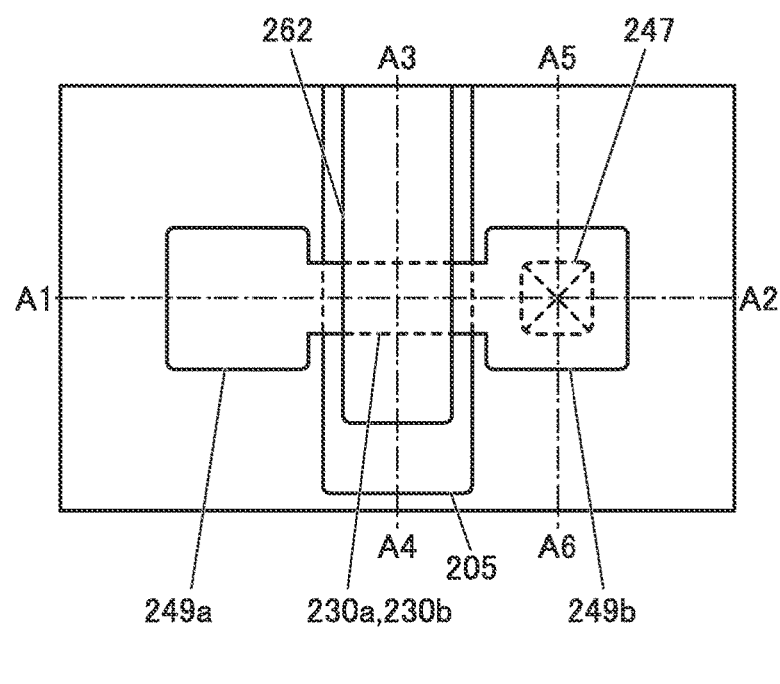
FIG. 9(A) to FIG. 9(D) are a top view and cross-sectional views illustrating a method of manufacturing a semiconductor device of one embodiment of the present invention.
Figure 9C:
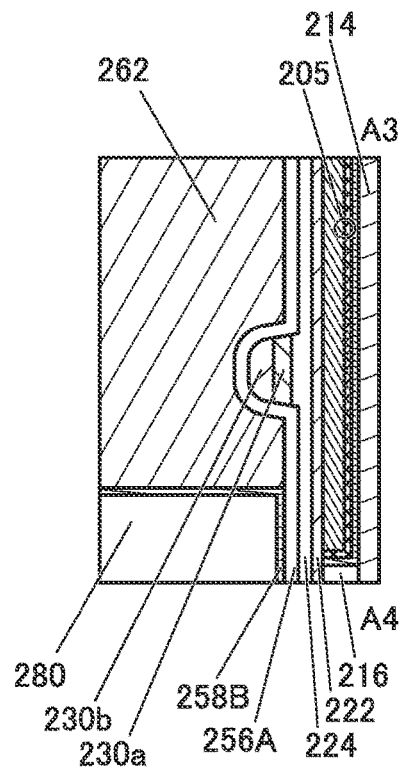
Figure 9B:
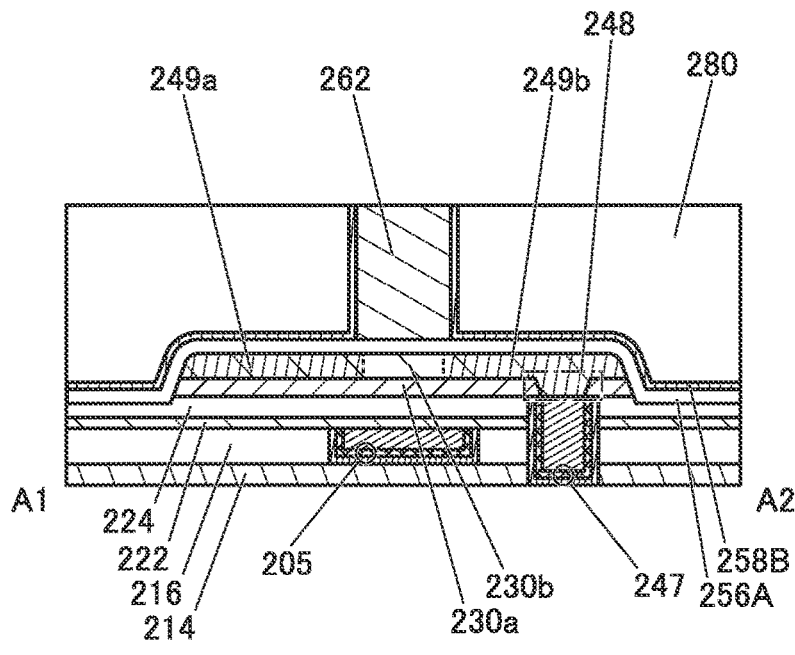
Figure 9D:
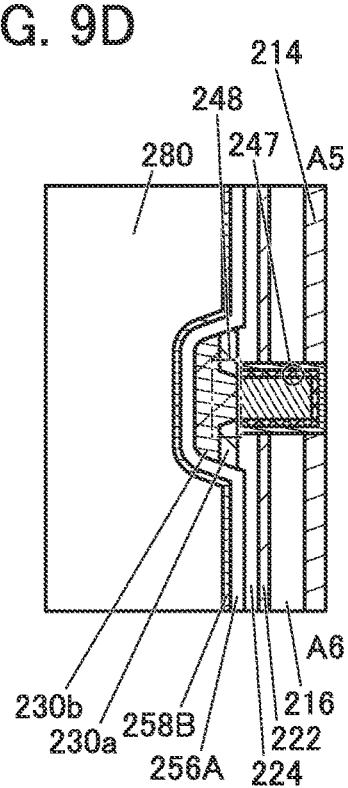
Figure 10A:
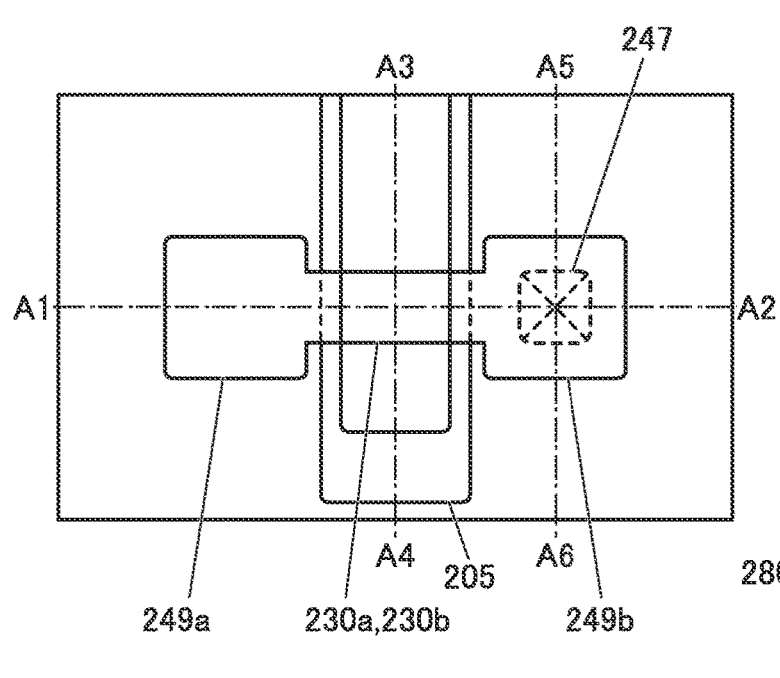
FIG. 10(A) to FIG. 10(D) are a top view and cross-sectional views illustrating a method of manufacturing a semiconductor device of one embodiment of the present invention.
Figure 10B:
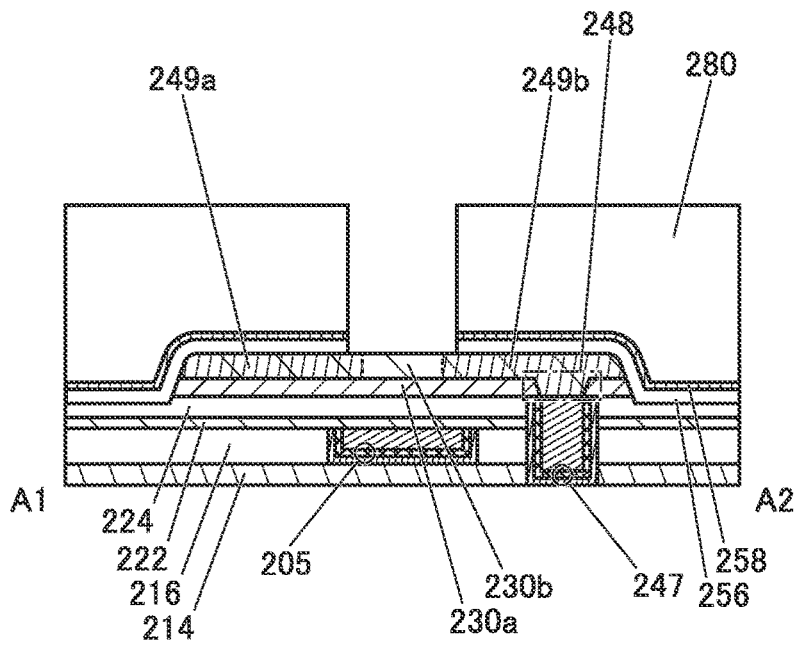
Figure 10C:
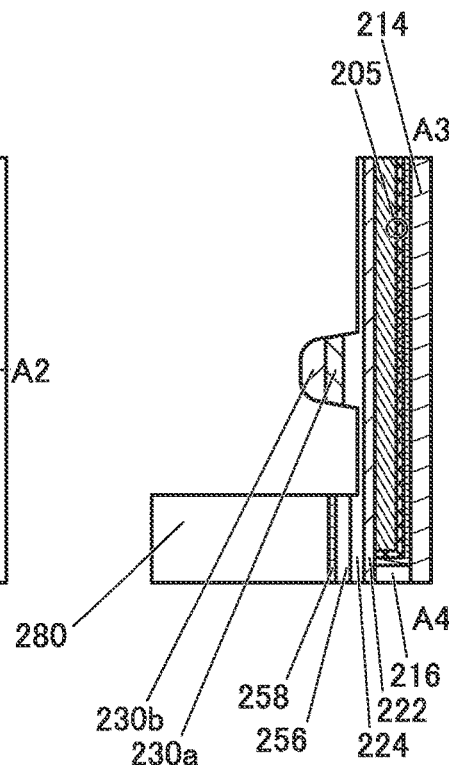
Figure 10D:
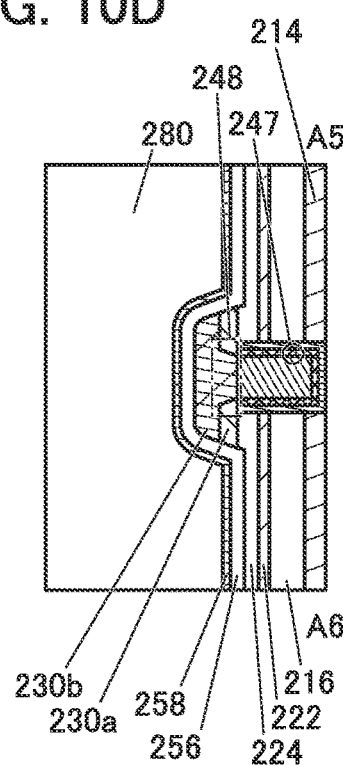
Figure 11A:
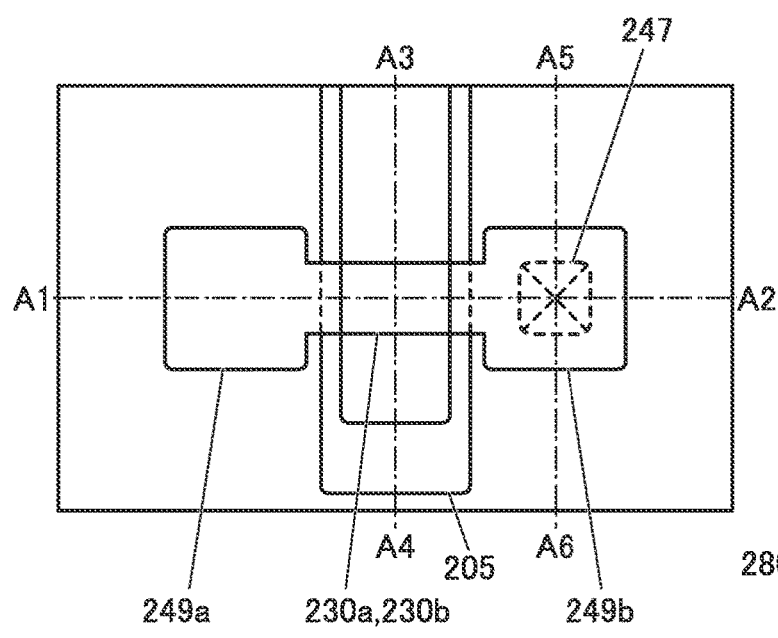
FIG. 11(A) to FIG. 11(D) are a top view and cross-sectional views illustrating a method of manufacturing a semiconductor device of one embodiment of the present invention.
Figure 11B:
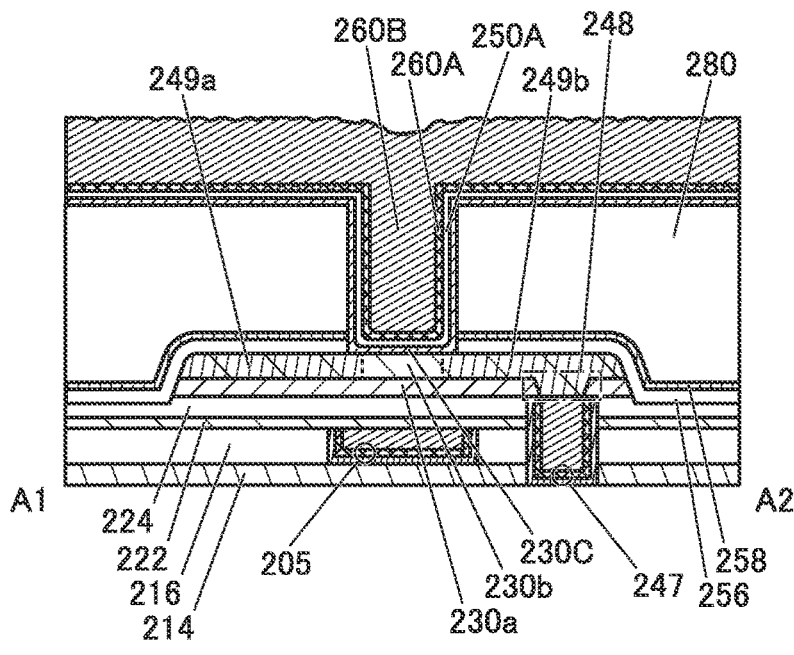
Figure 11C:
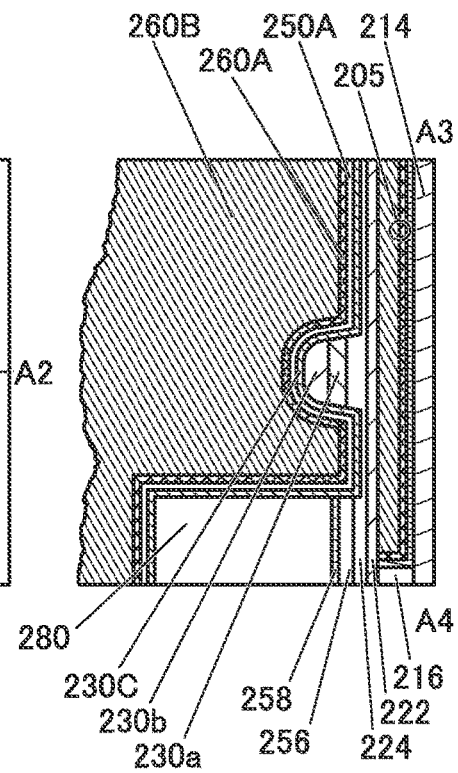
Figure 11D:
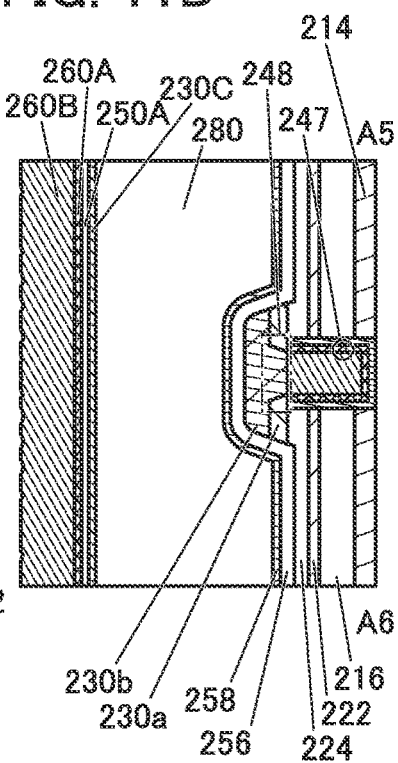
Figure 12A:
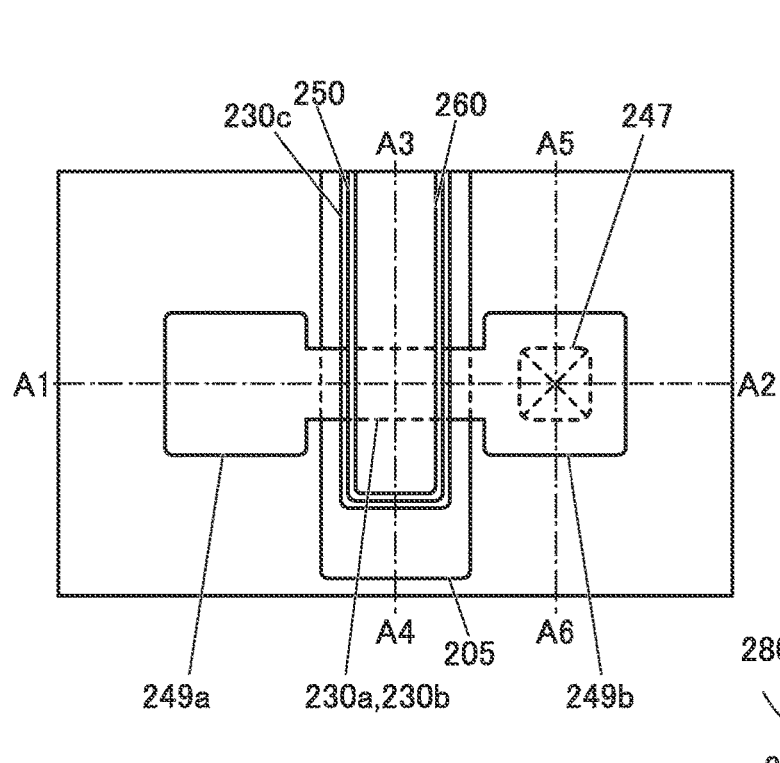
FIG. 12(A) to FIG. 12(D) are a top view and cross-sectional views illustrating a method of manufacturing a semiconductor device of one embodiment of the present invention.
Figure 12C:
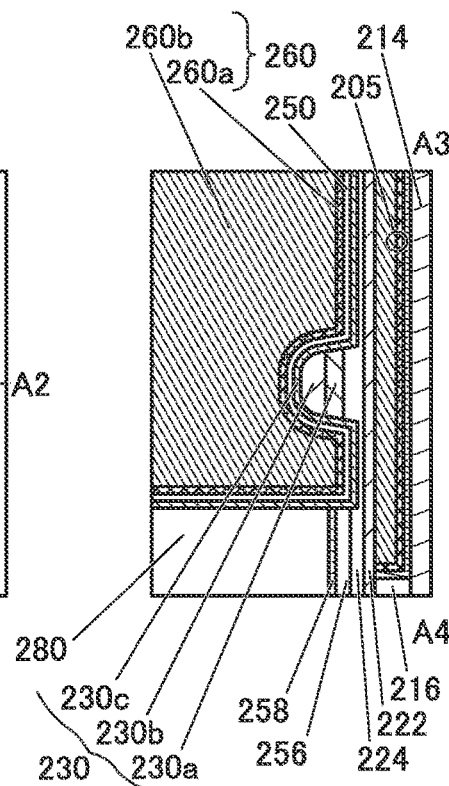
Figure 12B:
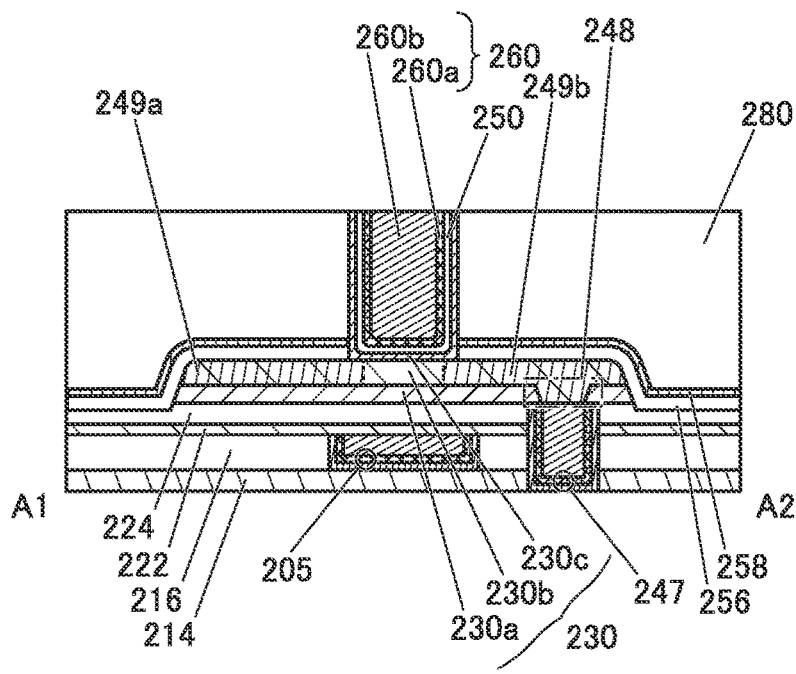
Figure 12D:
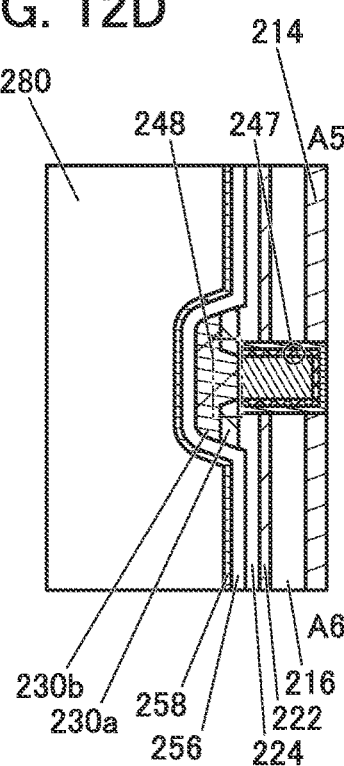
Figure 13A:
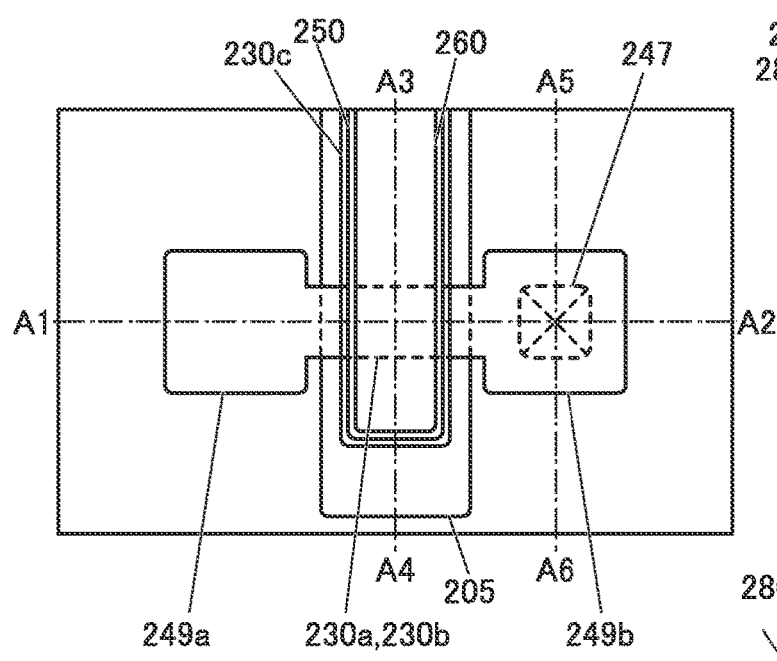
FIG. 13(A) to FIG. 13(D) are a top view and cross-sectional views illustrating a method of manufacturing a semiconductor device of one embodiment of the present invention.
Figure 13B:
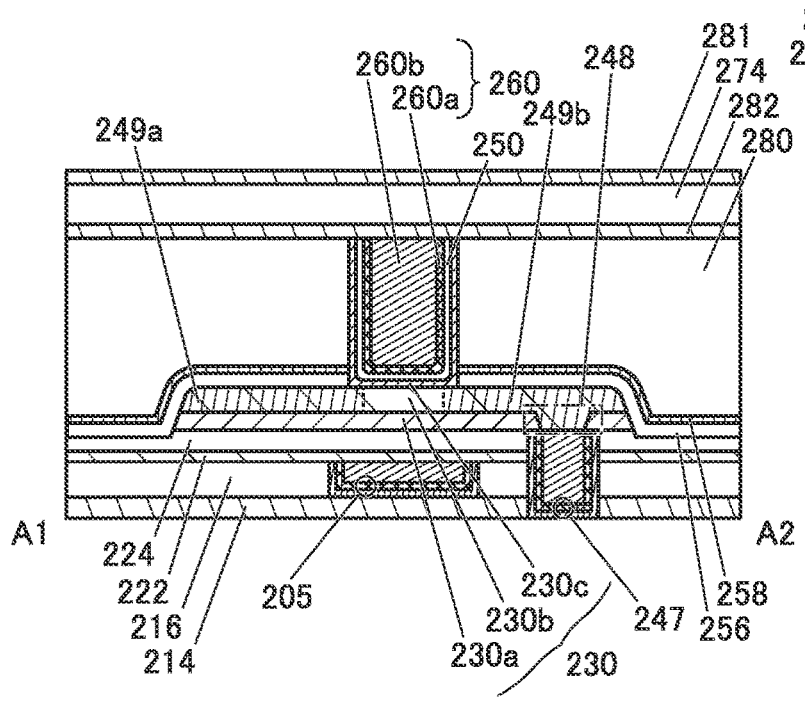
Figure 13C:
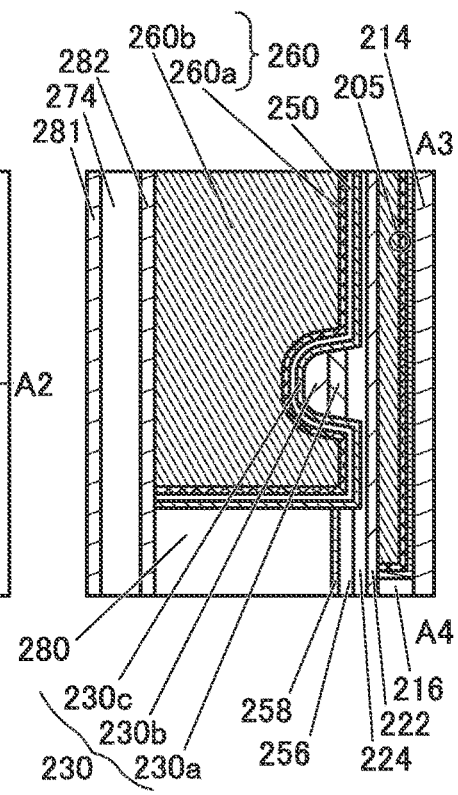
Figure 13D:
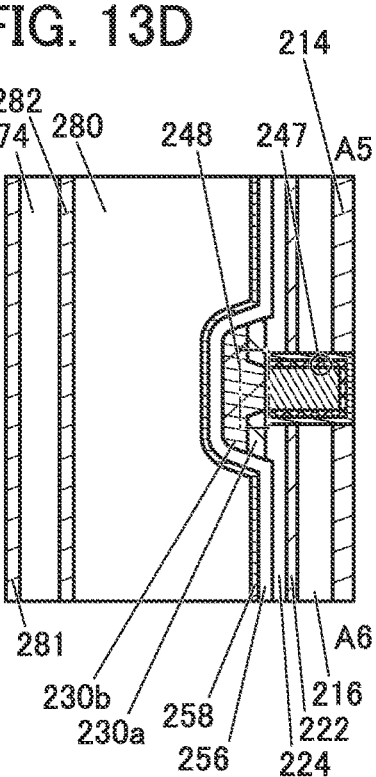
Figure 14A:
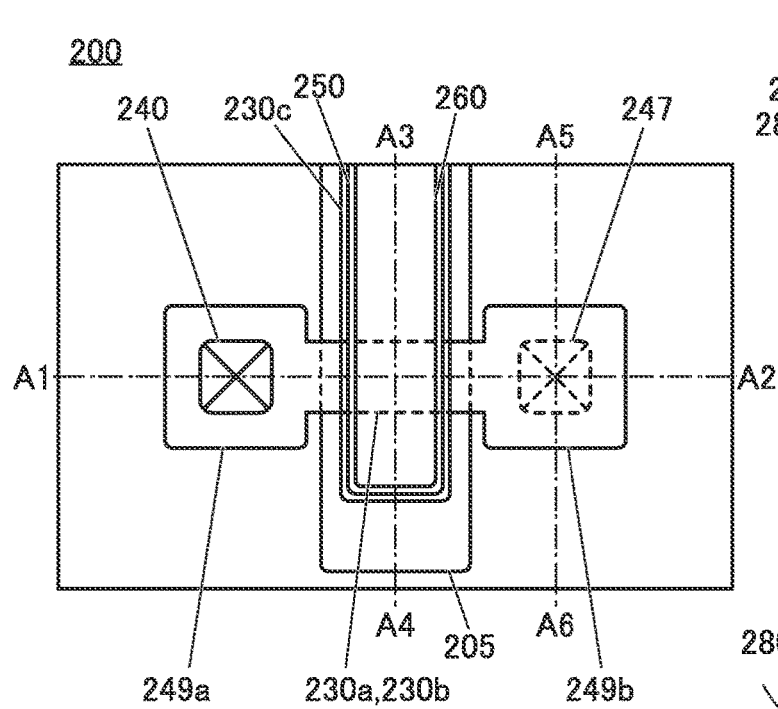
FIG. 14(A) to FIG. 14(D) are a top view and cross-sectional views of a semiconductor device of one embodiment of the present invention.
Figure 14B:
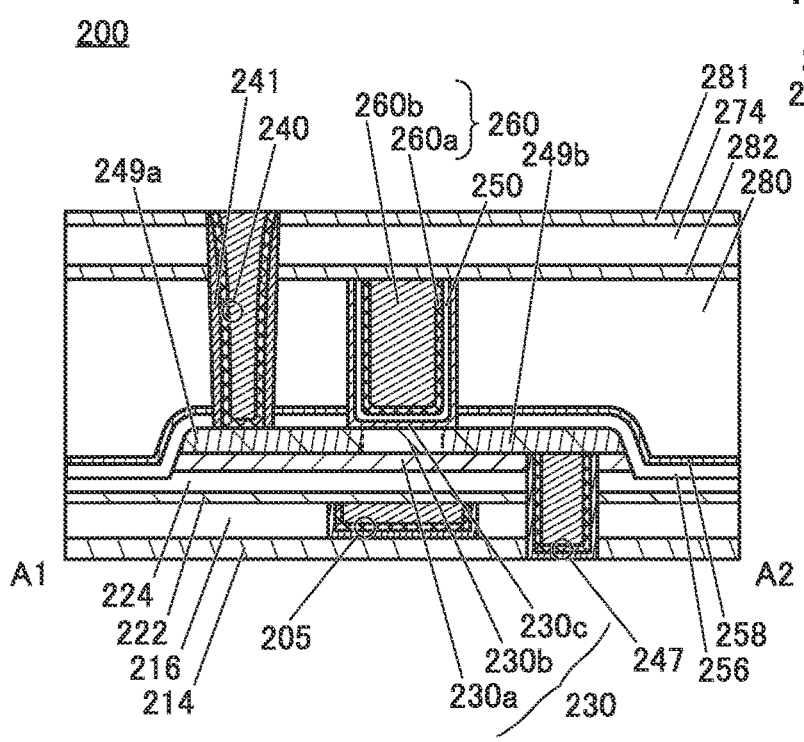
Figure 14C:
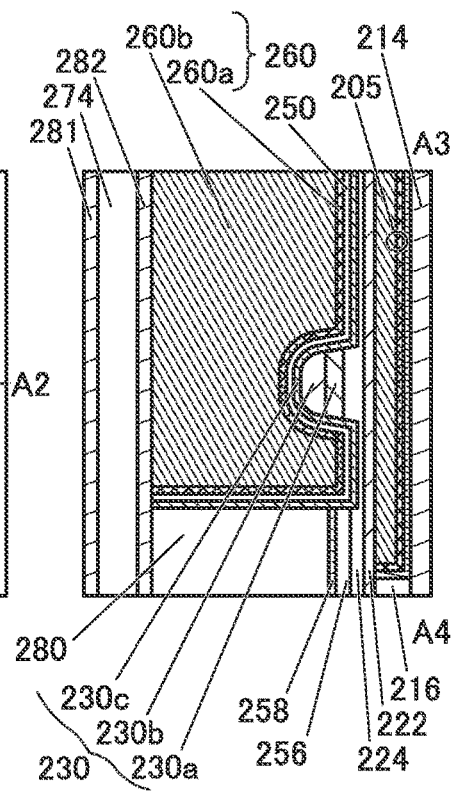
Figure 14D:
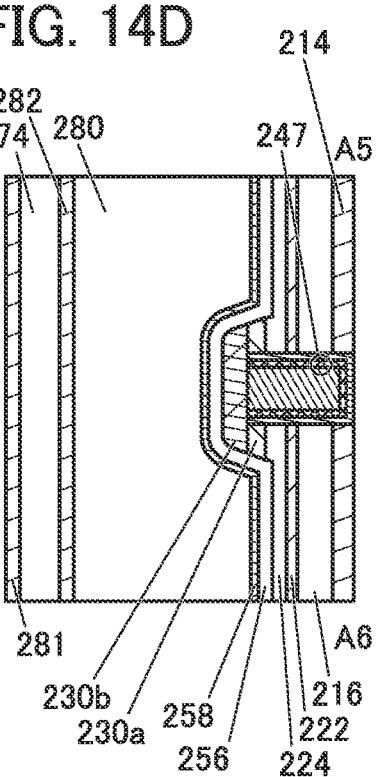
Figure 15A:
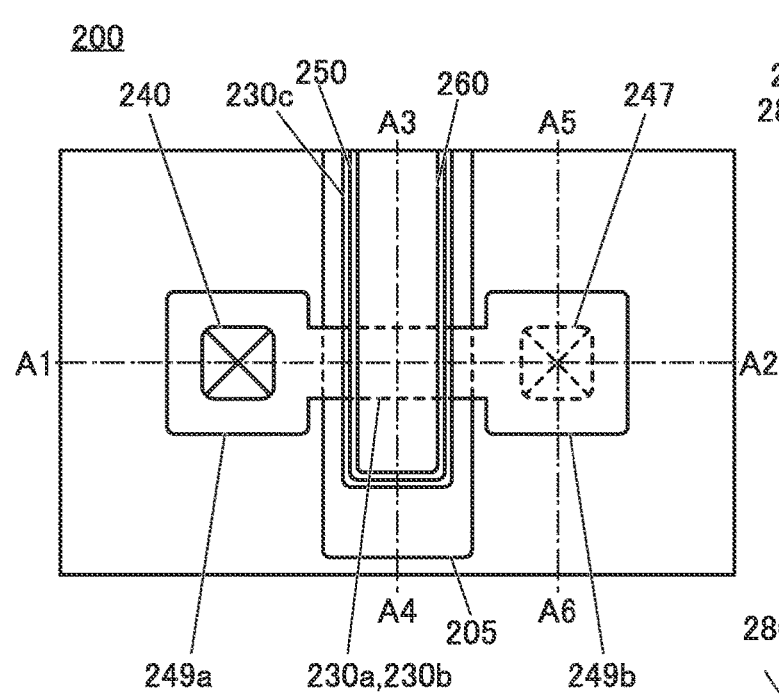
FIG. 15(A) to FIG. 15(D) are a top view and cross-sectional views of a semiconductor device of one embodiment of the present invention.
Figure 15C:
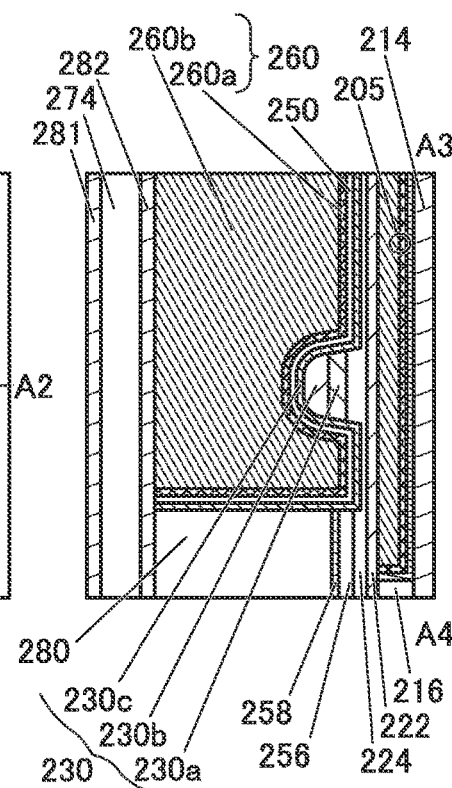
Figure 15B:
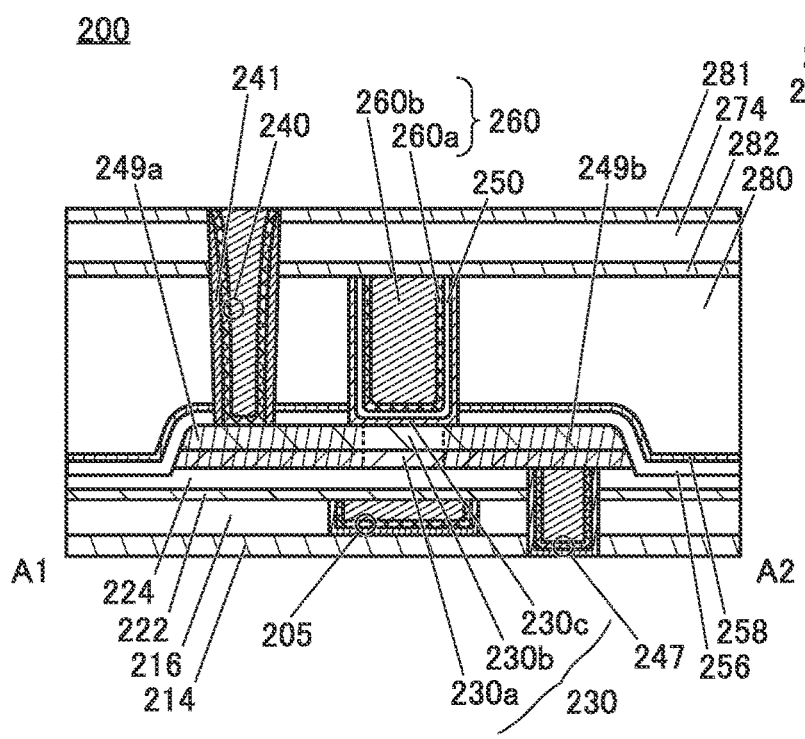
Figure 15D:
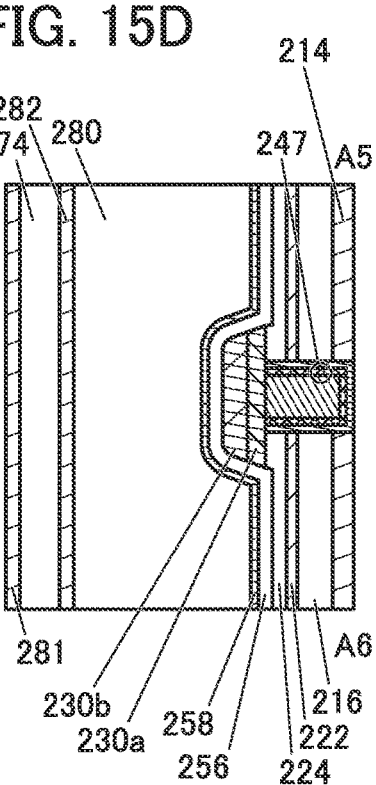
Figure 16A:
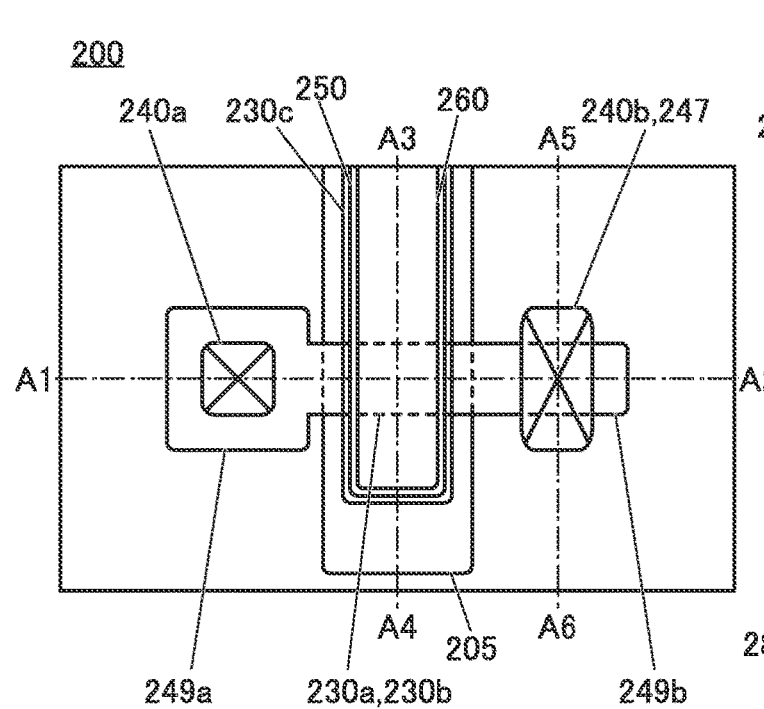
FIG. 16(A) to FIG. 16(D) are a top view and cross-sectional views of a semiconductor device of one embodiment of the present invention.
Figure 16C:
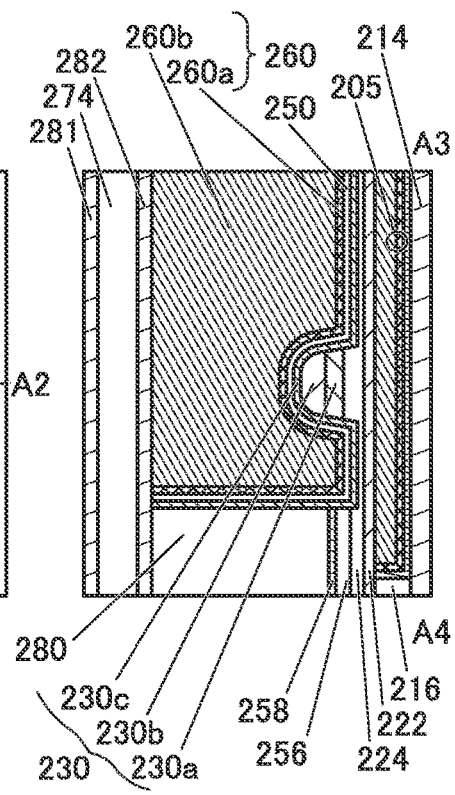
Figure 16B:
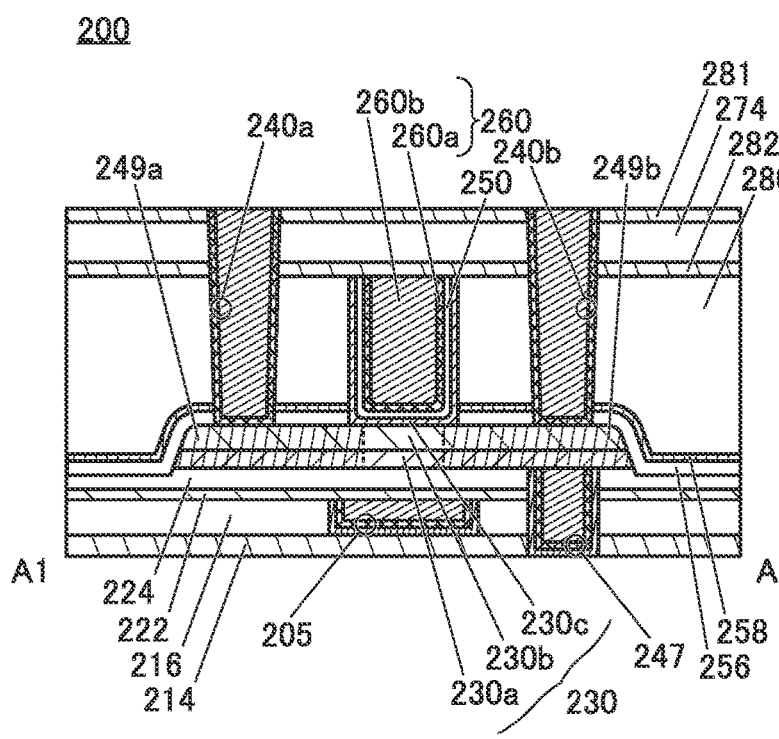
Figure 16D:
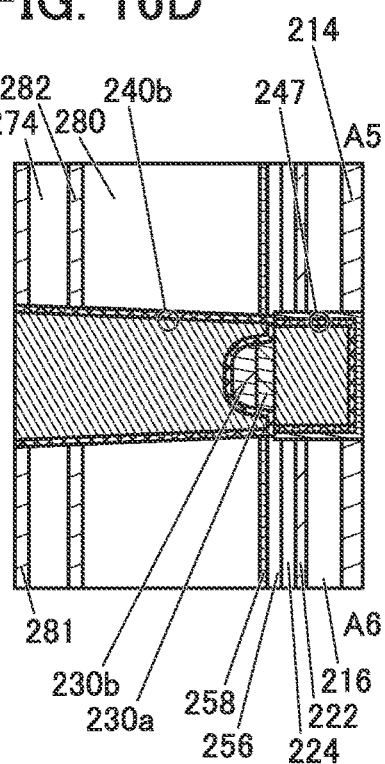

FIG. 2 is an enlarged view of the vicinity of the channel formation region in FIG. 1(B). As illustrated in FIG. 2, the oxide 230 includes a region 234 functioning as a channel formation region of the transistor 200 and the region 249 (the region 249a and the region 249b) functioning as a source region or a drain region. Although FIG. 2 illustrates an example of the oxide 230c that has a stacked-layer structure including an oxide 230c1 and an oxide 230c2, this embodiment is not limited thereto. The oxide 230c may have a single-layer structure or a stacked-layer structure of three or more layers.

The region 249 is a region formed by addition of the above element to the oxide 230b. As illustrated in FIG. 1(B) and FIG. 2, the region 249a and the region 249b are formed to face each other with the conductor 260 positioned therebetween, and the top surfaces are preferably in contact with the oxide 230c. In a top view, it is preferable that side surfaces of the region 249a and the region 249b on the conductor 260 side be aligned with respective side surfaces of the conductor 260 or that at least part of the region 249a and the region 249b overlap with the conductor 260. Here, the concentration of the above element in the region 249 is preferably higher than that in a region of the oxide 230 where the region 249 is not formed. Moreover, the amount of oxygen vacancies in the region 249 is preferably higher than the amount of oxygen vacancies in the region of the oxide 230 where the region 249 is not formed. Accordingly, the region 249 has higher carrier density and lower resistance than the region of the oxide 230 where the region 249 is not formed.

As illustrated in FIG. 2, a region of the oxide 230 which overlaps with the conductor 260 and is positioned between the region 249a and the region 249b is referred to as a region 234. Here, the region 249 has a higher carrier density and a lower resistance than the region 234. Accordingly, the region 234 functions as a channel formation region of the transistor 200, and the region 249 functions as a source region or a drain region thereof.

When the region 249 functioning as the source region or the drain region is formed in the oxide 230, the conductor 240 and the conductor 247 which function as a plug can be connected to the region 249 without providing a source electrode and a drain electrode which are formed of a metal. When the source electrode and the drain electrode formed of a metal are provided in contact with the oxide 230, in the case where high-temperature heat treatment is performed in the manufacturing process of the transistor 200 or the subsequent process, the source electrode and the drain electrode formed of a metal might be oxidized, and the on-state current, the S-value, and the frequency characteristics of the transistor 200 are degraded in some cases. However, in the semiconductor device described in this embodiment, it is not necessary to provide a source electrode and a drain electrode formed of a metal. Thus, the semiconductor device can have a favorable on-state current, S-value, and frequency characteristics even when high-temperature heat treatment is performed in the manufacturing process of the transistor 200 or the subsequent process. For example, in the semiconductor device in this embodiment, a process in which a high temperature higher than or equal to 450° C. and lower than or equal to 800° C., typically higher than or equal to 600° C. and lower than or equal to 750° C. is applied can be performed after the transistor 200 is manufactured.

Furthermore, when the transistor 200 is formed by the manufacturing method described in this embodiment, the conductor 260 can be disposed between the region 249a and the region 249b in a self-aligned manner, which will be described in detail later. Thus, the semiconductor device with favorable electrical characteristics can be manufactured with a high yield.

In a manufacturing method of the semiconductor device, the region 249 is preferably formed through the addition of the above element as a dopant to the oxide 230 through the insulator 256, which will be described in detail later. Here, the dopant is added not only to the oxide 230 but also to the insulator 256 in some cases.

The dopant added to the region 249 in the oxide 230 is bonded to oxygen in the oxide 230; thus, in the region 249 in the oxide 230, oxygen vacancies are generated. Here, hydrogen contained in the region 234 in the oxide 230 is diffused into the region 249 and is trapped by the oxygen vacancy. Thus, it is considered that the resistance of the region 234 after hydrogen diffusion is higher than that of the region 234 just after deposition of the oxide 230. On the other hand, it can be considered that the resistance of the region 249 in the oxide 230 is lower than that after the deposition because the oxygen vacancy traps the hydrogen.

In the case where the insulator 256 overlapping with the region 249 contains oxygen (or excess oxygen described later), when the oxygen is diffused into the region 249, it is concerned that the resistance of the oxide 230 in the region 249 is increased and the region 249 does not sufficiently function as the source region and the drain region. However, when the dopant is added to the insulator 256, oxygen contained in the insulator 256 is trapped by the dopant and fixed. Thus, release of oxygen from the insulator 256 is suppressed, and the resistance of the oxide 230 in the region 249 can be kept lower than that after the deposition.

On the basis of the above mechanism, it is considered that in the oxide 230, the region 234 maintains high resistance and can function as a channel formation region, and the region 249 maintains low resistance and can function as a source region or a drain region.

Note that the concentrations of a metal element and an impurity element such as hydrogen and nitrogen, which are detected in the region 249, are not necessarily uniform in the region 249. For example, the concentrations of a metal element and an impurity element such as hydrogen and nitrogen, which are detected in the region 249, may be the maximum in the vicinity of an interface between the oxide 230b and the insulator 256 or the oxide 230c and may be lower as closer to the oxide 230a. Note that the resistance of the region 249b is preferably reduced so that favorable contact can be formed with the conductor 247. Although the region 249 is formed only in the oxide 230b in FIG. 2, this embodiment is not limited thereto. For example, the region 249 may be formed in not only the oxide 230b but also in the oxide 230a.

In the oxide 230, the boundaries between the regions are difficult to detect clearly in some cases. The concentrations of a metal element and an impurity element such as hydrogen and nitrogen, which are detected in each region, may be not only gradually changed between the regions, but also continuously changed (also referred to as gradation) in each region. That is, the region closer to the channel formation region has lower concentrations of a metal element and an impurity element such as hydrogen and nitrogen.

A transistor using an oxide semiconductor is likely to have electrical characteristics changed by impurities and oxygen vacancies in a channel formation region of the oxide semiconductor, which might affect the reliability. Moreover, when the channel formation region of the oxide semiconductor includes oxygen vacancies, the transistor is likely to have normally-on characteristics. Thus, oxygen vacancies in the region 234 where a channel is formed are preferably reduced as much as possible.

To inhibit the transistor from becoming normally on, the insulator 250 near the oxide 230 preferably contains oxygen more than oxygen in the stoichiometric composition (also referred to as excess oxygen). Oxygen in the insulator 250 is diffused into the oxide 230 to reduce oxygen vacancies in the oxide 230 and can inhibit the transistor from becoming normally on.

That is, oxygen contained in the insulator 250 is diffused into the region 234 in the oxide 230, whereby oxygen vacancies in the region 234 in the oxide 230 can be reduced. Furthermore, oxygen contained in the insulator 280 is diffused into the region 234 in the oxide 230 through the oxide 230c, whereby oxygen vacancies in the region 234 in the oxide 230 can be reduced. In that case, a structure may be employed as illustrated in FIG. 2 in which the oxide 230c has a stacked-layer structure including the oxide 230c1 and the oxide 230c2 so that oxygen contained in the insulator 280 is diffused into the region 234 in the oxide 230 through the oxide 230c1. Furthermore, when a material which is less likely to transmit oxygen is used for the oxide 230c2, diffusion of oxygen contained in the insulator 280 into the insulator 250 or the conductor 260 can be inhibited and oxygen in the insulator 280 can be efficiently supplied to the region 234 in the oxide 230.

Here, the insulator 256 is preferably provided to cover the region 249a and the region 249b in the oxide 230b and the side surface of the oxide 230a and be in contact with the top surface of the insulator 224, and the insulator 258 is preferably provided between the insulator 256 and the insulator 280. The insulator 280 is isolated from the insulator 256, the insulator 224, the oxide 230a, and the oxide 230b by the insulator 258. The insulator 258 provided in this manner can inhibit injection of oxygen contained in the insulator 280 from the top and side surfaces of the oxide 230a and the oxide 230b.

The above-described structure enables the amount of oxygen supplied to the oxide 230 to be adjusted; accordingly, a highly reliable transistor which is prevented from becoming normally-on can be obtained.

As illustrated in FIGS. 1(B) and 1(C), the transistor 200 of one embodiment of the present invention has a structure in which the insulator 282 and the insulator 250 are directly in contact with each other. With such a structure, oxygen contained in the insulator 280 is less likely to be absorbed into the conductor 260. Thus, oxygen contained in the insulator 280 can be injected into the oxide 230a and the oxide 230b efficiently through the oxide 230c; hence, oxygen vacancies in the oxide 230a and the oxide 230b can be reduced and the electrical characteristics and the reliability of the transistor 200 can be improved. In addition, the mixing of impurities such as hydrogen contained in the insulator 280 into the insulator 250 can be inhibited, which can inhibit the adverse effects on the electrical characteristics and the reliability of the transistor 200. For the insulator 282, silicon nitride, silicon nitride oxide, aluminum oxide, or hafnium oxide can be used. It is particularly suitable that silicon nitride is used for the insulator 282. The silicon nitride can suitably block impurities (e.g., hydrogen or water) that might enter from the outside.

FIG. 1(D) is a cross-sectional view of a portion indicated by a dashed-dotted line A5-A6 in FIG. 1(A), and is also a cross-sectional view in the channel width direction of the source region or the drain region of the transistor 200. As illustrated in FIG. 1(D), a structure is employed in which the top surface of the region 249b and the side surface of the region 249b are covered with the insulator 256 and the insulator 258; thus, oxygen and impurities such as hydrogen or water can be inhibited from being diffused into the region 249b from the directions of the side surface of the region 249b and the top surface of the region 249b. Hence, diffusion of oxygen into the region 249b from the periphery of the region 249b can be inhibited, so that the oxidation of the region 249b can be inhibited. Note that a similar effect can also be obtained in the region 249a. Impurities such as hydrogen or water can be inhibited from being diffused into the oxide 230a and the oxide 230b from the side surface direction of the oxide 230a and the side surface direction of the oxide 230b.

As illustrated in FIG. 1(C), when the bottom surface of the insulator 224 is used as a reference, the level of the bottom surface of the conductor 260 in a region where the oxide 230a and the oxide 230b do not overlap with the conductor 260 is preferably lower than the level of the bottom surface of the oxide 230b. The difference between the level of the bottom surface of the conductor 260 in a region where the oxide 230b does not overlap with the conductor 260 and the level of the bottom surface of the oxide 230b is set to greater than or equal to 0 nm and less than or equal to 100 nm, preferably greater than or equal to 3 nm and less than or equal to 50 nm, further preferably greater than or equal to 5 nm and less than or equal to 20 nm.

As described above, the conductor 260, which functions as the gate electrode, covers the side surface and the top surface of the oxide 230b of the channel formation region, with the oxide 230c and the insulator 250 positioned therebetween; this enables the electrical field of the conductor 260 to easily affect the entire oxide 230b of the channel formation region. Consequently, the on-state current of the transistor 200 can be increased and the frequency characteristics can be improved.

Accordingly, a miniaturized or highly integrated semiconductor device can be provided. Alternatively, a semiconductor device that includes a transistor having a high on-state current can be provided. Alternatively, a semiconductor device that includes a transistor having excellent frequency characteristics can be provided. Alternatively, a semiconductor device that has stable electrical characteristics with a small variation in electrical characteristics and improved reliability can be provided. Alternatively, a semiconductor device that includes a transistor having a low off-state current can be provided.

The structure of the semiconductor device including the transistor 200 of one embodiment of the present invention is described in detail below.

The conductor 205 is placed to overlap with the oxide 230 and the conductor 260. Furthermore, the conductor 205 is preferably provided to be embedded in the insulator 214 and the insulator 216.

Here, the conductor 260 sometimes functions as a first gate (also referred to as a top gate) electrode. The conductor 205 sometimes functions as a second gate (also referred to as a bottom gate) electrode. In such cases, Vth of the transistor 200 can be controlled by changing a potential applied to the conductor 205 not in synchronization with but independently of a potential applied to the conductor 260. In particular, Vth of the transistor 200 can be higher than 0 V and the off-state current can be reduced by application of a negative potential to the conductor 205. Thus, a drain current when a potential applied to the conductor 260 is 0 V can be smaller in the case where a negative potential is applied to the conductor 205 than in the case where the negative potential is not applied.

As illustrated in FIG. 1(A), the conductor 205 is preferably provided to be larger than a region of the oxide 230 that does not overlap with the region 249a or the region 249b. As illustrated in FIG. 1(C), it is particularly preferable that the conductor 205 extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. A large conductor 205 can sometimes reduce local charging (referred to as charge up) in a treatment using plasma of a manufacturing step after the formation of the conductor 205. Note that one embodiment of the present invention is not limited thereto. The conductor 205 overlaps at least with the oxide 230 positioned between the region 249a and the region 249b.

With the above structure, the channel formation region can be electrically surrounded by the electric field of the conductor 260 having a function of the first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

A first conductive layer of the conductor 205 is preferably a conductor that inhibits the transmission of oxygen and impurities such as water and hydrogen. For example, a single layer or a stacked-layer of titanium, titanium nitride, tantalum, or tantalum nitride can be used. A second conductive layer of the conductor 205 may be a conductor with favorable adhesion to the first conductive layer and a third conductive layer. For the third conductive layer of the conductor 205, a conductive material containing tungsten, copper, or aluminum as its main component is preferably used. Note that although the conductor 205 is illustrated as having three layers, a single-layer structure, a two-layer structure, or a multi-layer structure of four or more layers may be employed.

The insulator 214, the insulator 258, the insulator 282, and the insulator 281 preferably function as a barrier insulating film that inhibits impurities such as water or hydrogen from entering the transistor 200 from the substrate side or from above. Thus, the insulator 214, the insulator 258, the insulator 282, and the insulator 281 are preferably formed using an insulating material having a function of inhibiting diffusion of impurities (through which the impurities are less likely to pass) such as a hydrogen atom, a hydrogen molecule, a water molecule, a nitrogen atom, a nitrogen molecule, a nitrogen oxide molecule (e.g., $N_2O$, NO, or $NO_2$), or a copper atom. Alternatively, it is preferable to use an insulating material that has a function of inhibiting diffusion of oxygen (e.g., at least one of oxygen atoms, oxygen molecules, and the like) (through which the above oxygen is less likely to pass).

For example, it is preferable that silicon nitride or the like be used for the insulator 214, the insulator 258, the insulator 282, and the insulator 281. Accordingly, impurities such as water or hydrogen can be inhibited from being diffused into the transistor 200 side from the substrate side through the insulator 214. Alternatively, oxygen contained in the insulator 224 and the like can be prevented from being diffused into the substrate side of the insulator 214. Impurities such as water or hydrogen can be inhibited from diffusing into the transistor 200 side from the insulator 280 and the like, which are provided above the insulator 258.

The resistivities of the insulator 214, the insulator 258, the insulator 282, and the insulator 281 are preferably low in some cases. For example, by setting the resistivities of the insulator 214, the insulator 258, the insulator 282, and the insulator 281 to approximately $1\times10^{13}$ Ωcm, the insulator 214, the insulator 258, the insulator 282, and the insulator 281 can reduce charge up of the conductor 205, or the conductor 260 in a treatment using plasma or the like of a manufacturing process of a semiconductor device in some cases. The resistivities of the insulator 214, the insulator 258, the insulator 282, and the insulator 281 are preferably higher than or equal to $1\times10^{10}$ Ωcm and lower than or equal to $1\times10^{15}$ Ωcm.

The insulator 214 may have a stacked-layer structure. For example, it is suitable that a stacked-layer structure of an aluminum oxide film and a silicon nitride film is used for the insulator 214. With the aluminum oxide film, oxygen can be supplied to a lower part of the insulator 214. Furthermore, diffusion of impurities such as hydrogen and water that enter the transistor 200 side from the substrate side can be inhibited by the silicon nitride film.

The insulator 216, the insulator 280, and the insulator 274 preferably have a lower dielectric constant than the insulator 214. When a material having a low dielectric constant is used for an interlayer film, parasitic capacitance generated between wirings can be reduced. As the insulator 216, the insulator 280, and the insulator 274, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used, for example.

The insulator 222 and the insulator 224 have a function of a gate insulator.

Here, it is preferable that oxygen be released from the insulator 224 in contact with the oxide 230 by heating. In this specification, oxygen that is released by heating is referred to as excess oxygen in some cases. For example, silicon oxide, silicon oxynitride, or the like is used for the insulator 224 as appropriate. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the amount of released oxygen converted into oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

The insulator 222 preferably functions as a barrier insulating film that inhibits impurities such as water or hydrogen from being mixed in the transistor 200 from the substrate side. For example, the insulator 222 has the property of being less likely to transmit hydrogen than the insulator 224. Surrounding the insulator 224, the oxide 230, and the like by the insulator 222 and the insulator 272 can inhibit entry of impurities such as water or hydrogen into the transistor 200 from the outside.

Furthermore, the insulator 222 preferably has a function of inhibiting diffusion of oxygen (e.g., at least one of an oxygen atom, an oxygen molecule, and the like) (or is preferably less likely to transmit the above oxygen). For example, the insulator 222 preferably has the property of being less likely to transmit oxygen than the insulator 224. The insulator 222 preferably has a function of inhibiting diffusion of oxygen or impurities, in which case diffusion of oxygen contained in the oxide 230 into a layer under the insulator 222 can be reduced. Furthermore, the conductor 205 can be inhibited from reacting with oxygen contained in the insulator 224 or the oxide 230.

Furthermore, it is particularly preferable to use an insulator containing an oxide of one or both of aluminum and hafnium, which is an insulating material, for the insulator 222. As the insulator containing an oxide of one or both of aluminum and hafnium, aluminum oxide, hafnium oxide, an oxide containing aluminum and hafnium (hafnium aluminate), or the like is preferably used. When the insulator 222 is formed using such a material, the insulator 222 functions as a layer that inhibits release of oxygen from the oxide 230 and mixing of impurities such as hydrogen from the periphery of the transistor 200 in the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed.

Like the conductor 205, the conductor 247 may also include a first conductive layer, a second conductive layer positioned on an inner side of the first conductive layer, and a third conductive layer positioned on an inner side of the second conductive layer. The first conductive layer of the conductor 247 is preferably a conductor that inhibits the transmission of oxygen and impurities such as water or hydrogen. For example, titanium, titanium nitride, tantalum, or tantalum nitride can be used. The second conductive layer of the conductor 247 may be a conductor with favorable adhesion to the first conductive layer and the third conductive layer. Moreover, the third conductive layer of the conductor 247 is preferably formed using a conductive material containing tungsten, copper, or aluminum as its main component. Note that although the conductor 247 is illustrated as having three layers, a single-layer structure, a two-layer structure, or a multi-layer structure of four or more layers may be employed.

An insulator that inhibits the diffusion of oxygen and impurities such as hydrogen or water, like the insulator 241, may be provided at the side surface of the conductor 247 as in the conductor 240.

The oxide 230 includes the oxide 230a, the oxide 230b over the oxide 230a, and the oxide 230c over the oxide 230b. Here, the oxide 230c is positioned such that at least part thereof overlaps with the region between the region 249a and the region 249b. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

The oxide 230 preferably has a stacked-layer structure of oxides that differ in the atomic ratio of metal atoms. Specifically, the atomic ratio of the element M to constituent elements in the metal oxide used as the oxide 230a is preferably greater than the atomic ratio of the element M to constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. Accordingly, oxygen extraction from the oxide 230b by the source electrode or the drain electrode can be suppressed. This can inhibit oxygen extraction from the oxide 230b even when heat treatment is performed; hence, the transistor 200 is stable against high temperatures in the manufacturing process (may also referred to as a thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 1:1:1 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] as the oxide 230c1 and In:Ga:Zn=1:3:4 [atomic ratio] as the oxide 230c2, a stacked-layer structure of In:Ga:Zn=4:2:3 [atomic ratio] as the oxide 230c1 and Ga:Zn=2:1 [atomic ratio] as the oxide 230c2, a stacked-layer structure of In:Ga:Zn=4:2:3 [atomic ratio] as the oxide 230c1 and Ga:Zn=2:5 [atomic ratio] as the oxide 230c2, and a stacked-layer structure of In:Ga:Zn=4:2:3 [atomic ratio] as the oxide 230c1 and gallium oxide as the oxide 230c2.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current and excellent frequency characteristics. Note that in the case where the oxide 230c has a stacked-layer structure, not only the above effect of reducing the density of defect states at the interface between the oxide 230b and the oxide 230c but also the effect of inhibiting diffusion of a constituent element contained in the oxide 230c to the insulator 250 side should be obtained. More specifically, the oxide 230c has a stacked-layer structure and an oxide containing no In or having a reduced In concentration is positioned in an upper portion of the stacked-layer structure, so that possible diffusion of In to the insulator 250 side can be inhibited. Since the insulator 250 functions as the gate insulator, the transistor has defects in characteristics when In diffuses. Thus, when the oxide 230c has a stacked-layer structure, a highly reliable semiconductor device can be provided.

When the oxide 230c has a stacked-layer structure, the interface between the oxide 230b and the oxide 230c1 and its vicinity may serve as a main carrier path.

Since the oxide 230c1 is in contact with the side surface of the insulator 280, oxygen contained in the insulator 280 can be supplied to the channel formation region of the transistor 200 through the oxide 230c1. For the oxide 230c2, a material which is less likely to transmit oxygen is preferably used. The use of the above material can inhibit absorption of oxygen contained in the insulator 280 into the insulator 250 or the conductor 260 through the oxide 230c2; as a result, oxygen can be efficiently supplied to the channel formation region.

The oxide 230 includes the region 249 and the region 234. When the transistor 200 is turned on, one of the region 249a and the region 249b functions as the source region and the other functions as the drain region. At least part of the region 234 functions as the region where the channel is formed.

That is, by appropriately selecting the areas of the regions, a transistor having electrical characteristics that meet the demand for the circuit design can be easily provided.

A metal oxide functioning as an oxide semiconductor is preferably used as the oxide 230. For example, a metal oxide having an energy gap of 2 eV or more, preferably 2.5 eV or more, is preferably used. With the use of a metal oxide having such a wide energy gap, the off-state current of the transistor can be reduced.

Electron affinity or conduction band minimum Ec can be obtained from an energy gap Eg and an ionization potential Ip, which is a difference between a vacuum level and an energy of valence band maximum Ev. The ionization potential Ip can be measured using, for example, an ultraviolet photoelectron spectroscopy (UPS) apparatus. The energy gap Eg can be measured using, for example, a spectroscopic ellipsometer.

The insulator 250 functions as a gate insulator. The insulator 250 is preferably placed in contact with the inner side (the top surface and the side surface) of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

The insulator 250 may be formed using an insulator from which oxygen is released by heating as in the insulator 224. When an insulator from which oxygen is released by heating is provided as the insulator 250 in contact with the top surface of the oxide 230c, oxygen can be efficiently supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 into the conductor 260. Provision of the metal oxide that inhibits diffusion of oxygen inhibits diffusion of oxygen from the insulator 250 into the conductor 260. That is, a reduction in the amount of excess oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential that is applied during operation of the transistor can be reduced while the physical thickness of the gate insulator is kept. In addition, the equivalent oxide thickness (EOT) of an insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium such as aluminum oxide, hafnium oxide, or an oxide containing aluminum and hafnium (hafnium aluminate).

The metal oxide has a function of part of the gate electrode in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

Although the conductor 260 has a two-layer structure in FIG. 1, a single-layer structure or a stacked-layer structure of three or more layers may be employed.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, ruthenium oxide, or the like is preferably used.

A conductive material containing tungsten, copper, or aluminum as its main component is preferably used for the conductor 260b. As the conductor 260 also functioning as a wiring, a conductor having high conductivity is preferably used. For example, a conductive material containing tungsten, copper, or aluminum as its main component can be used. In addition, the conductor 260b may have a stacked-layer structure, for example, a stacked-layer structure of any of the above conductive materials and titanium or titanium nitride.

The insulator 256 preferably has a function of a protective film when the region 249 is formed. When ion implantation or ion doping is used to form the region 249, it is preferable to provide the insulator 256 as a protective film because the surface of the oxide 230 is not directly exposed to ions and plasma and thus damage to the oxide 230 in the formation of the region 249 can be reduced. Here, the damage to the oxide 230 refers to, for example, formation of an excessive amount of oxygen vacancies in the oxide 230 and an excessive reduction in crystallinity of the oxide 230. For the insulator 256, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used, for example.

A material that can be used for the oxide 230a may be used for the insulator 256. In that case, a metal oxide with In:Ga:Zn=1:3:4 [atomic ratio] or 1:1:0.5 [atomic ratio], which is an oxide that is less likely to transmit oxygen, is used for the insulator 256.

Like the insulator 214 and the like, the insulator 256 may function as a barrier insulating film that inhibits the entry of impurities such as water or hydrogen into the transistor 200 from the insulator 280 side. For example, the insulator 256 preferably has a lower hydrogen permeability than the insulator 224. In addition, the insulator 256 may have a function of inhibiting diffusion of oxygen (e.g., at least one of an oxygen atom, an oxygen molecule, and the like). For example, the insulator 256 may have a lower oxygen permeability than the insulator 280 or the insulator 224.

An insulator containing an oxide of one or both of aluminum and hafnium is preferably formed as the insulator 256, for example. Note that as the insulator containing an oxide of one or both of aluminum and hafnium, aluminum oxide, hafnium oxide, an oxide containing aluminum and hafnium (hafnium aluminate), or the like is preferably used.

The insulator 256 may have a stacked-layer structure. In the case where the insulator 256 has a stacked-layer structure, a second insulator may be formed by an ALD method over a first insulator formed by a sputtering method. In that case, for the first insulator and the second insulator, the same material selected from the above materials may be used or different materials may be used. For example, aluminum oxide formed by a sputtering method may be used for the first insulator, and aluminum oxide formed by an ALD method may be used for the second insulator. A film formed by an ALD method has high coverage, and it is possible to form a film with high uniformity even in a step portion formed by a component such as the oxide 230. Furthermore, such a film is preferable because a deposition defect in a first insulating film formed by a sputtering method can be compensated for.

As described above, the insulator 224 and the oxide 230 are covered with the insulator 256 having a barrier property against hydrogen, whereby the insulator 280 is isolated from the insulator 224 and the oxide 230. This can inhibit entry of impurities such as hydrogen from the outside of the transistor 200, resulting in excellent electrical characteristics and high reliability of the transistor 200.

Like the insulator 214 and the like, the insulator 258 preferably functions as a barrier insulating film that inhibits entry of impurities such as water or hydrogen into the transistor 200 from the insulator 280 side. For example, the insulator 258 preferably has lower hydrogen permeability than the insulator 224. In addition, the insulator 258 is preferably provided to be in contact with the top surface of the insulator 256 and a side surface of the oxide 230c as illustrated in FIGS. 1(B) and 1(C). Such a structure can inhibit entry of hydrogen contained in the insulator 280 into the oxide 230 and the insulator 224.

Thus, the insulator 256, the insulator 224, the insulator 250, and the oxide 230 are covered with the insulator 258 having a barrier property against hydrogen, whereby the insulator 280 is separated from the insulator 256, the insulator 224, the oxide 230, and the insulator 250. This can inhibit entry of impurities such as hydrogen from the outside of the transistor 200, resulting in excellent electrical characteristics and high reliability of the transistor 200.

In addition, it is preferable that the insulator 258 have a function of inhibiting diffusion of oxygen (e.g., at least one of oxygen atoms, oxygen molecules, and the like) (or be less likely to transmit the above oxygen). For example, the insulator 258 preferably has lower oxygen permeability than the insulator 224. When the insulator 258 has a function of inhibiting diffusion of oxygen, direct injection of oxygen from the insulator 280 into the oxide 230a and the oxide 230b can be prevented.

As the insulator 258, for example, a barrier insulating film that can be used for the insulator 256 can be used. Note that when the insulator 256 has a sufficient barrier property against hydrogen, a barrier insulating film is not necessarily used as the insulator 258, and a structure without the insulator 258 may be employed.

The insulator 280 preferably contain, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which are thermally stable, are preferable. Materials such as silicon oxide, silicon oxynitride, and porous silicon oxide, in each of which a region containing oxygen that is released by heating can be easily formed, are particularly preferable. The insulator 280 preferably contains a larger amount of oxygen so that oxygen contained in the insulator 280 is supplied to the oxide 230b through the oxide 230c, or the oxide 230c1, and preferably contains more oxygen than that in the stoichiometric ratio, for example. To increase the concentration of oxygen contained in the insulator 280, a deposition gas used for forming the insulator 280 preferably contains oxygen.

The concentration of impurities such as water or hydrogen in the insulator 280 is preferably reduced. It is particularly preferable that the insulator 280 be formed by a sputtering method because the insulator 280 in which the concentration of impurities such as water or hydrogen is reduced can be obtained. For example, silicon oxide deposited by a sputtering method using a target containing silicon or silicon oxide and a gas containing argon or oxygen is more suitable for the insulator 280 than silicon oxynitride and silicon oxide deposited by a CVD method using a deposition gas containing hydrogen because the hydrogen concentration of the film is low. Taking a deposition rate at the time of forming the insulator 280 and coverage of steps formed by the oxide 230a, the oxide 230b, the opening 248, and the like into consideration, the insulator 280 may be formed by a CVD method. Although not illustrated, the insulator 280 may have a stacked-layer structure of two or more layers, in which case silicon oxide deposited by a sputtering method is used as the first layer and silicon oxynitride deposited by a CVD method is used as the second layer. The top surface of the insulator 280 may be planarized.

The insulator 282 preferably functions as a barrier insulating film that inhibits impurities such as water or hydrogen from entering the insulator 280 from the above. As the insulator 282, an insulator such as aluminum oxide, silicon nitride, or silicon nitride oxide may be used.

The insulator 274 functioning as an interlayer film is preferably provided over the insulator 282. As in the insulator 224 or the like, the concentration of impurities such as water or hydrogen in the insulator 274 is preferably reduced.

For the conductor 240, a conductive material containing tungsten, copper, or aluminum as its main component is preferably used. In addition, the conductor 240 may have a stacked-layer structure.

In the case where the conductor 240 has a stacked-layer structure, a conductive material having a function of inhibiting the transmission of impurities such as water or hydrogen is preferably used for a conductor in contact with the insulator 241. For example, tantalum, tantalum nitride, titanium, titanium nitride, ruthenium, ruthenium oxide, or the like is preferably used. A single layer or a stacked layer of the conductive material having a function of inhibiting the transmission of impurities such as water or hydrogen may be used. The use of the conductive material can prevent oxygen added to the insulator 280 from being absorbed by the conductor 240. Moreover, the mixing of impurities such as water or hydrogen into the oxide 230 through the conductor 240 from a layer above the insulator 281 can be inhibited.

As the insulator 241, an insulator such as aluminum oxide, silicon nitride, or silicon nitride oxide may be used. Since the insulator 241 is provided in contact with the insulator 281, the insulator 274, the insulator 282, the insulator 280, the insulator 258, and the insulator 256, the mixing of impurities such as water or hydrogen into the oxide 230 through the conductor 240 from the insulator 280 or the like can be inhibited. In addition, oxygen contained in the insulator 280 can be prevented from being absorbed by the conductor 240.

A conductor functioning as a wiring may be provided in contact with the top surface of the conductor 240. The conductor is preferably formed using a conductive material containing tungsten, copper, or aluminum as its main component. Furthermore, the conductor may have a stacked-layer structure; for example, stacked layers of the above conductive material, and titanium or titanium nitride. Note that the conductor may be formed to be embedded in an opening provided in an insulator.

<Constituent Material of Semiconductor Device>

Constituent materials that can be used for the semiconductor device will be described below.

<Substrate>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

<Insulator>

As an insulator, an oxide, a nitride, an oxynitride, a nitride oxide, a metal oxide, a metal oxynitride, and a metal nitride oxide, each of which has an insulating property can be given.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material with a low relative permittivity is used for the insulator functioning as an interlayer film, the parasitic capacitance generated between wirings can be reduced. Accordingly, a material is preferably selected depending on the function of an insulator.

As the insulator having a high relative permittivity, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given.

As the insulator with a low relative permittivity, silicon oxide, silicon oxynitride, silicon nitride oxide, silicon oxide to which fluorine is added, silicon oxide to which carbon is added, silicon oxide to which carbon and nitrogen are added, porous silicon oxide, a resin and the like can be given.

When a transistor using an oxide semiconductor is surrounded by insulators having a function of inhibiting transmission of oxygen and impurities such as hydrogen, the electrical characteristics of the transistor can be stable. As the insulator having a function of inhibiting transmission of oxygen and impurities such as hydrogen, an insulator, which is a single layer or a stacked layer, containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used, for example. Specifically, for the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen that is released by heating. When a structure is employed in which silicon oxide or silicon oxynitride including a region containing oxygen that is released by heating is in contact with the oxide 230, oxygen vacancies contained in the oxide 230 can be compensated for.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide in which a channel is formed can be trapped in some cases. Alternatively, hydrogen mixed from an external insulator or the like can be trapped in some cases.

<Metal Oxide>

As the oxide 230, a metal oxide functioning as an oxide semiconductor is preferably used. A metal oxide that can be used for the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, mixing of impurities, formation of defects, or the like might decrease the crystallinity of a metal oxide, which means that the CAAC-OS is a metal oxide having small amounts of impurities and defects (e.g., oxygen vacancies (also referred to as VOs)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In some cases, IGZO has a stable structure when formed of smaller crystals (e.g., the above-described nanocrystals) rather than larger crystals (here, crystals with a size of several millimeters or several centimeters) because crystal growth tends to hardly occur particularly in the air.

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

The oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in the oxide semiconductor of one embodiment of the present invention.

Note that there is no particular limitation on a structure of an oxide semiconductor (metal oxide) in the semiconductor device of one embodiment of the present invention; however, the oxide semiconductor preferably has crystallinity. For example, the oxide 230 can have a CAAC-OS structure. The semiconductor device can have high reliability when the oxide 230 has the above crystal structure.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration obtained by secondary ion mass spectrometry (SIMS)) is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to become water, and thus forms an oxygen vacancy, in some cases. When hydrogen enters the oxygen vacancy, an electron which is a carrier is generated in some cases. Furthermore, in some cases, bonding of part of hydrogen to oxygen bonded to a metal atom causes generation of an electron which is a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be given.

<Method of Manufacturing Semiconductor Device>

Next, a method of manufacturing the semiconductor device including the transistor 200 according to the present invention, which is illustrated in FIG. 1, will be described with reference to FIG. 3 to FIG. 13. In FIG. 3 to FIG. 13, (A) of each drawing is a top view. Moreover, (B) of each drawing is a cross-sectional view corresponding to a portion indicated by the dashed-dotted line A1-A2 in (A), and is also a cross-sectional view of the transistor 200 in the channel length direction. Furthermore, (C) of each drawing is a cross-sectional view corresponding to a portion indicated by the dashed-dotted line A3-A4 in (A), and is also a cross-sectional view in the channel width direction of the transistor 200. Furthermore, (D) of each drawing is a cross-sectional view corresponding to a portion indicated by the dashed-dotted line A5-A6 in (A), and is also a cross-sectional view of the transistor 200 in the source region or the drain region in the channel width direction. Note that for simplification of the drawings, some components are not illustrated in the top view of (A) of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

In an ALD method, one atomic layer can be deposited at a time using self-regulating characteristics of atoms. Hence, an ALD method has effects such as deposition of an extremely thin film, deposition on a component with a large aspect ratio, deposition of a film with a small number of defects such as pinholes, deposition with excellent coverage, and low-temperature deposition. An ALD method includes a PEALD (plasma-enhanced ALD) method, which is a deposition method using plasma. The use of plasma is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

A CVD method and an ALD method enable control of the composition of a film to be obtained with a flow rate ratio of the source gases. For example, by a CVD method or an ALD method, a film with a certain composition can be deposited depending on a flow rate ratio of the source gases. Moreover, by a CVD method or an ALD method, by changing the flow rate ratio of the source gases during the deposition, a film whose composition is continuously changed can be deposited. In the case of depositing while changing the flow rate ratio of the source gases, as compared with the case of depositing with the use of a plurality of deposition chambers, time taken for the deposition can be shortened because time taken for transfer and pressure adjustment is omitted. Thus, productivity of semiconductor devices can be improved in some cases.

In this embodiment, for the insulator 214, silicon nitride is deposited by a CVD method. As described here, an insulator through which copper is less likely to pass, such as silicon nitride, is used for the insulator 214; accordingly, even when a metal that is likely to diffuse, such as copper, is used for a conductor in a layer (not illustrated) below the insulator 214, diffusion of the metal into a layer above the insulator 214 can be inhibited.

Next, the insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. Note that examples of the opening include a groove and a slit. A region where the opening is formed may be referred to as an opening portion. Although wet etching can be used for the formation of the opening, dry etching is preferable in terms of microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205 is deposited. The conductive film preferably includes a conductor that has a function of inhibiting the transmission of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In this embodiment, the conductive film to be the conductor 205 has a multilayer structure. First, tantalum nitride is deposited as a conductive film to be the conductor 205a by a sputtering method, and titanium nitride is stacked as a conductive film to be the conductor 205b over the tantalum nitride by a CVD method. Even when a metal that is likely to diffuse, such as copper, is used for a conductive film to be a conductor 205c described below, the use of such metal nitrides for a lower layer of the conductive film to be the conductor 205 can prevent outward diffusion of the metal from the conductor 205.

Next, the conductive film to be the conductor 205c is deposited. The conductive film can be deposited by a plating method, a sputtering method, a CVD method, an MBE method, a PLD method, an ALD method, or the like. In this embodiment, for the conductive film to be the conductor 205c, a low-resistance conductive material such as tungsten or copper is deposited. For example, as the conductive film to be the conductor 205c, tungsten may be deposited by a CVD method.

Next, CMP (chemical mechanical polishing) treatment is performed to remove part of the conductive film to be the conductor 205, so that the insulator 216 is exposed (see FIG. 3). As a result, the conductive film to be the conductor 205 remains only in the opening portions. Thus, the conductor 205 (the conductor 205a, the conductor 205b, and the conductor 205c) whose top surface is flat can be formed. Note that the insulator 216 is partly removed by the CMP treatment in some cases.

Here, a method of forming the conductor 205 which is different from the above will be described below.

The conductive film to be the conductor 205 is deposited over the insulator 214. The conductive film can be deposited by a sputtering method, a CVD method, an MBE method, a PLD method, an ALD method, or the like. In addition, the conductive film can be a multilayer film. In this embodiment, tungsten is deposited for the conductive film.

Next, the conductive film is processed by a lithography method to form the conductor 205.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency power sources with the same frequency are applied to the parallel plate type electrodes. Alternatively, a structure may be employed in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 216 is deposited over the insulator 214 and the conductor 205. The insulator to be insulator 216 can be deposited by a sputtering method, a CVD method, an MBE method, a PLD method, an ALD method, or the like. In this embodiment, for the insulating film to be insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the thickness of the conductor 205 is 150 nm and the thickness of the insulating film to be the insulator 216 is 350 nm.

Next, CMP treatment is performed on the insulating film to be the insulator 216, so that part of the insulating film to be the insulator 216 is removed and a surface of the conductor 205 is exposed. Thus, the conductor 205 and the insulator 216 whose top surfaces are flat can be formed. The above is another method of forming the conductor 205.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, the insulator 224 is deposited over the insulator 222. The insulator 224 can be deposited by a sputtering method, a CVD method, an MBE method, a PLD method, an ALD method, or the like.

Then, an opening is formed in the insulator 224, the insulator 222, the insulator 216, and the insulator 214. Wet etching can be used for the formation of the opening; however, dry etching is preferably used for microfabrication.

After the formation of the opening, a conductive film to be the conductor 247 is formed. The conductive film to be the conductor 247 can be formed by a sputtering method, a CVD method, an MBE method, a PLD method, an ALD method, or the like. In this embodiment, the conductor 247 is formed to have a structure similar to that of the conductor 205. Accordingly, a conductive film to be a conductor 247a is formed by a method similar to that of the conductive film to be the conductor 205a, a conductive film to be a conductor 247b is formed by a method similar to that of the conductive film to be the conductor 205b, and a conductive film to be a conductor 247c is formed by a method similar to that of the conductive film to be the conductor 205c.

Next, CMP treatment is performed to remove part of the conductive film to be the conductor 247, so that the insulator 224 is exposed (see FIG. 3). As a result, the conductive film to be the conductor 247 remains only in the opening portions. Thus, the conductor 247 (the conductor 247a, the conductor 247b, and the conductor 247c) whose top surface is flat can be formed. Note that the insulator 224 is partly removed by the CMP treatment in some cases.

Sequentially, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. Alternatively, the heat treatment may be performed under reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, treatment is performed at 400° C. in a nitrogen atmosphere for an hour, and successively another treatment is performed at 400° C. in an oxygen atmosphere for an hour. By the heat treatment, impurities such as water and hydrogen included in the insulator 224 can be removed.

The above heat treatment may be performed after the insulator 222 is deposited. For the heat treatment, the conditions for the above-described heat treatment can be used.

Here, plasma treatment containing oxygen may be performed under reduced pressure so that an excess-oxygen region can be formed in the insulator 224. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen included in the insulator 224 can be removed by selecting the conditions for the plasma treatment appropriately. In that case, the heat treatment is not necessarily performed.

Here, aluminum oxide may be deposited over the insulator 224 by a sputtering method and the aluminum oxide may be subjected to CMP until the insulator 224 is reached. The CMP treatment can planarize the surface of the insulator 224 and smooth the surface of the insulator 224. When the CMP treatment is performed on the aluminum oxide placed over the insulator 224, it is easy to detect the endpoint of CMP. Although part of the insulator 224 is polished by CMP and the thickness of the insulator 224 is reduced in some cases, the thickness can be adjusted when the insulator 224 is deposited. Planarizing and smoothing the surface of the insulator 224 can improve the coverage with an oxide deposited later and a decrease in the yield of the semiconductor device in some cases. The deposition of aluminum oxide over the insulator 224 by a sputtering method is preferred because oxygen can be added to the insulator 224.

Next, an oxide film 230A is deposited over the insulator 224 (see FIG. 3). The oxide film 230A can be deposited by a sputtering method, a CVD method, an MBE method, a PLD method, an ALD method, or the like.

In the case where the oxide film 230A is deposited by a sputtering method, for example, oxygen or a mixed gas of oxygen and a rare gas is used as a sputtering gas. The amount of excess oxygen in the oxide film to be deposited can be increased by an increase in the proportion of oxygen contained in the sputtering gas. In the case where the above oxide film is deposited by a sputtering method, the above In-M-Zn oxide target can be used.

In particular, when the oxide film 230A is deposited, part of oxygen included in the sputtering gas is supplied to the insulator 224 in some cases. Therefore, the proportion of oxygen included in the sputtering gas for the oxide film 230A is preferably 70% or higher, further preferably 80% or higher, and still further preferably 100%.

In this embodiment, the oxide film 230A is formed by a sputtering method using a target with In:Ga:Zn=1:1:0.5 [atomic ratio] (2:2:1 [atomic ratio]) or 1:3:4 [atomic ratio]. Note that the oxide films is preferably formed by appropriate selection of deposition conditions and an atomic ratio depending on characteristics required for the oxide 230.

Next, a mask 252 is formed over the oxide film 230A (see FIG. 3). A resist mask or a hard mask can be used as the mask 252.

Next, the opening 248 from which at least part of the conductor 247 is exposed is formed in the oxide film 230A using the mask 252 (see FIG. 4). Although wet etching can be used for the formation of the opening 248, dry etching is preferable in terms of microfabrication.

Next, the mask 252 is removed and the oxide film 230B is formed (see FIG. 5). Here, the oxide film 230B is in contact with the conductor 247 in the opening 248. The oxide film 230B can be formed by a sputtering method, a CVD method, an MBE method, a PLD method, an ALD method, or the like.

In the case where the oxide film 230B is deposited by a sputtering method, for example, oxygen or a mixed gas of oxygen and a rare gas is used as a sputtering gas. The amount of excess oxygen in the oxide film to be deposited can be increased by an increase in the proportion of oxygen contained in the sputtering gas. In the case where the above oxide film is deposited by a sputtering method, the above In-M-Zn oxide target can be used.

In the case where the oxide film 230B is formed by a sputtering method, when the proportion of oxygen included in the sputtering gas is higher than or equal to 1% and lower than or equal to 30%, preferably higher than or equal to 5% and lower than or equal to 20% during the deposition, an oxygen-deficient oxide semiconductor is formed. In a transistor using an oxygen-deficient oxide semiconductor for its channel formation region, relatively high field-effect mobility can be obtained.

In this embodiment, the oxide film 230B is deposited by a sputtering method using a target with In:Ga:Zn=4:2:4.1 [atomic ratio] or a target with In:Ga:Zn=1:1:1 [atomic ratio]. Note that each of the oxide films is preferably formed to have characteristics required for the oxide 230 by appropriate selection of deposition conditions and an atomic ratio.

Next, heat treatment may be performed. For the heat treatment, the conditions for the above-described heat treatment can be used. Through the heat treatment, impurities such as water and hydrogen in the oxide film 230A and the oxide film 230B can be removed, for example. In this embodiment, treatment is performed at 400° C. in a nitrogen atmosphere for an hour, and successively another treatment is performed at 400° C. in an oxygen atmosphere for an hour.

Next, the oxide film 230A and the oxide film 230B are processed into island shapes to form the oxide 230a and the oxide 230b (see FIG. 6). Note that in this step, the thickness of a region of the insulator 224 which does not overlap with the oxide 230a becomes small in some cases.

Note that the oxide 230a and the oxide 230b are formed to at least partly overlap with the conductor 205. It is preferable that the side surfaces of the oxide 230a and the oxide 230b be substantially perpendicular to the top surface of the insulator 222. When the side surfaces of the oxide 230a and the oxide 230b are substantially perpendicular to the top surface of the insulator 222, the plurality of transistors 200 can be provided in a smaller area and at a higher density. Alternatively, a structure may be employed in which an angle formed by the side surfaces of the oxide 230a and the oxide 230b and the top surface of the insulator 222 is a small angle. In that case, the angle formed by the side surfaces of the oxide 230a and the oxide 230b and the top surface of the insulator 222 is preferably greater than or equal to 60° and less than 70°. With such a shape, the coverage with the insulator 256 and the like can be improved in a later step, so that defects such as a void can be reduced.

Note that for the processing of the oxide films and the conductive film, a lithography method can be employed. The processing can be performed by a dry etching method or a wet etching method. The processing by a dry etching method is suitable for microfabrication.

It is preferable that there be a curved surface between the side surface of the oxide 230b and the top surface of the oxide 230b. That is, an end portion where the side surface and the top surface intersect with each other is preferably curved (hereinafter such a curved shape is also referred to as a rounded shape). The radius of curvature of the curved surface at an end portion of the oxide 230b is greater than or equal to 3 nm and less than or equal to 10 nm, preferably greater than or equal to 5 nm and less than or equal to 6 nm, for example. When the end portions are not angular, the coverage with films deposited in a later step can be improved.

Note that for the processing of the oxide film, a lithography method can be employed. The processing can be performed by a dry etching method or a wet etching method. The processing by a dry etching method is suitable for microfabrication.

Next, the insulator 256A is deposited over the insulator 224, the oxide 230a, and the oxide 230b (see FIG. 6).

The insulating film 256A can be formed by a sputtering method, a CVD method, an MBE method, a PLD method, an ALD method, or the like. As the insulating film 256A, an insulating film having a function of inhibiting transmission of oxygen is preferably used. For example, silicon oxynitride may be deposited by a CVD method. Alternatively, silicon nitride, silicon oxide, or aluminum oxide may be deposited by a sputtering method. Alternatively, for the insulating film 256A, a material that can be used for the oxide 230a and the oxide 230b can be used. For example, for the insulating film 256A, a metal oxide with In:Ga:Zn=1:3:4 [atomic ratio] or 1:1:0.5 [atomic ratio] is preferably used.

The insulating film 256A may have a stacked-layer structure. Preferably, an aluminum oxide film is formed by a sputtering method as a lower layer and then an aluminum oxide film is formed by an ALD method as an upper layer, for example. Alternatively, an aluminum oxide film may be formed by a sputtering method as a lower layer and a silicon nitride film may be formed by an ALD method as an upper layer.

Next, a film to be a dummy gate 262A is formed over the insulating film 256A.

A film to be the dummy gate 262A is processed to be used as a dummy gate. The dummy gate is an interim gate electrode. That is, the film to be the dummy gate 262A is processed to form an interim gate electrode, the dummy gate is removed in a later step, and a gate electrode is formed using a conductive film or the like instead. Thus, a film that is easily processed minutely and easily removed is preferably used as the film to be the dummy gate 262A.

The film to be the dummy gate 262A can be formed by a sputtering method, a CVD method, an MBE method, a PLD method, an ALD method, or the like. For example, an insulator, a semiconductor, or a conductor can be used. Specifically, silicon such as polysilicon, microcrystalline silicon, or amorphous silicon, or a metal film of aluminum, titanium, tungsten, or the like is used, for example. Alternatively, a film containing carbon, SOG (Spin On Glass), a resin film, or the like may be formed by a coating method. Examples of a resin include a photoresist, polyester, polyolefin, polyamide (nylon, aramid, or the like), polyimide, polycarbonate, and acrylic. When SOG or the resin film is formed by a coating method, a surface of the dummy gate film can be made flat. When the surface of the dummy gate film is made flat in this manner, the dummy gate film can be easily processed minutely and easily removed.

The dummy gate needs to protect the oxide 230 from the dopant in the dopant addition described later. Therefore, the film to be the dummy gate 262A preferably has sufficient hardness. As the dummy gate film, for example, a film containing carbon is preferable.

In addition, the film to be the dummy gate 262A can be a multilayer film using different kinds of films. For example, the film to be the dummy gate 262A can have a two-layer structure of a conductive film and a resin film formed over the conductive film. When the dummy gate film has such a structure, the conductive film sometimes functions as a stopper film for CMP treatment in a later CMP process, for example. Alternatively, the end point of the CMP treatment can be detected in some cases, so that processing variations can be reduced in some cases.

Next, the film to be the dummy gate 262A is etched by a lithography method, so that the dummy gate 262A is formed (see FIG. 7). The dummy gate 262A is formed to at least partly overlap with the conductor 205 and the oxide 230b.

After the dummy gate 262A is formed, heat treatment may be performed so that the dummy gate 262A is hardened. In particular, when the shape of the dummy gate 262A is made to have a high aspect ratio, the dummy gate 262A is hardened, so that change in the shape of the dummy gate 262A can be prevented.

Next, an insulating film 258A is formed to cover the insulating film 256A and the dummy gate 262A (see FIG. 7). The insulating film 258A can be formed by a sputtering method, a CVD method, an MBE method, a PLD method, an ALD method, or the like.

As the insulating film 258A, an insulating film having a function of inhibiting diffusion of oxygen and impurities such as hydrogen is preferably used. For example, an aluminum oxide film is preferably formed by an ALD method. By the ALD method that provides good coverage, the insulating film 258A having uniform thickness even in a step portion generated by the oxide 230a, the oxide 230b, and the dummy gate 262A can be formed.

Next, a dopant 257 is added to the oxide 230b with the use of the dummy gate 262A as a mask (see FIG. 7). Accordingly, the region 249a and the region 249b including the dopant 257 are formed in the regions of the oxide 230b which do not overlap with the dummy gate 262A.

As a method of adding a dopant 257, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, donor, acceptor, impurity, element, or the like.

As the dopant 257, an element that forms the oxygen vacancy, an element that is bonded to the oxygen vacancy, or the like is used. Typical examples of the element include boron and phosphorus. Hydrogen, carbon, nitrogen, fluorine, sulfur, chlorine, titanium, a rare gas element, or the like can also be used. Typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above, boron and phosphorus are preferable as the dopant 257. In the case where boron or phosphorus is used as the dopant 257, manufacturing line apparatuses for amorphous silicon or low-temperature polysilicon can be used; thus, capital investment can be reduced.

In particular, an element that easily forms an oxide is preferably used for the dopant 257. Typical examples of the element include boron, phosphorus, aluminum, and magnesium.

A gas containing the impurity element can be used as a source gas for adding the dopant 257. In the case where boron is supplied, typically, a $B_2H_6$ gas, a $BF_3$ gas, or the like can be used. In the case where phosphorus is supplied, typically, a $PH_3$ gas can be used. A mixed gas in which any of these source gases is diluted with a rare gas may be used. Besides, any of $CH_4$, $N_2$, $NH_3$, $AlH_3$, $AlCl_3$, $SiH_4$, $Si_2H_6$, $F_2$, HF, $H_2$, a rare gas, and the like can be used as the source gas. The ion source is not limited to a gas; a vaporized liquid or a vaporized solid may be used for the ion source.

The addition of the dopant 257 can be controlled by setting the conditions such as the acceleration voltage and the dose in consideration of the composition, the density, the thickness, and the like of the insulating film 256A and the oxide 230b. In particular, it is preferable that sufficient energy be applied to the dopant 257 so that the dopant 257 can penetrate the portion of the insulating film 256A which is not in contact with the dummy gate 262A.

Although the dopant 257 is added substantially perpendicularly to the top surface of the insulator 214 in FIG. 7, one embodiment of the present invention is not limited thereto. The dopant 257 may be added obliquely to the top surface of the insulator 214. By means of the oblique addition of the dopant to the top surface of the insulator 214, the region 249a and the region 249b can be easily formed in part of the region overlapping with the dummy gate 262A.

In the forming method in this embodiment, the dopant 257 is added to the oxide 230b through the insulating film 256A. With the forming method, the dopant 257 is also added to the insulating film 256A. That is, both the oxide 230 and the insulating film 256A contain the element contained in the dopant 257. In the case where the insulating film 256A contains excess oxygen, the dopant 257 can inhibit diffusion of the excess oxygen to the outside in some cases. Furthermore, the dopant 257 is sometimes added to the oxide 230a, the insulator 224, and the insulator 222 provided under the oxide 230b and the insulating film 256A. Thus, the oxide 230a, the insulator 224, and the insulator 222 may contain the element included in the dopant 257.

The region 249 is formed using the dummy gate 262A as a mask in the above manner, whereby the conductor 260 formed in a later step can be disposed between the region 249a and the region 249b in a self-aligned manner.

Note that heat treatment may be performed after the dopant 257 is added. Thus, the dopant added to the oxide 230b can be diffused, so that the region 249a and the region 249b can be easily formed in part of the region overlapping with the dummy gate 262A. Furthermore, the dopant is diffused in the thickness direction of the oxide 230b, so that the resistance from the surface of the oxide 230b to the vicinity of the interface between the conductor 247 and the oxide 230b can be reduced and the contact resistance between the conductor 247 and the oxide 230b can be reduced. Through the heat treatment, hydrogen contained in the region 234 functioning as a channel formation region can be trapped by the oxygen vacancy in the region 249 in some cases. Thus, the transistor 200 can have stable electrical characteristics and increased reliability. The heat treatment may be performed in a later step.

Next, an insulating film 280A is formed over the insulating film 258A (see FIG. 8). The insulating film 280A can be deposited by a sputtering method, a CVD method, an MBE method, a PLD method, an ALD method, or the like.

Next, parts of the insulating film 280A, the insulating film 258A, and the dummy gate 262A are removed until part of the dummy gate 262A is exposed, so that the insulator 280, the insulator 258B, and a dummy gate 262 are formed (see FIG. 9). The insulator 280, the insulator 258B, and the dummy gate 262 are preferably formed by CMP treatment. Here, as illustrated in FIG. 9(B), the top surface of the dummy gate 262 is substantially aligned with the top surfaces of the insulator 258B and the insulator 280.

Next, the dummy gate 262 and parts of the insulating film 256A and the insulating film 258A which are exposed from the insulator 280 are removed to form the opening (see FIG. 10). The dummy gate 262, the insulating film 256A, and the insulating film 258A can be removed by wet etching, dry etching, ashing, or the like using the insulator 280 as a mask. Alternatively, a plurality of the above treatments may be performed in appropriate combination. For example, wet etching treatment may be performed after ashing treatment. The removal of part of the insulating film 258A forms the insulator 258, and the removal of part of the insulating film 256A forms the insulator 256. The dummy gate 262, part of the insulating film 256A, and part of the insulating film 258A are removed, so that part of the surface of the oxide 230b is exposed through the opening.

Note that the dummy gate 262 and the part of the insulating film 256A and the part of the insulating film 258A that are exposed from the insulator 280 are not necessarily removed at the same time. For example, the dummy gate 262 and part of the insulating film 258A which is exposed from the insulator 280 may be removed using the insulating film 256A as an etching stopper, and then part of the insulating film 256A which is exposed from the insulator 280 may be removed.

Next, heat treatment may be performed. Heat treatment may be performed under reduced pressure, and an oxide film 230C may be successively deposited without exposure to the air (see FIG. 11). The treatment can remove moisture and hydrogen adsorbed onto the surface of the oxide 230b and the like, and further can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C.

The oxide film 230C can be deposited by a sputtering method, a CVD method, an MBE method, a PLD method, an ALD method, or the like. The oxide film 230C is deposited by a method similar to that for the oxide film to be the oxide film 230A or the oxide film 230B in accordance with characteristics required for the oxide film 230C. In this embodiment, the oxide film 230C is deposited by a sputtering method using a target with In:Ga:Zn=1:3:4 [atomic ratio] or In:Ga:Zn=4:2:4.1 [atomic ratio].

The oxide film 230C may have a stacked-layer structure. For example, the oxide film 230C may be deposited by a sputtering method using a target of In:Ga:Zn=4:2:4.1 [atomic ratio] and successively deposited using a target of In:Ga:Zn=1:3:4 [atomic ratio].

In particular, when the oxide film 230C is deposited, part of oxygen included in the sputtering gas is supplied to the oxide 230a and the oxide 230b in some cases. Therefore, the proportion of oxygen included in the sputtering gas for the oxide film 230C is preferably 70% or higher, further preferably 80% or higher, and still further preferably 100%.

Next, heat treatment may be performed. Heat treatment may be performed under reduced pressure, and the insulating film 250A may be successively deposited without exposure to the air (see FIG. 11). The treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Next, a conductive film 260A and a conductive film 260B are deposited (see FIG. 11). The conductive film 260A and the conductive film 260B can be deposited by a sputtering method, a CVD method, an MBE method, a PLD method, an ALD method, or the like. For example, a CVD method is preferably used. In this embodiment, the conductive film 260A is deposited by an ALD method, and the conductive film 260B is deposited by a CVD method.

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 12).

Next, heat treatment may be performed. In this embodiment, the heat treatment is performed at 400° C. in a nitrogen atmosphere for an hour. The heat treatment can reduce the moisture concentration and the hydrogen concentration in the insulator 250 and the insulator 280.

Next, an insulating film to be the insulator 282 may be formed over the conductor 260, the oxide 230c, the insulator 250, and the insulator 280. The insulating film to be the insulator 282 can be deposited by a sputtering method, a CVD method, an MBE method, a PLD method, an ALD method, or the like. An aluminum oxide is preferably deposited as the insulating film to be the insulator 282 by a sputtering method, for example. It is preferable to form the insulator 282 in contact with the top surface of the conductor 260 in this manner because oxygen included in the insulator 280 can be inhibited from being absorbed into the conductor 260 in a later heat treatment (see FIG. 13).

Next, heat treatment may be performed. In this embodiment, the treatment is performed at 400° C. in a nitrogen atmosphere for an hour. By the heat treatment, oxygen added by the deposition of the insulator 282 can be injected into the insulator 280. In addition, the oxygen can be injected into the oxide 230a and the oxide 230b through the oxide 230c.

Next, an insulator to be the insulator 274 may be deposited over the insulator 282 (see FIG. 13). The insulating film to be the insulator 274 can be deposited by a sputtering method, a CVD method, an MBE method, a PLD method, an ALD method, or the like.

Next, an insulator to be the insulator 281 may be deposited over the insulator 274 (see FIG. 13). An insulating film to be the insulator 281 can be deposited by a sputtering method, a CVD method, an MBE method, a PLD method, an ALD method, or the like. Silicon nitride is preferably deposited as the insulating film to be the insulator 281 by a sputtering method, for example.

Then, an opening that reaches the region 249a is formed in the insulator 256, the insulator 258, the insulator 280, the insulator 282, the insulator 274, and the insulator 281. The opening is formed by a lithography method.

Next, an insulating film to be the insulator 241 is deposited and the insulating film is subjected to anisotropic etching, so that the insulator 241 is formed. The conductive film can be deposited by a sputtering method, a CVD method, an MBE method, a PLD method, an ALD method, or the like. As the insulating film to be the insulator 241, an insulating film having a function of inhibiting transmission of oxygen is preferably used. For example, aluminum oxide or silicon nitride is preferably deposited by an ALD method. For the anisotropic etching, a dry etching method is performed, for example. When the sidewall portion of the opening have such a structure, transmission of oxygen from the outside can be inhibited and oxidation of the formed conductor 240 can be prevented. Furthermore, impurities such as water and hydrogen can be prevented from diffused from the conductor 240 to the outside.

Next, a conductive film to be the conductor 240 is deposited. The conductive film to be the conductor 240 desirably has a stacked-layer structure which includes a conductor having a function of inhibiting transmission of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove part of the conductive film to be the conductor 240, so that the insulator 281 is exposed. As a result, the conductive film remains only in the opening, so that the conductor 240 having a planar top surface can be formed (see FIG. 1). Note that the insulator 281 is partly removed by the CMP treatment in some cases.

A conductor electrically connected to the conductor 240 may be formed. A conductor which is in contact with the top surface of the conductor 240 can be formed by forming a conductive film by a sputtering method, a CVD method, an MBE method, a PLD method, an ALD method, or the like and then processing the conductive film by a lithography method.

Through the above process, the semiconductor device including the transistor 200 illustrated in FIG. 1 can be manufactured. As illustrated in FIG. 3 to FIG. 13, with the use of the method of manufacturing the semiconductor device described in this embodiment, the transistor 200 can be manufactured.

According to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device having a high on-state current can be provided. Alternatively, according to one embodiment of the present invention, a semiconductor device having excellent frequency characteristics can be provided. Alternatively, according to one embodiment of the present invention, a semiconductor device having favorable reliability can be provided. Alternatively, according to one embodiment of the present invention, a semiconductor device with a low off-state current can be provided. Alternatively, according to one embodiment of the present invention, a semiconductor device with reduced power consumption can be provided. Alternatively, according to one embodiment of the present invention, a semiconductor device having high productivity can be provided.

<Modification Example of Semiconductor Device>

Examples of a semiconductor device including the transistor 200 of one embodiment of the present invention, which are different from the semiconductor device described in <Structure example of semiconductor device> above, will be described below with reference to FIG. 14 to FIG. 17.

In FIG. 14 to FIG. 17, (A) of each drawing is a top view. Moreover, (B) of each drawing is a cross-sectional view corresponding to a portion indicated by the dashed-dotted line A1-A2 in (A), and is also a cross-sectional view of the transistor 200 in the channel length direction. Furthermore, (C) of each drawing is a cross-sectional view corresponding to a portion indicated by the dashed-dotted line A3-A4 in (A), and is also a cross-sectional view in the channel width direction of the transistor 200. Furthermore, (D) of each drawing is a cross-sectional view corresponding to a portion indicated by the dashed-dotted line A5-A6 in (A), and is also a cross-sectional view of the transistor 200 in a source region or a drain region in the channel width direction. For simplification of the drawings, some components are not illustrated in the top view of (A) of each drawing.

Note that in semiconductor devices illustrated in FIG. 14 to FIG. 17, components having the same functions as the components in the semiconductor device described in <Structure example of semiconductor device> (see FIG. 1) are denoted by the same reference numerals. Note that in this section, the materials described in detail in <Structure example of semiconductor device> can be used as the constituent materials for the transistor 200.

Modification Example 1 of Semiconductor Device

The transistor 200 illustrated in FIG. 14 is different from the transistor 200 illustrated in FIG. 1 in that part of the conductor 247 is exposed from the top surface of the oxide 230a.

Here, part of the conductor 247 is preferably embedded in an opening formed in the oxide 230a. For example, as illustrated in FIG. 14, the conductor 247 is embedded in an opening formed in the oxide 230a, the insulator 224, the insulator 222, the insulator 216, and the insulator 214. In that case, it is preferable that at least part of the top surface of the conductor 247 be exposed from the oxide 230a, and that the top surface of the conductor 247 be substantially aligned with the top surface of the oxide 230a.

With this structure, the oxide 230b does not need to be embedded in the opening formed in the oxide 230a and thus the oxide 230b can be formed flatly. Accordingly, the contact resistance between the region 249b in the oxide 230b and the conductor 247 can be reduced.

In the case where the transistor 200 illustrated in FIG. 14 is formed, after the oxide film 230A illustrated in FIG. 3 is formed, an opening is formed in the oxide film 230A, the insulator 224, the insulator 222, the insulator 216, and the insulator 214, and then the conductor 247 is formed to fill the opening.

Modification Example 2 of Semiconductor Device

The transistor 200 illustrated in FIG. 15 is different from the transistor 200 illustrated in FIG. 1 in that the region 249a and the region 249b are formed in the oxide 230a and the oxide 230b. In addition, the transistor 200 illustrated in FIG. 15 is different from the transistor 200 illustrated in FIG. 1 in that the top surface of the conductor 247 is in contact with the region 249b formed in the oxide 230a.

With such a structure, direct contact between the oxide 230b and the conductor 247 becomes unnecessary; thus, a step of forming the opening in the oxide 230a can be omitted. As a result, a manufacturing process of the semiconductor device of this embodiment can be simplified and the productivity thereof can be improved.

Modification Example 3 of Semiconductor Device

The transistor 200 illustrated in FIG. 16 is different from the transistor 200 illustrated in FIG. 15 in that an opening overlapping with the conductor 247 is formed in the insulator 256, the insulator 258, the insulator 280, the insulator 282, the insulator 274, and the insulator 281 and the conductor 240b is provided to fill the opening. The conductor 240b is in contact with the top surface of the oxide 230b and the side surfaces of the oxide 230b and the oxide 230a in the channel width direction (in the A5-A6 direction).

Here, a bottom surface of the conductor 240b is in contact with the top surface of the conductor 247 in a portion that does not overlap with the oxide 230a and the oxide 230b. Therefore, the length of the conductor 240b and the conductor 247 in the channel width direction is preferably longer than the length of the oxide 230a and 230b in the channel width direction in the region 249b.

With this structure, a bottom surface of the region 249b in the oxide 230a and the oxide 230b is directly in contact with the conductor 247, and the top and side surfaces thereof are electrically connected to the conductor 247 through the conductor 240b. Accordingly, the conductivity between the region 249b and the conductor 247 can be further improved.

Furthermore, an opening that reaches the region 249a is formed in the insulator 256, the insulator 258, the insulator 280, the insulator 282, the insulator 274, and the insulator 281, and a conductor 240a is positioned so as to fill the opening. Here, the conductor 240a and the conductor 240b each have a structure similar to that of the conductor 240. Note that the top surface of the conductor 240a is connected to a wiring, an electrode, a terminal, or the like, whereas the top surface of the conductor 240b is not necessarily connected to a wiring, an electrode, a terminal, or the like.

A stacked-layer film may be used for each of the conductor 240a and the conductor 240b, in which case a conductive material with high adhesion is used for a lower layer. For example, a conductive film in which titanium nitride and tungsten are stacked in this order is used for each of the conductor 240a and the conductor 240b.

Unlike in the transistor 200 illustrated in FIG. 1, it is preferable that the insulator 241 in contact with side surfaces of the conductor 240a and the conductor 240b not be provided in the transistor 200 illustrated in FIG. 16. In that case, a favorable contact between the conductor 240b and the oxide 230a and oxide 230b can be obtained.

The structure of the transistor 200 illustrated in FIG. 16 is not limited to the above structure. For example, as illustrated in FIG. 17, the conductor 247 may be provided in the same layer as the conductor 205. That is, like the conductor 205, the conductor 247 is formed so as to be embedded in the insulator 216.

Figure 17A:
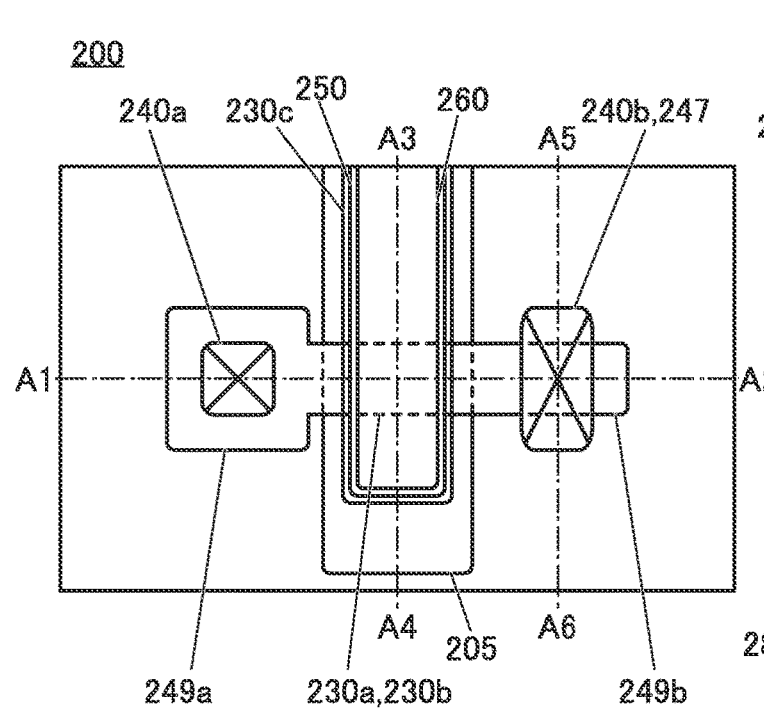
FIG. 17(A) to FIG. 17(D) are a top view and cross-sectional views of a semiconductor device of one embodiment of the present invention.
Figure 17C:
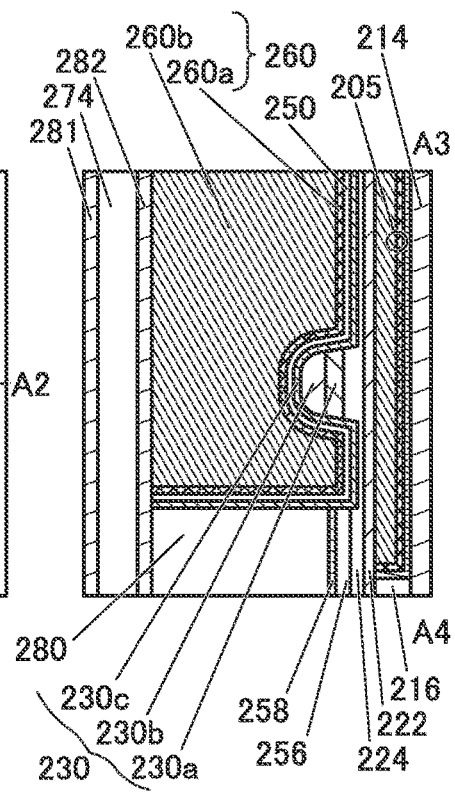
Figure 17B:
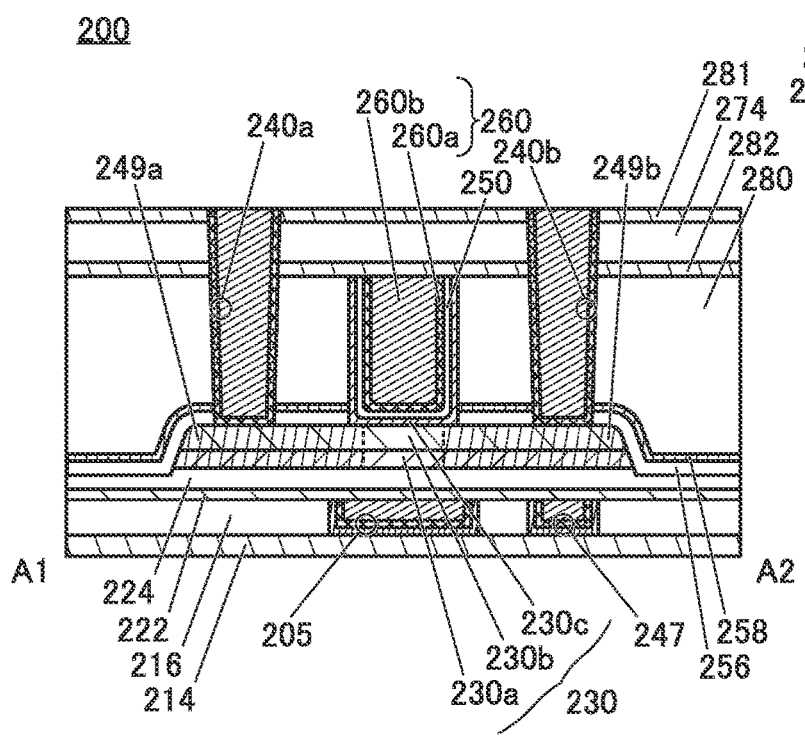
Figure 17D:
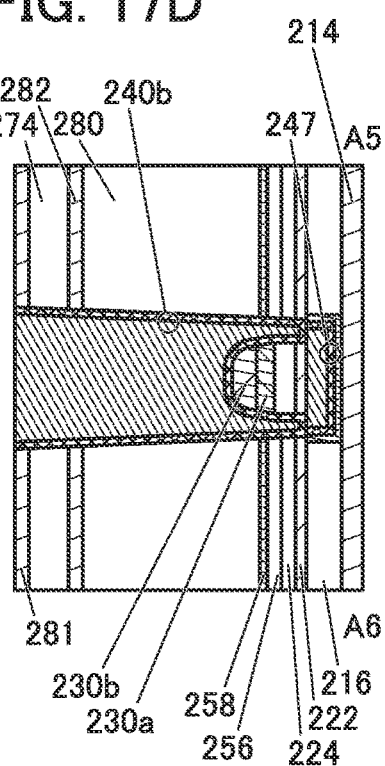

In that case, as illustrated in FIG. 17(D), the region 249 and the conductor 247 are not in direct contact with each other and electrically connected to each other through only the conductor 240b. Accordingly, in the transistor 200 illustrated in FIG. 17, it is preferable to sufficiently reduce the contact resistance between the conductor 240b and the conductor 247.

With such a structure, the conductor 247 can be formed in the same step as the conductor 205; therefore, the manufacturing process of the semiconductor device of this embodiment can be simplified and the productivity thereof can be improved.

Note that although the region 249 is formed also in the oxide 230a in the transistor 200 illustrated in FIG. 17, the present invention is not limited thereto. For example, as in the transistor 200 illustrated in FIG. 1, the region 249 may be formed only in the oxide 230b.

The structure, method, and the like described above in this embodiment can be used in an appropriate combination with the structures, methods, and the like described in the other embodiments and the examples.

Embodiment 2

In this embodiment, one embodiment of a semiconductor device is described with reference to FIG. 18 to FIG. 23.

[Memory Device 1]

Figure 18:
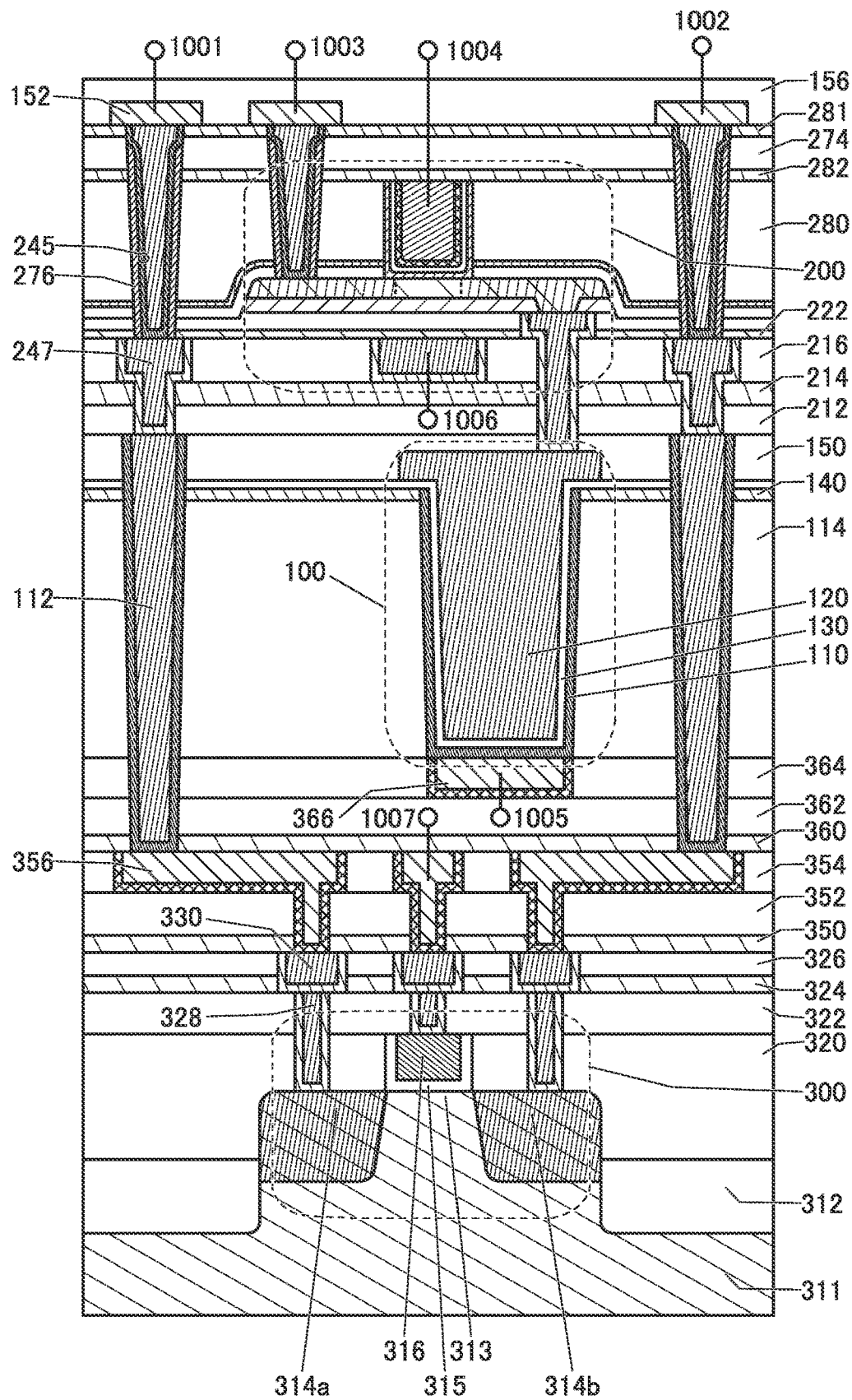
FIG. 18 is a cross-sectional view illustrating a structure of a memory device of one embodiment of the present invention.

FIG. 18 illustrates an example of a semiconductor device (memory device) in which the capacitor of one embodiment of the present invention is used. In the semiconductor device of one embodiment of the present invention, the transistor 200 is provided above the capacitor 100 and the transistor 300, and the capacitor 100 is provided above the transistor 300. Preferably, at least part of the capacitor 100 or the transistor 300 overlaps with the transistor 200. In such cases, the area occupied by the capacitor 100, the transistor 200, and the transistor 300 in the top view can be reduced, whereby the semiconductor device in this embodiment can be miniaturized or highly integrated. The semiconductor device in this embodiment can be applied to logic circuits typified by a central processing unit (CPU) and a graphics processing unit (GPU) and memory circuits typified by dynamic random access memory (DRAM) and nonvolatile memory (NVM), for example.

The transistor 200 can be the transistor 200 described in the above embodiment. Therefore, the description in the above embodiment can be referred to for the transistor 200 and a layer including the transistor 200. In the semiconductor device illustrated in FIG. 18, the transistor 200 has the same structure as the transistor 200 illustrated in FIG. 1, but the present invention is not limited to this. For example, the transistor 200 illustrated in FIG. 14 to FIG. 17 can be used in the semiconductor device illustrated in FIG. 18, and the same applies to the semiconductor device illustrated in FIG. 19 to FIG. 23.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of refresh operation, leading to a sufficient reduction in power consumption of the memory device. The transistor 200 exhibits favorable electrical characteristics at high temperatures, in comparison with a transistor including silicon in a semiconductor layer. For example, the transistor 200 has favorable electrical characteristics even in the temperature range of 125° C. to 150° C. Moreover, the transistor 200 has an on/off ratio of $10^{10}$ or larger in the temperature range of 125° C. to 150° C. In other words, in comparison with a transistor including silicon in a semiconductor layer, the transistor 200 excels in transistor characteristics (e.g., on-state current and frequency characteristics) at higher temperatures.

In the semiconductor device illustrated in FIG. 18, a wiring 1001 is electrically connected to a source of the transistor 300. A wiring 1002 is electrically connected to a drain of the transistor 300. A wiring 1007 is electrically connected to a gate of the transistor 300. A wiring 1003 is electrically connected to one of the source and the drain of the transistor 200. A wiring 1004 is electrically connected to the first gate of the transistor 200. A wiring 1006 is electrically connected to the second gate of the transistor 200. The other of the source and the drain of the transistor 200 is electrically connected to one electrode of the capacitor 100. A wiring 1005 is electrically connected to the other electrode of the capacitor 100.

The semiconductor device in FIG. 18 is capable of retaining charge stored in the one electrode of the capacitor 100 by switching of the transistor 200; thus, data writing, retention, and reading can be performed. The transistor 200 is an element having the source, the gate (front gate), the drain, and the back gate. That is, the transistor 200 is a four-terminal element; hence, its input and output can be controlled independently of each other in a simpler manner than that in two-terminal elements typified by magnetoresistive random access memory (MRAM) utilizing magnetic tunnel junction (MTJ) properties, resistive random access memory (ReRAM), and phase-change memory. In addition, the structure of MRAM, ReRAM, and phase-change memory may change at the atomic level when data is rewritten. In contrast, in the semiconductor device in FIG. 18, data rewriting is performed by charging or discharging of electrons with the transistor and the capacitor; thus, the semiconductor device features in high write endurance and a few structure changes.

A memory cell array can be formed by arranging the semiconductor devices in FIG. 18 in a matrix. In this case, the transistor 300 can be used for a read circuit, a driver circuit, or the like that is connected to the memory cell array. The semiconductor device illustrated in FIG. 18 forms the memory cell array as described above. When the semiconductor device in FIG. 18 is used as a memory element, for example, an operating frequency of 200 MHz or higher is achieved at a driving voltage of 2.5 V and an evaluation environment temperature ranging from −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is positioned over the semiconductor region 313, and the conductor 316 is positioned over the insulator 315. The transistors 300 formed in one layer are electrically isolated from each other by an insulator 312 functioning as an element isolation insulating layer. The insulator 312 can be formed using an insulator similar to that used for an insulator 326 described later, for example. The transistor 300 can be a p-channel transistor or an n-channel transistor.

The substrate 311 preferably contains a semiconductor such as a silicon-based semiconductor, particularly single crystal silicon, in and around a region where a channel is formed in the semiconductor region 313, in the low-resistance regions 314a and 314b functioning as the source and drain regions, and the like. Alternatively, the substrate 311 may be formed using a material including germanium (Ge), silicon germanium (SiGe), gallium arsenide (GaAs), gallium aluminum arsenide (GaAlAs), or the like. The substrate 311 may be formed using silicon whose effective mass is adjusted by applying stress to crystal lattices and thereby changing the lattice spacing. Alternatively, the transistor 300 may be a high-electron-mobility transistor (HEMT) with the use of GaAs and GaAlAs, for example.

The low-resistance regions 314a and 314b contain an element that imparts n-type conductivity (e.g., arsenic or phosphorus) or an element that imparts p-type conductivity (e.g., boron), in addition to a semiconductor material used for the semiconductor region 313.

The conductor 316 functioning as a gate electrode can be formed using a semiconductor material such as silicon containing an element that imparts n-type conductivity (e.g., arsenic or phosphorus) or an element that imparts p-type conductivity (e.g., boron), or a conductive material such as a metal material, an alloy material, or a metal oxide material.

Note that the work function depends on a material used for the conductor; therefore, changing the material for the conductor can adjust the threshold voltage of the transistor. Specifically, titanium nitride, tantalum nitride, or the like is preferably used for the conductor. Furthermore, in order to ensure the conductivity and embeddability of the conductor, stacked layers of metal materials such as tungsten and aluminum are preferably used for the conductor. In particular, tungsten is preferable in terms of heat resistance.

In the transistor 300 illustrated in FIG. 18, the semiconductor region 313 (part of the substrate 311) in which a channel is formed has a projecting portion. Moreover, the conductor 316 is provided to cover the side and top surfaces of the semiconductor region 313 with the insulator 315 positioned therebetween. The transistor 300 having such a structure is also referred to as a FIN transistor because the projecting portion of a semiconductor substrate is utilized. An insulator functioning as a mask for forming the projecting portion may be provided in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 18 is only an example and is not limited to having the structure shown therein; an appropriate transistor can be used in accordance with a circuit configuration or a driving method.

As illustrated in FIG. 18, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device in FIG. 18, a silicon-based semiconductor material and an oxide semiconductor can be used in different layers. The semiconductor device in FIG. 18 can be manufactured in a process similar to that employing an apparatus for manufacturing a semiconductor device containing a silicon-based semiconductor material, and can be highly integrated.

<Capacitor>

The capacitor 100 includes an insulator 114 over an insulator 364, an insulator 140 over the insulator 114, a conductor 110 in an opening formed in the insulators 114 and 140, an insulator 130 over the conductor 110 and the insulator 140, a conductor 120 over the insulator 130, and an insulator 150 over the conductor 120 and the insulator 130. Here, as illustrated in FIG. 18, at least part of the conductor 110, the insulator 130, and the conductor 120 is provided in the opening in the insulators 114 and 140.

The conductor 110 functions as a lower electrode of the capacitor 100, the conductor 120 functions as an upper electrode of the capacitor 100, and the insulator 130 functions as a dielectric of the capacitor 100. The upper electrode and the lower electrode of the capacitor 100 face each other with the dielectric positioned therebetween, along the side surface as well as the bottom surface of the opening in the insulators 114 and 140; thus, the capacitance per unit area can be increased. Accordingly, the deeper the opening is, the larger the capacitance of the capacitor 100 can be. Increasing the capacitance per unit area of the capacitor 100 in this manner enhances miniaturization and integration of the semiconductor device.

The insulator 114 and the insulator 150 are formed using an insulator that can be used as the insulator 280. The insulator 140 preferably functions as an etching stopper at the time of forming the opening in the insulator 114 and is formed using an insulator that can be used as the insulator 214.

The shape of the opening formed in the insulators 114 and 140 when seen from above may be a quadrangular shape, a polygonal shape other than a quadrangular shape, a polygonal shape with rounded corners, or a circular shape such as an elliptical shape. Here, the area where the opening and the transistor 200 overlap each other is preferably larger in the top view. Such a structure can reduce the area occupied by the semiconductor device including the capacitor 100 and the transistor 200.

The conductor 110 is provided in contact with the opening formed in the insulators 140 and 114. Preferably, the top surface of the conductor 110 is substantially aligned with the top surface of the insulator 140. A conductor 366 embedded in the opening of the insulator 364 is in contact with the bottom surface of the conductor 110. The conductor 110 is preferably formed by an ALD method, a CVD method, or the like and is formed using a conductor that can be used as the conductor 205, for example.

The insulator 130 is positioned to cover the conductor 110 and the insulator 140. The insulator 130 is preferably formed by an ALD method or a CVD method, for example. The insulator 130 can be formed to have a stacked-layer structure or a single-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in order can be used, for instance.

The insulator 130 is preferably formed using a material with high dielectric strength, such as silicon oxynitride, or a high dielectric constant (high-k) material. The insulator 130 may have a stacked-layer structure using a material with high dielectric strength and a high dielectric (high-k) material.

Examples of an insulator of a high dielectric constant (high-k) material include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material enables sufficient capacitance of the capacitor 100 to be ensured even if the insulator 130 has a large thickness. The insulator 130 having a large thickness can inhibit leakage current generated between the conductor 110 and the conductor 120.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which $SiN_x$ deposited by an ALD method, $SiN_x$ deposited by a PEALD method, and $SiN_x$ deposited by an ALD method are stacked in this order. The use of such an insulator having high dielectric strength can increase the dielectric strength of the capacitor 100 and inhibit electrostatic breakdown of the capacitor 100.

The conductor 120 is positioned to fill the opening formed in the insulator 140 and the insulator 114. The conductor 247 is in contact with the top surface of the conductor 120 through an opening in the insulator 150. The conductor 120 is preferably deposited by an ALD method, a CVD method, or the like and is formed using a conductor that can be used as the conductor 205, for example.

Since the transistor 200 contains an oxide semiconductor, the transistor 200 is highly compatible with the capacitor 100. Specifically, since the transistor 200 containing an oxide semiconductor has a low off-state current, a combination of the transistor 200 and the capacitor 100 enables stored data to be retained for a long time.

In the fabrication process of the capacitor 100, high-temperature heat treatment of higher than 700° C. is needed in some cases. When such a high-temperature heat treatment is performed after the formation of the transistor 200, the oxide 230 might be affected by the diffusion of oxygen or impurities such as hydrogen or water, which might degrade the electrical characteristics of the transistor 200.

However, when the transistor 200 is formed over the capacitor 100 as described in this modification example, the thermal budget in the fabrication process of the capacitor 100 does not affect the transistor 200. Thus, degradation in electrical characteristics of the transistor 200 can be prevented and a semiconductor device having stable electrical characteristics can be provided.

<Wiring Layer>

A wiring layer provided with an interlayer film, a wiring, a plug, and the like may be provided between the components. A plurality of wiring layers can be provided in accordance with the design. Here, a plurality of conductors having a function of plugs or wirings are collectively denoted by the same reference numeral in some cases. Furthermore, in this specification and the like, a wiring and a plug electrically connected to the wiring may be a single component. That is, part of a conductor functions as a wiring in some cases, and part of a conductor functions as a plug in other cases.

For example, over the transistor 300, an insulator 320, an insulator 322, an insulator 324, and an insulator 326 are stacked in this order as interlayer films. A conductor 328, a conductor 330, and the like that are electrically connected to a conductor 152 functioning as a terminal are embedded in the insulators 320, 322, 324, and 326. Note that the conductor 328 and the conductor 330 each function as a plug or a wiring.

The insulator functioning as an interlayer film may function as a planarization film that covers a roughness thereunder. For example, the top surface of the insulator 322 may be planarized by planarization treatment using a chemical mechanical polishing (CMP) method or the like to improve the planarity.

A wiring layer may be provided over the insulator 326 and the conductor 330. For example, an insulator 350, an insulator 352, and an insulator 354 are stacked in this order in FIG. 18. A conductor 356 is formed in the insulators 350, 352, and 354. The conductor 356 functions as a plug or a wiring.

An insulator 360 is positioned over the insulator 354, an insulator 362 is positioned over the insulator 360, an insulator 364 is positioned over the insulator 362, and an insulator 114 is positioned over the insulator 364.

An opening is formed in the insulator 364, and a conductor 366 is positioned in the opening. The conductor 366 is in contact with the bottom surface of the conductor 110. That is, the conductor 366 functions as a wiring that connects to the other electrode of the capacitor 100. For the conductor 366, an insulator that can be used for the conductor 356 and the like can be used.

The conductor 112, conductors included in the capacitor 100 (the conductor 120 and the conductor 110), and the like are embedded in the insulator 360, the insulator 362, the insulator 364, the insulator 114, the insulator 140, the insulator 130, and the insulator 150. Note that the conductor 112 has a function of a plug or a wiring that electrically connects the transistor 300 and the conductor 152 that functions as a terminal.

Similarly, the conductor 247, a conductor (conductor 205) included in the transistor 200, and the like are embedded in the insulator 212, the insulator 214, and the insulator 216. Note that the conductor 247 has a function of a plug or a wiring that is electrically connected to the capacitor 100, the transistor 200, or the transistor 300. For example, part of the conductor 247 is electrically connected to the conductor 120 functioning as the upper electrode of the capacitor 100. For example, another part of the conductor 247 has a function of a plug or a wiring that electrically connects the transistor 300 and the conductor 152 that functions as a terminal.

The conductor 152 is provided over the insulator 281 and the conductor 152 is covered with an insulator 156. Here, the conductor 152 is in contact with the top surface of a conductor 245 and functions as a terminal of the transistor 200 or a transistor 300.

Examples of an insulator that can be used for an interlayer film include an insulating oxide, an insulating nitride, an insulating oxynitride, an insulating nitride oxide, an insulating metal oxide, an insulating metal oxynitride, and an insulating metal nitride oxide. For example, when a material having a low dielectric constant is used for the insulator functioning as an interlayer film, the parasitic capacitance between wirings can be reduced. Accordingly, a material is preferably selected depending on the function of an insulator.

For example, the insulators 320, 322, 326, 352, 354, 362, 364, 114, 150, 212, 156, and the like preferably include an insulator with a low dielectric constant. These insulators preferably include, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Silicon oxide and silicon oxynitride have thermal stability; hence, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

It is preferred that the insulator provided over or under the conductor 152 have a resistivity of higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. The insulator provided over or under the conductor 152 preferably has a resistivity in the above range, in which case the insulator can disperse charge accumulated between the transistor 200, the transistor 300, the capacitor 100, and wirings such as the conductor 152 and prevent defective characteristics and electrostatic discharge of the transistor and the semiconductor device including the transistor due to the charge, while maintaining the insulating property. Silicon nitride or silicon nitride oxide can be used as such an insulator. For example, the resistivity of the insulator 281 is set within the above range.

When the transistor including an oxide semiconductor is surrounded by an insulator with a function of inhibiting the passage of oxygen and impurities such as hydrogen, the electrical characteristics of the transistor can be stable. Thus, the insulator with a function of inhibiting the passage of oxygen and impurities such as hydrogen is preferably used for the insulator 324, the insulator 350, the insulator 360, and the like.

The insulator having a function of inhibiting the passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used for wirings or plugs can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electric conductivity, typified by polycrystalline silicon containing an impurity element such as phosphorus, or silicide such as nickel silicide may be used.

For example, the conductors 328, 330, 356, 112, 247, 152, and the like can have a single-layer structure or a stacked-layer structure using a conductive material such as a metal material, an alloy material, a metal nitride material, or a metal oxide material each of which contains any of the above materials. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

<Wiring or Plug in Layer Including Oxide Semiconductor>

When an oxide semiconductor is used in the transistor 200, an insulator including an excess-oxygen region is sometimes provided around the oxide semiconductor. In that case, an insulator having a barrier property is preferably provided between the insulator including the excess-oxygen region and a conductor provided in the insulator including the excess-oxygen region.

For example, an insulator 276 is preferably provided between the insulator 280 including excess oxygen and the conductor 245 in FIG. 18. Here, the conductor 245 corresponds to the conductor 240 described in the above embodiment and the insulator 276 corresponds to the insulator 241 described in the above embodiment. Since the insulator 276 is provided in contact with the insulator 272, the conductor 245 and the transistor 200 can be sealed by the insulators having a barrier property.

That is, the insulator 276 can prevent excess oxygen contained in the insulator 280 from being absorbed by the conductor 245. In addition, the insulator 276 can inhibit diffusion of hydrogen, which is an impurity, into the transistor 200 through the conductor 245.

Here, the conductor 245 functions as a plug or a wiring electrically connected to the transistor 200 or the transistor 300.

The above is the description of the structure example. With the use of this structure, the semiconductor device using the transistor including an oxide semiconductor can be miniaturized or highly integrated. In the semiconductor device using the transistor including an oxide semiconductor, a change in electrical characteristics can be inhibited and the reliability can be improved. In addition, a transistor that includes an oxide semiconductor and has a high on-state current can be provided. A transistor that includes an oxide semiconductor and has a low off-state current can be provided. A semiconductor device with low power consumption can be provided.

Figure 19:
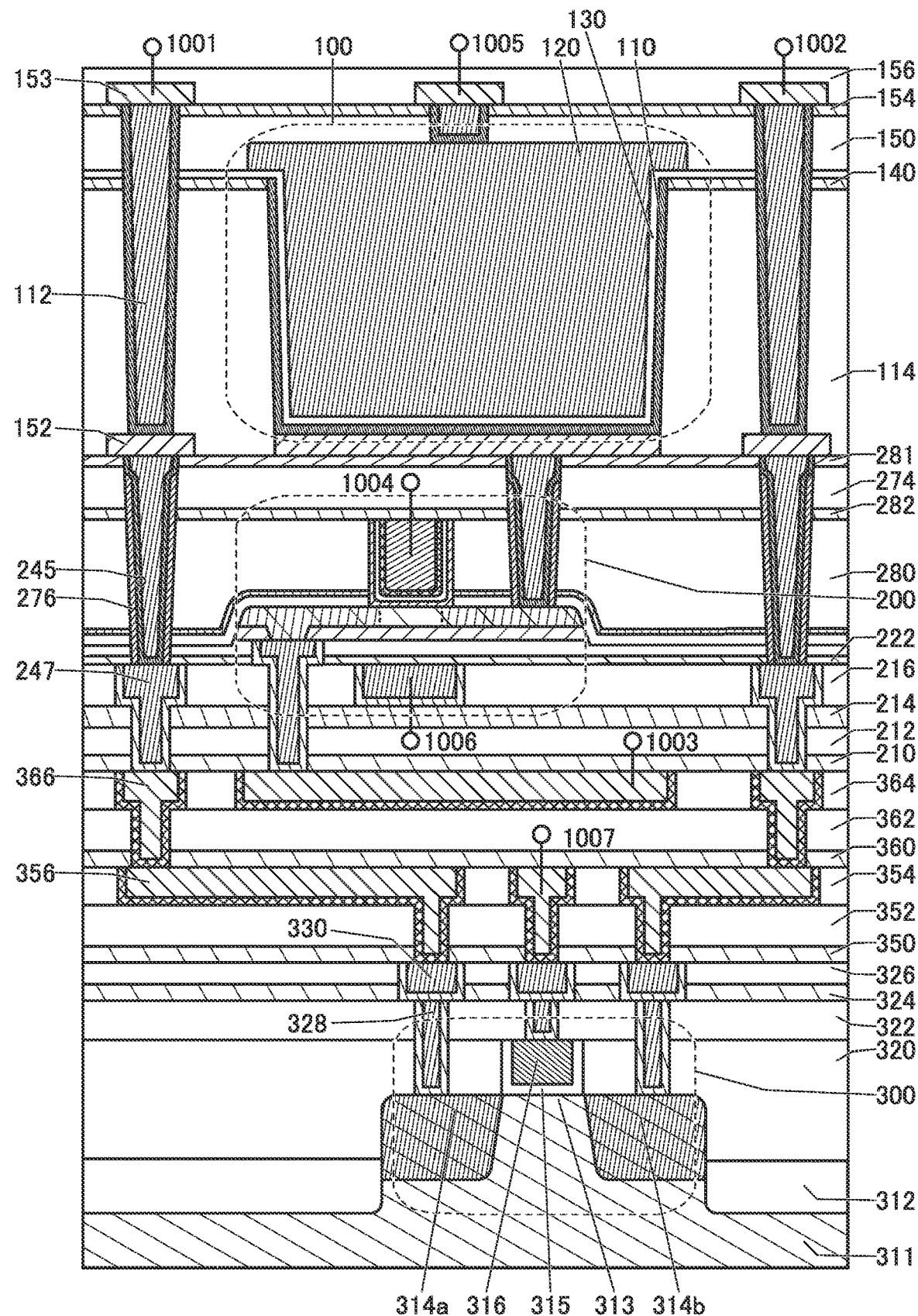
FIG. 19 is a cross-sectional view illustrating a structure of a memory device of one embodiment of the present invention.

In FIG. 18, an example is shown in which a conductor electrically connected to the wiring 1003 is in contact with at least part of a top surface of the conductor functioning as one of the source and the drain of the transistor 200; however, the semiconductor device shown in this embodiment is not limited thereto. For example, as illustrated in FIG. 19, a conductor functioning as a wiring may be provided under the transistor 200, and one of the source and the drain of the transistor 200 may be in contact with at least part of a top surface of the conductor electrically connected to the wiring 1003 through the conductor 247 formed in an opening formed in the insulator 224, the insulator 222, the insulator 216, the insulator 214, the insulator 212, and the insulator 210.

Here, the insulator 360 is positioned over the insulator 354, the insulator 362 is positioned over the insulator 360, the insulator 364 is positioned over the insulator 362, and the insulator 210 is positioned over the insulator 364. An insulator that can be used as the insulator 350 and the like can be used as the insulator 360. For the insulator 362 and the insulator 364, an insulator that can be used as the insulator 352 or the like can be used.

An opening is formed in the insulator 364, and a conductor 366 is positioned in the opening. The conductor 366 functions as a plug or a wiring. In FIG. 19, the conductor 366 is electrically connected to one of the source and the drain of the transistor 200. In that case, the conductor 366 also functions as a wiring connected to one of the source and the drain of the transistor 200. For the conductor 366, a conductor that can be used as the conductor 356 and the like may be used.

With the above structure, the capacitor 100 can have a large area overlapping with the transistor 200 in the top view of the capacitor 100 and the transistor 200, and thus, the capacitance can be larger.

Note that FIG. 18 illustrates an example in which the capacitor 100 is provided below the transistor 200, but the semiconductor device shown in this embodiment is not limited thereto. For example, a structure illustrated in FIG. 20 may be employed in which a capacitor 100a is provided above a transistor 200a and a capacitor 100b is provided below a transistor 200b in adjacent memory cells. The semiconductor device illustrated in FIG. 20 has the same structure as the semiconductor device illustrated in FIG. 18 except that the capacitor 100a is provided over the transistor 200.

Figure 20:
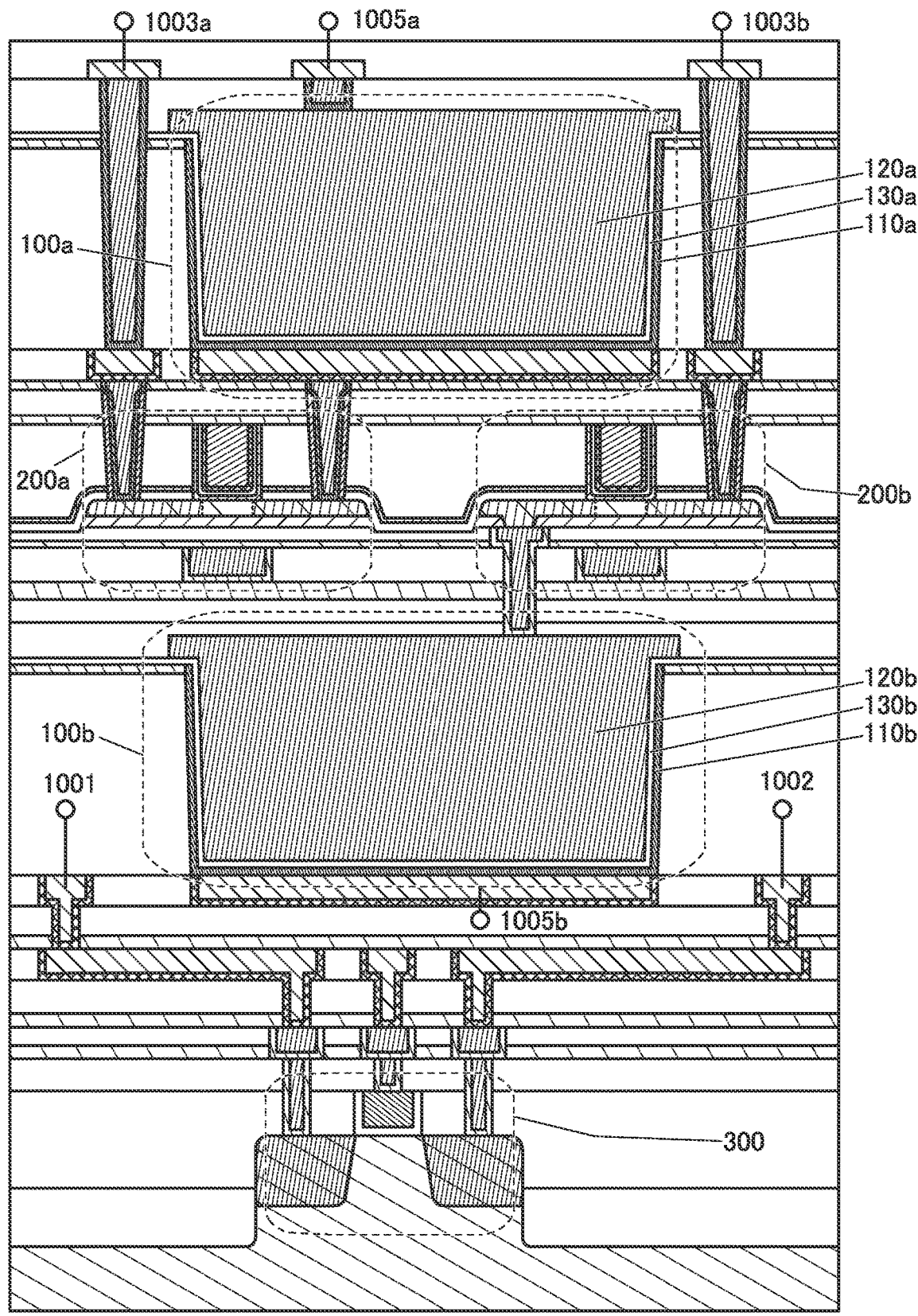
FIG. 20 is a cross-sectional view illustrating a structure of a memory device of one embodiment of the present invention.

In the memory device illustrated in FIG. 20, the wiring 1001 is electrically connected to the source of the transistor 300, and the wiring 1002 is electrically connected to the drain of the transistor 300. A wiring 1003a is electrically connected to one of a source and a drain of the transistor 200a. The other of the source and the drain of the transistor 200a is electrically connected to one of the electrodes of the capacitor 100a, and a wiring 1005a is electrically connected to the other electrode of the capacitor 100a. A wiring 1003b is electrically connected to one of the source and the drain of the transistor 200b. The other of the source and the drain of the transistor 200b is electrically connected to one of the electrodes of the capacitor 100b, and a wiring 1005b is electrically connected to the other electrode of the capacitor 100b.

FIG. 20 illustrates the transistor 200a, the capacitor 100a, the transistor 200b, and the capacitor 100b included in memory cells adjacent to each other. The transistor 200a and the transistor 200b each have a structure similar to that of the transistor 200. Note that the conductor 247 is not positioned below the transistor 200a because the transistor 200a is connected to the capacitor 100a positioned over the transistor 200a.

The capacitor 100a and the capacitor 100b have the same structure as the capacitor 100. In other words, the capacitor 100a includes a conductor 110a, an insulator 130a, and a conductor 120a, and the capacitor 100b includes a conductor 110b, an insulator 130b, and a conductor 120b. The conductor 110a and the conductor 110b have the same structure as the conductor 110. The insulator 130a and the insulator 130b have the same structure as the insulator 130. The conductor 120a and the conductor 120b have the same structure as the conductor 120.

Here, the capacitor 100a preferably overlaps with the transistor 200a and the transistor 200b, for example, and the capacitor 100a preferably overlaps with the channel formation region of the transistor 200a and the channel formation region of the transistor 200b. Furthermore, the capacitor 100b preferably overlaps with the transistor 200a and the transistor 200b, and, for example, the capacitor 100b preferably overlaps with the channel formation region of the transistor 200a and the channel formation region of the transistor 200b.

By providing the capacitor 100a and the capacitor 100b in this manner, the capacitance of the capacitor 100a and the capacitor 100b can be increased without increasing the area occupied by the capacitor 100a, the capacitor 100b, the transistor 200a, and the transistor 200b in a top view. As a result, the semiconductor device of this embodiment can be miniaturized or highly integrated.

Figure 21:
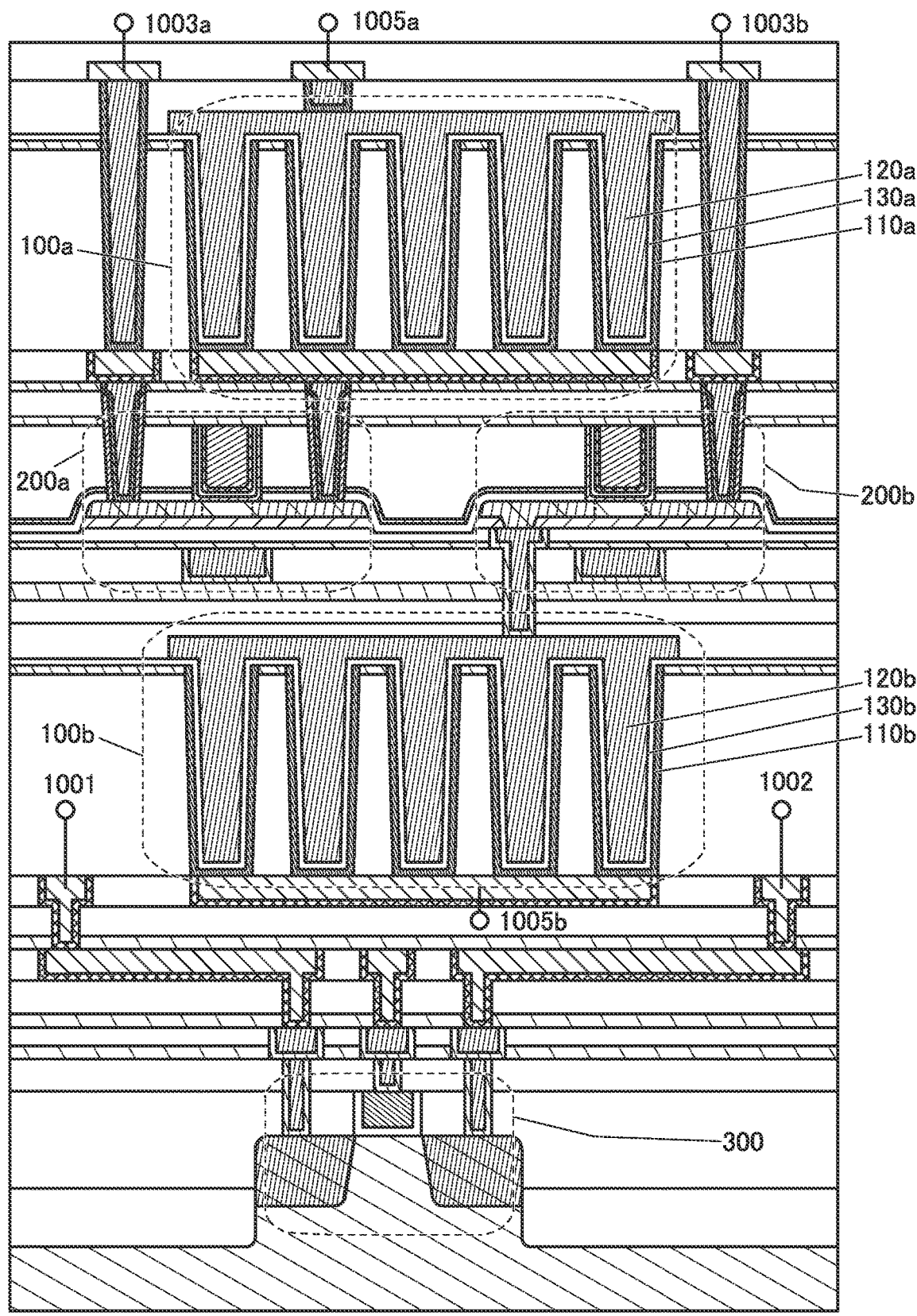
FIG. 21 is a cross-sectional view illustrating a structure of a memory device of one embodiment of the present invention.

As illustrated in FIG. 21, a plurality of openings in which the capacitor 100a and capacitor 100b are provided may be provided. The conductor 110a may be separately provided by each opening. Similarly, the conductor 110b may be separated to be provided by each opening. Thus, the capacitor 100a and the capacitor 100b can be formed on the side surface of each opening. Accordingly, the capacitor 100a and the capacitor 100b illustrated in FIG. 21 can have larger capacitance than the capacitor 100a and the capacitor 100b in FIG. 20 while the area occupied can be approximately the same.

[Memory Device 2]

Figure 22:
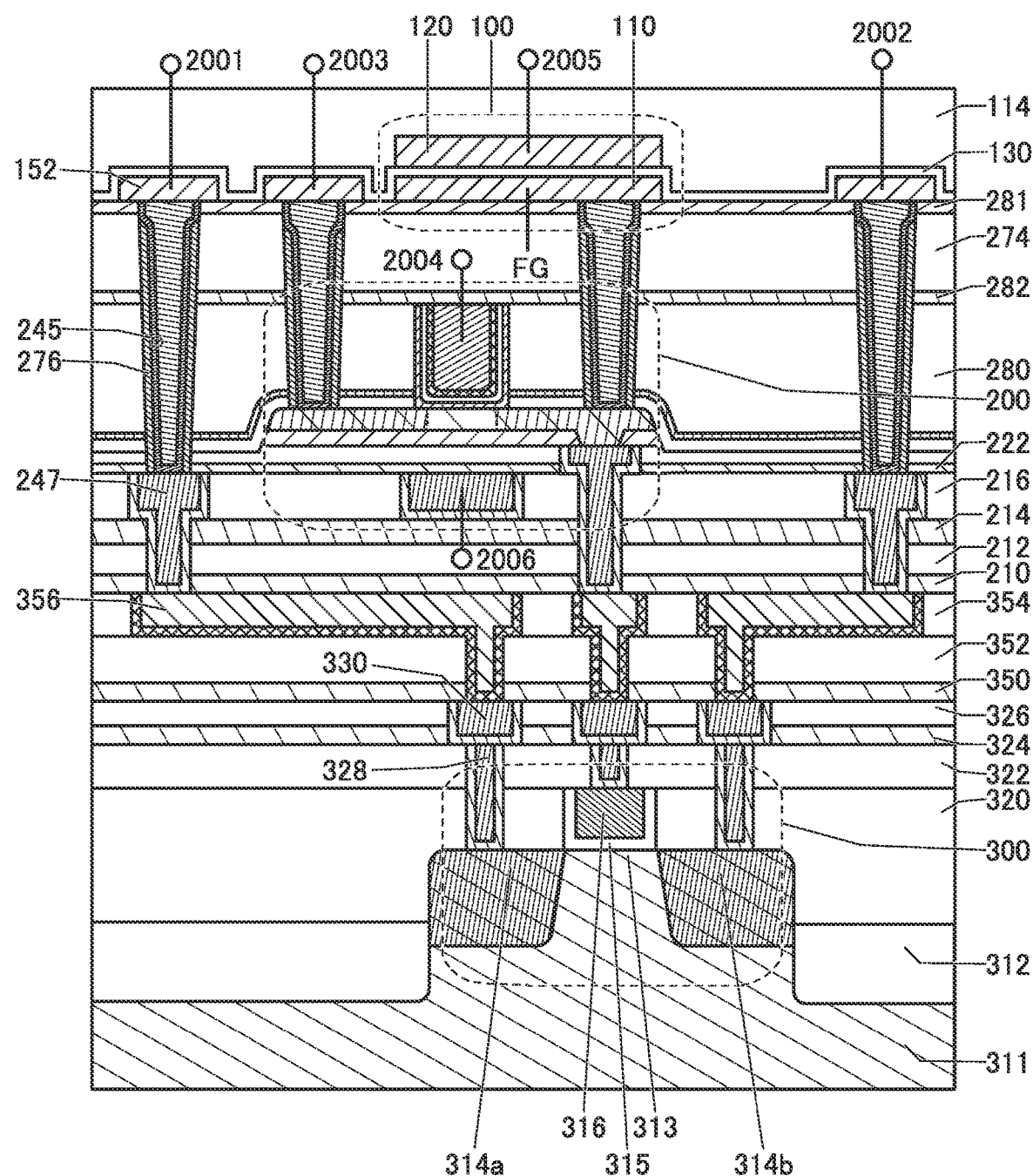
FIG. 22 is a cross-sectional view illustrating a structure of a memory device of one embodiment of the present invention.

FIG. 22 illustrates another example of a semiconductor device (a memory device) using the semiconductor device of one embodiment of the present invention. Like the semiconductor device illustrated in FIG. 18, the semiconductor device illustrated in FIG. 22 includes the transistor 200, the transistor 300, and the capacitor 100. Note that the semiconductor device illustrated in FIG. 22 differs from the semiconductor device illustrated in FIG. 18 in that the capacitor 100 is positioned over the transistor 200, that the capacitor 100 is a planar capacitor, and that the transistor 200 is electrically connected to the transistor 300 through the conductor 247.

In the semiconductor device of one embodiment of the present invention, the transistor 200 is provided above the transistor 300, and the capacitor 100 is provided above the transistor 300 and the transistor 200. Preferably, at least part of the capacitor 100 or the transistor 300 overlaps with the transistor 200. In such cases, the area occupied by the capacitor 100, the transistor 200, and the transistor 300 in the top view can be reduced, whereby the semiconductor device in this embodiment can be miniaturized or highly integrated.

Note that the transistor 200 and the transistor 300 can be the above-described transistor 200 and transistor 300. Therefore, the above description can be referred to for the transistors 200 and 300 and the layers including these transistors.

In the semiconductor device illustrated in FIG. 22, a wiring 2001 is electrically connected to the source of the transistor 300, and a wiring 2002 is electrically connected to the drain of the transistor 300. A wiring 2003 is electrically connected to one of the source and the drain of the transistor 200. A wiring 2004 is electrically connected to the first gate of the transistor 200. A wiring 2006 is electrically connected to the second gate of the transistor 200. The gate of the transistor 300 and the other of the source and the drain of the transistor 200 are electrically connected to one electrode of the capacitor 100. A wiring 2005 is electrically connected to the other electrode of the capacitor 100. Note that a node where the gate of the transistor 300, the other of the source and the drain of the transistor 200, and the one electrode of the capacitor 100 are connected to each other is hereinafter referred to as a node FG in some cases.

The semiconductor device in FIG. 22 is capable of retaining the potential of the gate of the transistor 300 (the node FG) by switching of the transistor 200; thus, data writing, retention, and reading can be performed.

By arranging the semiconductor devices in FIG. 22 in a matrix, a memory cell array can be formed.

The layer including the transistor 300 has the same structure as that in the semiconductor device in FIG. 18, and therefore the above description can be referred to for the structure below the insulator 354.

The insulator 210, the insulator 212, the insulator 214, and the insulator 216 are provided over the insulator 354. Here, like the insulator 350 and the like, the insulator 210 is preferably an insulator having a function of inhibiting the passage of oxygen and impurities such as hydrogen.

The conductor 247 is embedded in the insulators 210, 212, 214, and 216. The conductor 247 has a function of a plug or a wiring that is electrically connected to the capacitor 100, the transistor 200, or the transistor 300. For example, the conductor 247 is electrically connected to the conductor 316 functioning as the gate electrode of the transistor 300.

The conductor 245 has a function of a plug or a wiring that is electrically connected to the transistor 200 or the transistor 300. For example, the conductor 245 electrically connects the region 249b functioning as the other of the source and the drain of the transistor 200 and the conductor 110 functioning as the one electrode of the capacitor 100.

The planar capacitor 100 is provided above the transistor 200. The capacitor 100 includes the conductor 110 functioning as a first electrode, the conductor 120 functioning as a second electrode, and the insulator 130 functioning as a dielectric. Note that the conductor 110, the conductor 120, and the insulator 130 can be those described above in Memory device 1.

The conductor 152 and the conductor 110 are provided in contact with the top surface of the conductor 245. The conductor 152 is in contact with the top surface of the conductor 245 and functions as a terminal of the transistor 200 or the transistor 300.

The conductor 152 and the conductor 110 are covered with the insulator 130, and the conductor 120 is provided to overlap the conductor 110 with the insulator 130 placed therebetween. In addition, the insulator 114 is provided over the conductor 120 and the insulator 130.

Figure 23:
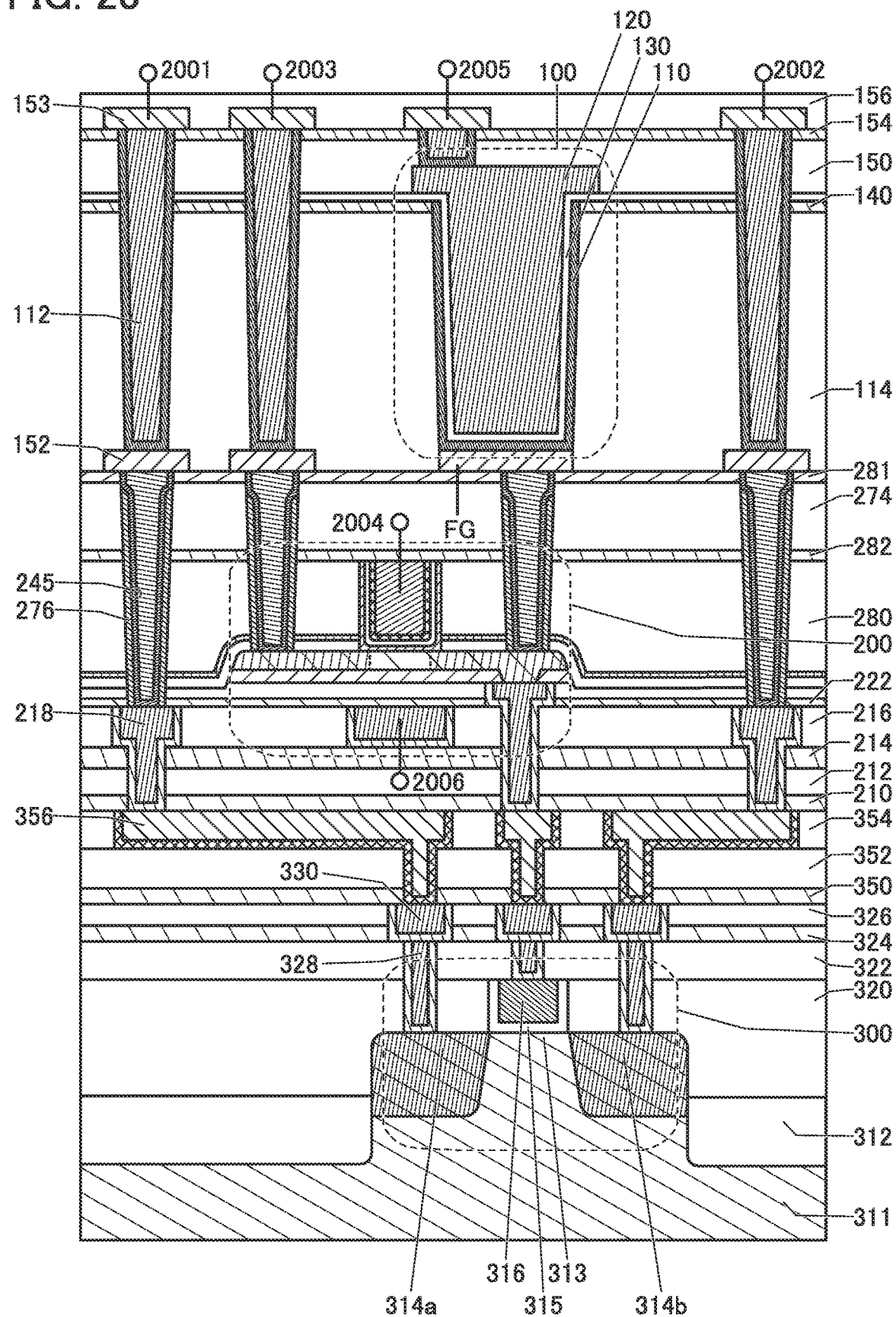
FIG. 23 is a cross-sectional view illustrating a structure of a memory device of one embodiment of the present invention.

Although FIG. 22 illustrates an example where a planar capacitor is used as the capacitor 100, the semiconductor device of this embodiment is not limited thereto. For example, as illustrated in FIG. 23, the capacitor 100 illustrated in FIG. 18 may be used as the transistor.

Here, the description of FIG. 18 can be referred to for the details of the capacitor 100. A structure illustrated in FIG. 23 is preferable in which the conductor 152 is provided over the conductor 245 and the conductor 112 is provided over the conductor 152. Such a structure can make electrical connection between the conductor 245 and the conductor 112 more certain.

An insulator 154 is preferably provided over the insulator 150. As the insulator 154, an insulator that can be used as the insulator 281 can be used. A conductor 153 is provided in contact with a top surface of the conductor 112. The conductor 153 is in contact with the top surface of the conductor 112 and functions as a terminal of the capacitor 100, the transistor 200, or the transistor 300. In addition, the insulator 156 is provided over the conductor 153 and the insulator 154.

This embodiment can be implemented in an appropriate combination with the structures described in the other embodiments, the examples, and the like.

Embodiment 3

In this embodiment, a memory device of one embodiment of the present invention including a transistor in which an oxide is used for a semiconductor (hereinafter, referred to as an OS transistor in some cases) and a capacitor (hereinafter, such a memory device is referred to as an OS memory device in some cases) will be described with reference to FIG. 24 and FIG. 25. The OS memory device is a memory device including at least a capacitor and an OS transistor that controls charge and discharge of the capacitor. Since the off-state current of the OS transistor is extremely low, the OS memory device has excellent retention characteristics and can function as a nonvolatile memory.

<Structure Example of Memory Device>

Figure 24A:
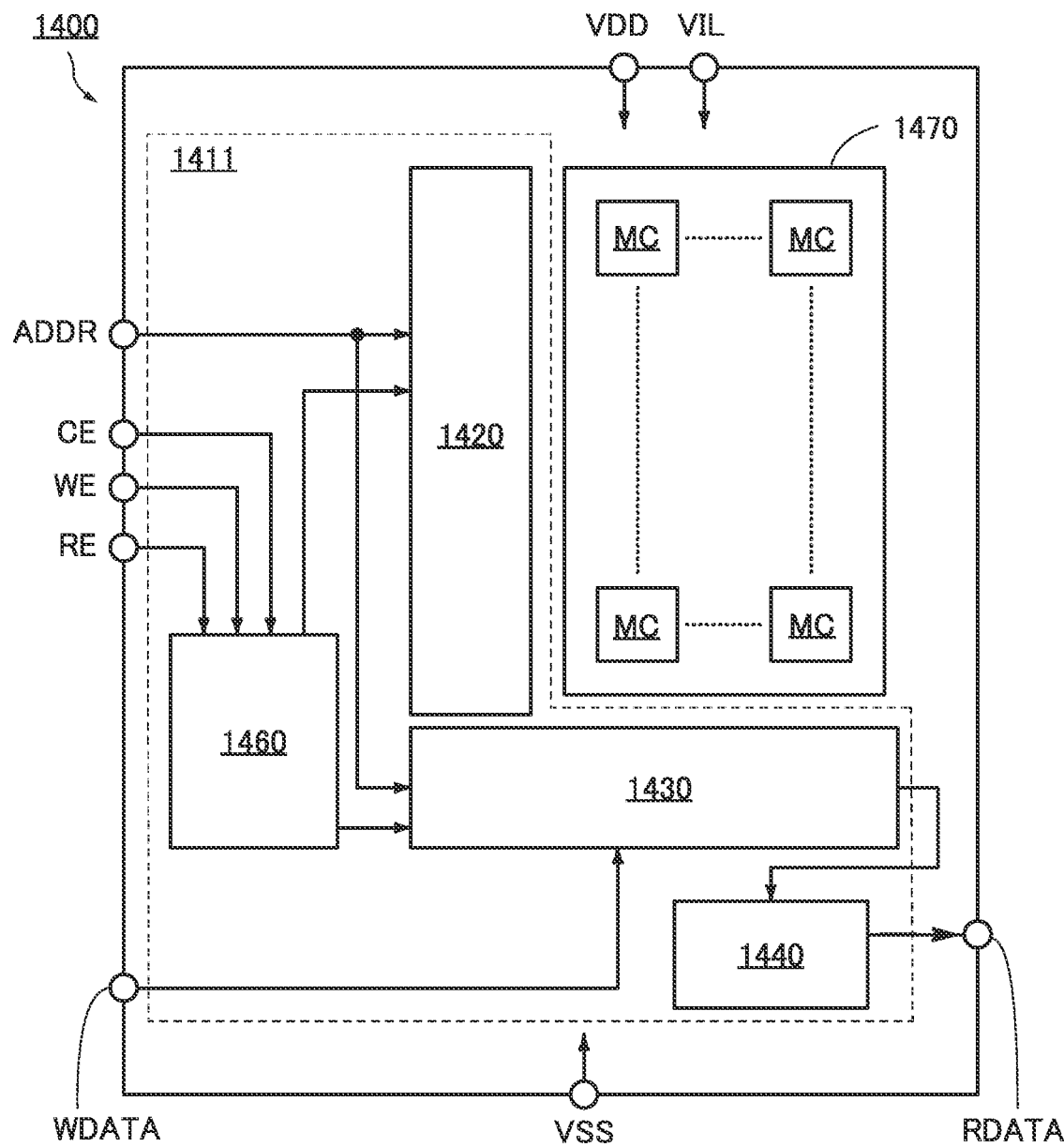
FIG. 24(A) and FIG. 24(B) are a block diagram and a perspective view illustrating a structure example of a memory device of one embodiment of the present invention.

FIG. 24(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. Note that the wirings are wirings connected to memory cells included in the memory cell array 1470, which will be described in detail later. An amplified data signal is output to the outside of the memory device 1400 as a data signal RDATA through the output circuit 1440. The row circuit 1420 includes a row decoder and a word line driver circuit, for example, and can select a row to be accessed.

As power supply voltages, a low power supply voltage (VSS), a high power supply voltage (VDD) for the peripheral circuit 1411, and a high power supply voltage (VIL) for the memory cell array 1470 are supplied to the memory device 1400 from the outside. In addition, control signals (CE, WE, and RE), an address signal ADDR, and a data signal WDATA are input to the memory device 1400 from the outside. The address signal ADDR is input to the row decoder and the column decoder, and WDATA is input to the write circuit.

The control logic circuit 1460 processes the input signals (CE, WE, and RE) from the outside, and generates control signals for the row decoder and the column decoder. CE is a chip enable signal, WE is a write enable signal, and RE is a read-out enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 and the row circuit 1420 depends on the structure of the memory cell MC, the number of memory cells MC included in one column, and the like. Furthermore, the number of wirings that connect the memory cell array 1470 and the column circuit 1430 depends on the structure of the memory cell MC, the number of memory cells MC included in one row, and the like.

Figure 24B:
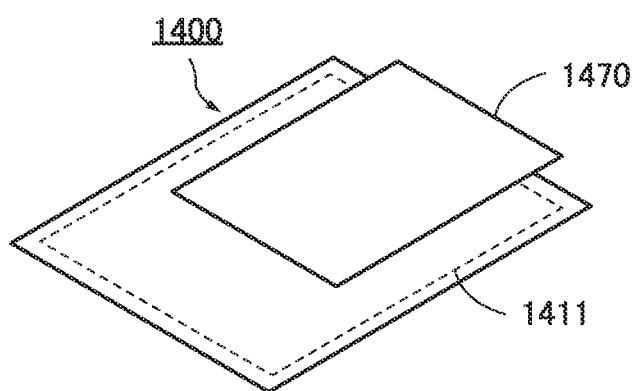

Note that FIG. 24(A) illustrates an example in which the peripheral circuit 1411 and the memory cell array 1470 are formed on the same plane; however, this embodiment is not limited thereto. For example, as illustrated in FIG. 24(B), the memory cell array 1470 may be provided over the peripheral circuit 1411 to partly overlap with the peripheral circuit 1411. For example, a structure may be employed in which the sense amplifier is provided below the memory cell array 1470 to overlap with the memory cell array 1470.

FIG. 25 illustrates structure examples of memory cells applicable to the memory cell MC.

[DOSRAM]

Figure 25A:
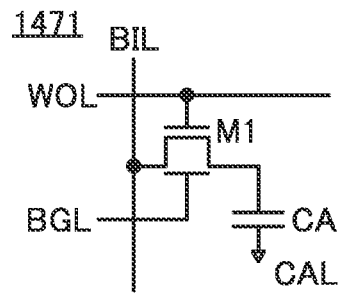
FIG. 25(A) to 25(H) are circuit diagrams illustrating structure examples of a memory device of one embodiment of the present invention.
Figure 25B:
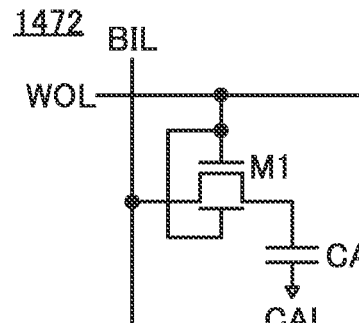
Figure 25C:
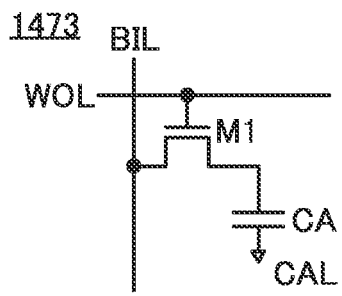

FIG. 25(A) to FIG. 25(C) illustrate circuit structure examples of a memory cell of a DRAM. In this specification and the like, a DRAM (Dynamic Oxide Semiconductor Random Access Memory) using a memory cell including one OS transistor and one capacitor is sometimes referred to as a DOSRAM. A memory cell 1471 illustrated in FIG. 25(A) includes a transistor M1 and a capacitor CA. Note that the transistor M1 includes a gate (sometimes referred to as a front gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

Here, the memory cell 1471 illustrated in FIG. 25(A) corresponds to the memory device illustrated in FIG. 18. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 illustrated in FIG. 18 corresponds to a transistor provided in the peripheral circuit 1411 of the memory device 1400 illustrated in FIG. 24(B).

The memory cell MC is not limited to the memory cell 1471, and its circuit structure can be changed. For example, in the memory cell MC, the back gate of the transistor M1 may be connected to the wiring WOL instead of the wiring BGL as in a memory cell 1472 illustrated in FIG. 25(B). As another example, the memory cell MC may be configured with a single-gate transistor, that is, the transistor M1 that does not have a back gate, like a memory cell 1473 illustrated in FIG. 25(C).

In the case where the semiconductor device described in the above embodiment is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, written data can be retained for a long time with the use of the transistor M1; thus, the frequency of refresh of the memory cell can be reduced. Furthermore, the refresh operation of the memory cell can be omitted. In addition, the extremely low leakage current allows multi-level data or analog data to be retained in the memory cell 1471, the memory cell 1472, and the memory cell 1473.

In the DOSRAM, providing the sense amplifier below the memory cell array 1470 so that they overlap with each other as described above can shorten the bit line. This reduces the bit line capacitance, which reduces the storage capacitance of the memory cell.

[NOSRAM]

FIG. 25(D) to FIG. 25(H) each illustrate a circuit structure example of a gain-cell memory cell including two transistors and one capacitor. A memory cell 1474 illustrated in FIG. 25(D) includes a transistor M2, a transistor M3, and a capacitor CB. Note that the transistor M2 includes a front gate (sometimes simply referred to as a gate) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing, data retention, and data reading, a low-level potential is preferably applied to the wiring CAL. The wiring BGL functions as a wiring for applying a potential to the back gate of the transistor M2. Applying a given potential to the wiring BGL can increase or decrease the threshold voltage of the transistor M2.

Figure 25D:
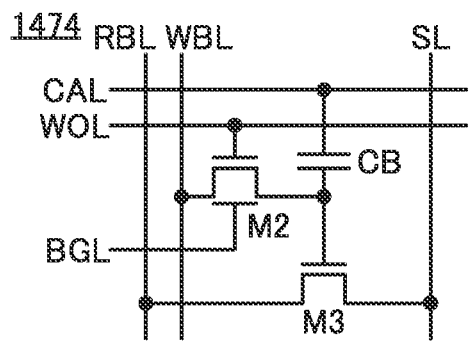
Figure 25E:
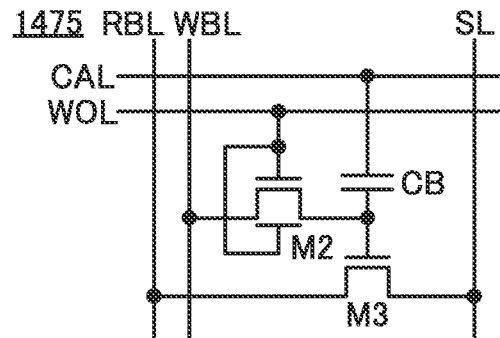
Figure 25F:
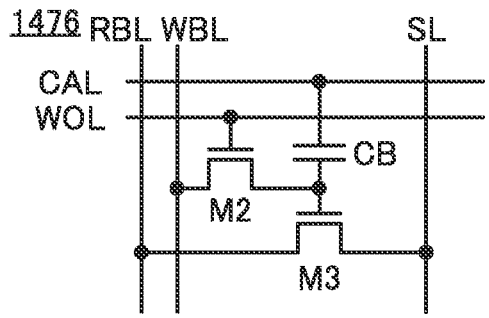
Figure 25G:
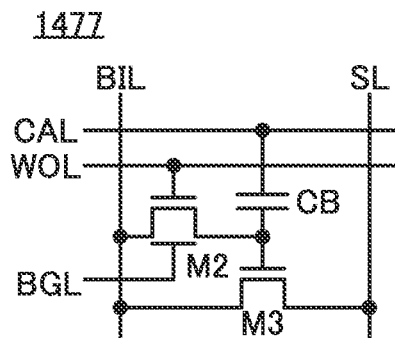

Here, the memory cell 1474 illustrated in FIG. 25(D) corresponds to the memory device illustrated in FIG. 22. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 2003, the wiring 2004, the wiring 2006, the wiring 2005, the wiring 2002, and the wiring 2001, respectively.

The memory cell MC is not limited to the memory cell 1474, and its circuit structure can be changed as appropriate. For example, in the memory cell MC, the back gate of the transistor M2 may be connected to the wiring WOL instead of the wiring BGL as in a memory cell 1475 illustrated in FIG. 25(E). As another example, the memory cell MC may be configured with a single-gate transistor, that is, the transistor M2 that does not have a back gate, like a memory cell 1476 illustrated in FIG. 25(F). As another example, the memory cell MC may have a structure in which the wiring WBL and the wiring RBL are combined into one wiring BIL as in a memory cell 1477 illustrated in FIG. 25(G).

In the case where the semiconductor device described in the above embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the use of the transistor M2; thus, the frequency of refresh of the memory cell can be reduced. Alternatively, the refresh operation of the memory cell can be omitted. Furthermore, since the leakage current is extremely low, multi-level data or analog data can be retained in the memory cell 1474. The same applies to the memory cells 1475 to 1477.

Note that the transistor M3 may be a transistor containing silicon in a channel formation region (hereinafter, such a transistor is referred to as a Si transistor in some cases). The conductivity type of the Si transistor may be an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistors M2 and M3, the circuit of the memory cell array 1470 can be configured using only n-channel transistors.

Figure 25H:
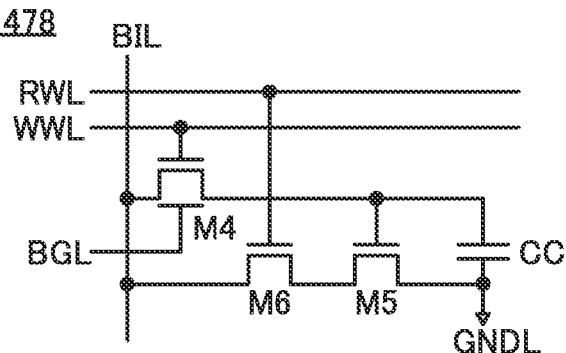

FIG. 25(H) illustrates an example of a gain-cell memory cell including three transistors and one capacitor. A memory cell 1478 illustrated in FIG. 25(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors. In that case, the circuit of the memory cell array 1470 can be configured using only n-channel transistors.

In the case where the semiconductor device described in the above embodiment is used in the memory cell 1478, the transistor 200 can be used as the transistor M4, the transistors 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to those described above. The arrangements and functions of these circuits and the wirings, circuit components, and the like connected to these circuits can be changed, removed, or added as needed.

The structure described in this embodiment can be used in an appropriate combination with the structures described in the other embodiments, the examples, and the like.

Embodiment 4

In this embodiment, an example of a chip 1200 on which the semiconductor device of the present invention is mounted will be described with reference to FIG. 26. A plurality of circuits (systems) are mounted on the chip 1200. The technique for integrating a plurality of circuits (systems) on one chip is referred to as system on chip (SoC) in some cases.

Figure 26A:
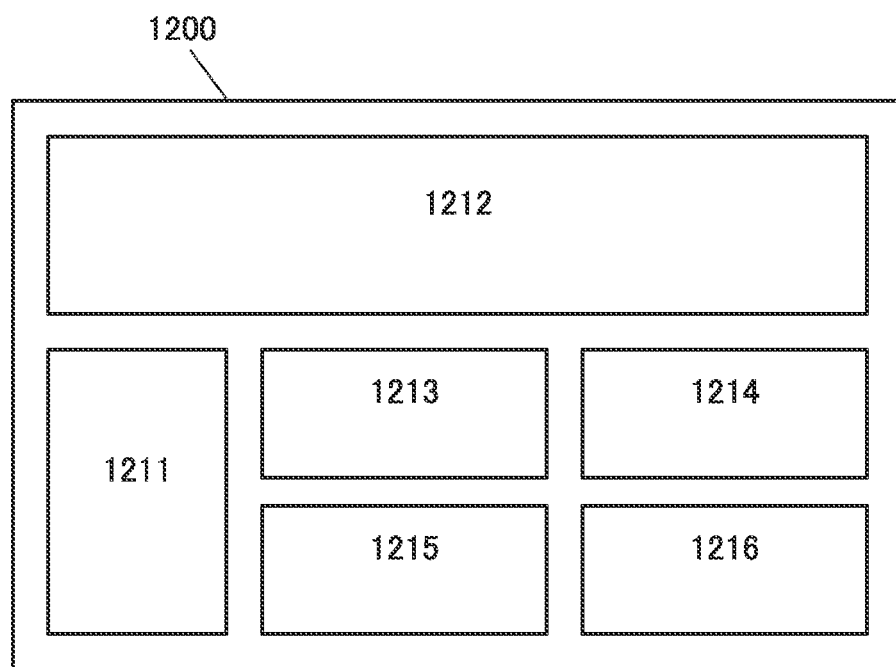
FIG. 26(A) and FIG. 26(B) are a schematic view and a perspective view of a semiconductor device of one embodiment of the present invention.

As illustrated in FIG. 26(A), the chip 1200 includes a CPU 1211, a GPU (Graphics Processing Unit) 1212, one or more analog arithmetic units 1213, one or more memory controllers 1214, one or more interfaces 1215, one or more network circuits 1216, and the like.

Figure 26B:
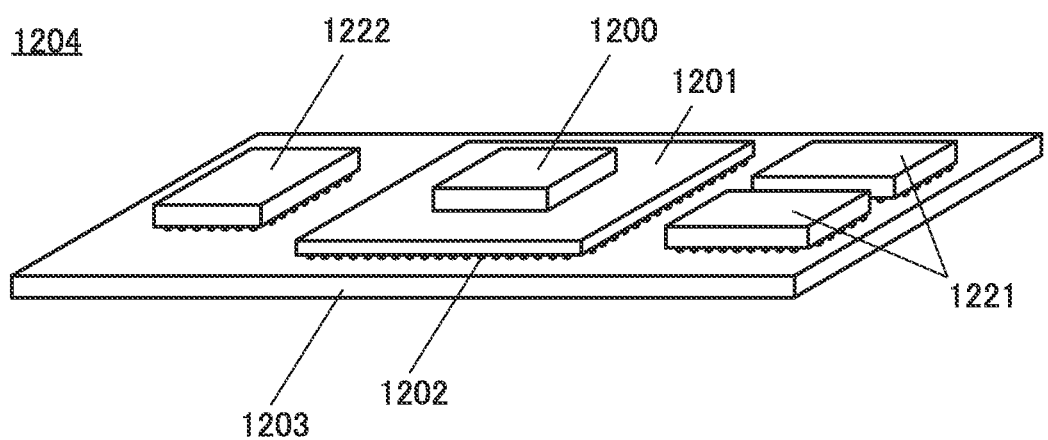

A bump (not illustrated) is provided on the chip 1200, and as illustrated in FIG. 26(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can implement an arithmetic operation such as a deep neural network (DNN), a convolutional neural network (CNN), a recurrent neural network (RNN), an autoencoder, a deep Boltzmann machine (DBM), or a deep belief network (DBN); thus, the chip 1200 can be used as an AI chip or the GPU module 1204 can be used as an AI system module.

The structure described in this embodiment can be used in an appropriate combination with the structures described in the other embodiments.

Embodiment 5

In this embodiment, application examples of the memory device using the semiconductor device described in the above embodiment will be described. The semiconductor device described in the above embodiment can be used for, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is used for removable memory devices such as memory cards (e.g., SD cards), USB memories, and SSDs (solid state drives). FIG. 27 schematically illustrates some structure examples of removable memory devices. The semiconductor device described in the above embodiment is processed into a packaged memory chip and used in a variety of storage devices and removable memories, for example.

Figure 27A:
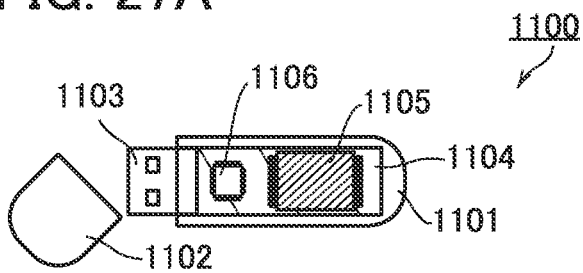
FIG. 27(A) to FIG. 27(E) are schematic views of a memory device of one embodiment of the present invention.

FIG. 27(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 of the substrate 1104 or the like.

Figure 27B:
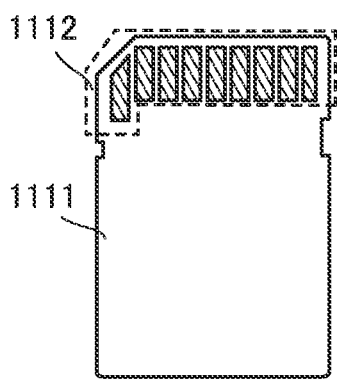
Figure 27C:
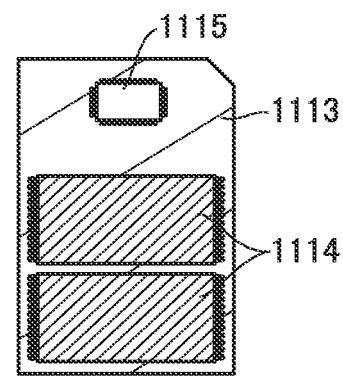

FIG. 27(B) is a schematic external view of an SD card, and FIG. 27(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between a host device and the SD card 1110. The semiconductor device described in the above embodiment can be incorporated in the memory chip 1114 of the substrate 1113 or the like.

Figures 27D, 27E:
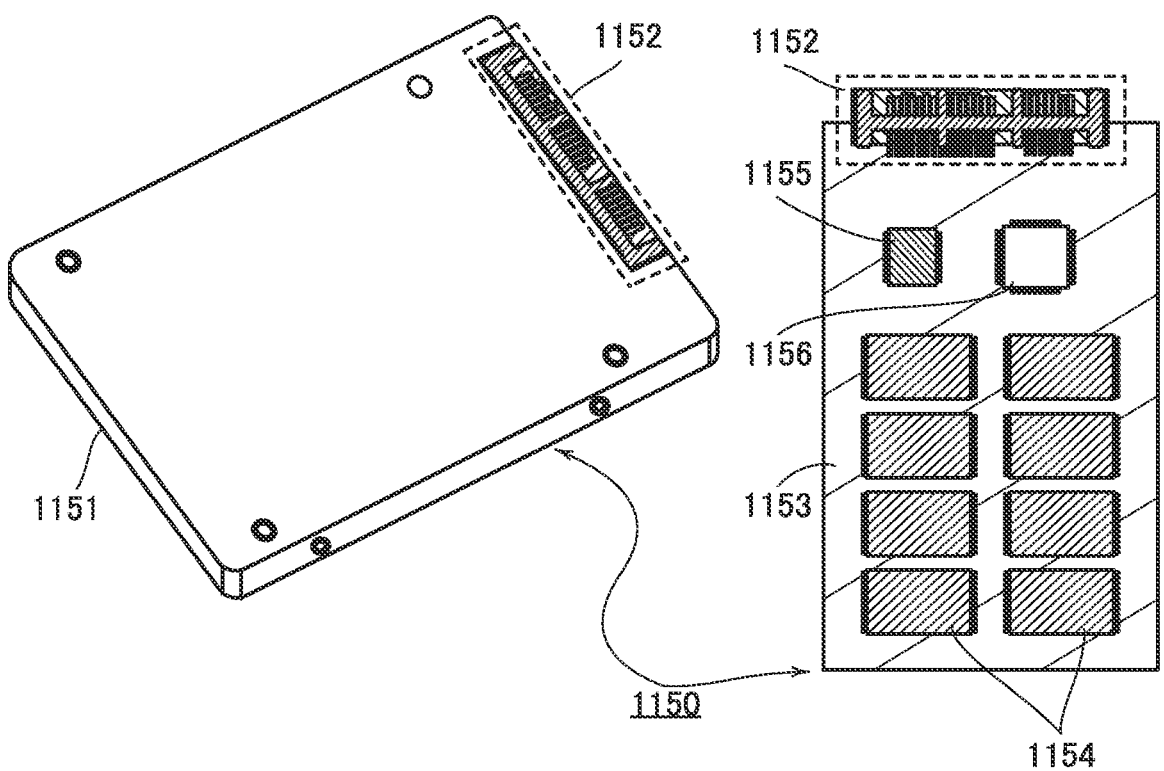

FIG. 27(D) is a schematic external view of an SSD, and FIG. 27(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip can be used, for example. When the memory chip 1154 is also provided on the rear surface side of the substrate 1153, the capacity of the SSD 1150 can be increased. The semiconductor device described in the above embodiment can be incorporated in the memory chip 1154 of the substrate 1153 or the like.

This embodiment can be implemented in an appropriate combination with the structures described in the other embodiments, the examples, and the like.

Embodiment 6

The semiconductor device of one embodiment of the present invention can be used for a chip or a processor such as a CPU or a GPU. FIG. 28 illustrates specific examples of electronic devices including a processor such as a CPU or a GPU or a chip of one embodiment of the present invention.
<Electronic Device and System>

The GPU or the chip of one embodiment of the present invention can be incorporated into a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 28 illustrates examples of electronic devices.

[Information Terminal]

Figure 28A:
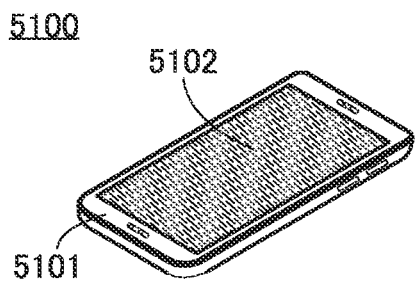
FIG. 28(A) to FIG. 28(H) are diagrams illustrating electronic devices of one embodiment of the present invention.

FIG. 28(A) illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

The information terminal 5100 can execute an application utilizing artificial intelligence, with the use of the chip of one embodiment of the present invention. Examples of the application utilizing artificial intelligence include an application for interpreting a conversation and displaying its content on the display portion 5102; an application for recognizing letters, figures, and the like input to the touch panel of the display portion 5102 by a user and displaying them on the display portion 5102; and an application for biometric authentication using fingerprints, voice prints, or the like.

Figure 28B:
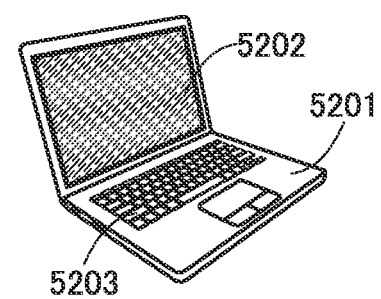

FIG. 28(B) illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence, with the use of the chip of one embodiment of the present invention. Examples of the application utilizing artificial intelligence include design-support software, text correction software, and software for automatic menu generation. Furthermore, with the use of the notebook information terminal 5200, novel artificial intelligence can be developed.

Note that although the smartphone and the notebook information terminal are respectively illustrated in FIG. 28(A) and FIG. 28(B) as examples of the electronic device, one embodiment of the present invention can be applied to an information terminal other than the smartphone and the notebook information terminal. Examples of an information terminal other than the smartphone and the notebook information terminal include a PDA (Personal Digital Assistant), a desktop information terminal, and a workstation.

[Game Machine]

Figure 28C:
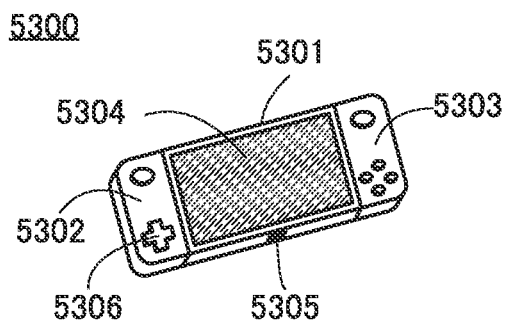

FIG. 28(C) illustrates a portable game machine 5300, which is an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), a video to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into a chip provided on a substrate in the housing 5301, the housing 5302, and the housing 5303, for example.

Figure 28D:
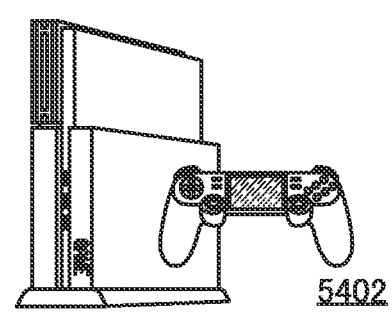

FIG. 28(D) illustrates a stationary game machine 5400, which is an example of a game machine. A controller 5402 is connected to the stationary game machine 5400 with or without a wire.

Using the GPU or the chip of one embodiment of the present invention in a game machine such as the portable game machine 5300 and the stationary game machine 5400 can achieve a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5300, the portable game machine 5300 including artificial intelligence can be obtained.

In general, the progress of a game, the actions and words of game characters, and expressions of a phenomenon and the like in the game are determined by the program in the game; however, the use of artificial intelligence in the portable game machine 5300 enables expressions not limited by the game program. For example, questions posed by the player, the progress of the game, timing when an event occurs in the game, the actions and words of the game characters, and the like can be changed for various expressions without being limited by the game program.

When a game requiring a plurality of players is played on the portable game machine 5300, the artificial intelligence can create a virtual game player; thus, the game can be played alone with the game player created by the artificial intelligence as an opponent.

Although the portable game machine and the stationary game machine are respectively illustrated in FIG. 28(C) and FIG. 28(D) as examples of a game machine, the game machine using the GPU or the chip of one embodiment of the present invention is not limited thereto. Examples of the game machine using the GPU or the chip of one embodiment of the present invention include an arcade game machine installed in entertainment facilities (a game center, an amusement park, and the like) and a throwing machine for batting practice installed in sports facilities.

[Large Computer]

The GPU or the chip of one embodiment of the present invention can be used in a large computer.

Figure 28E:
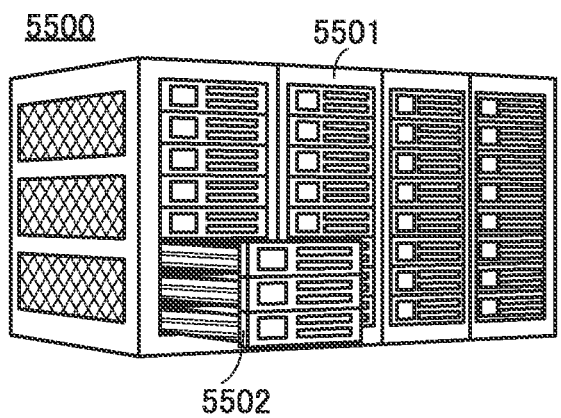
Figure 28F:
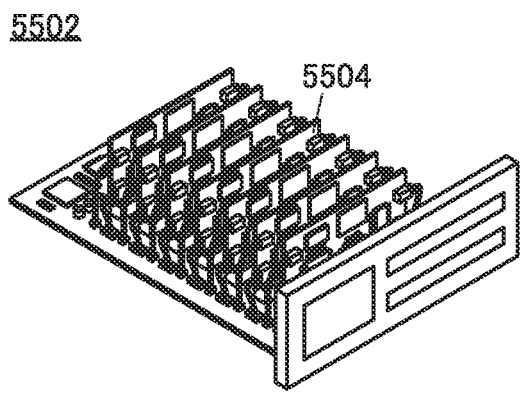

FIG. 28(E) illustrates a supercomputer 5500 as an example of a large computer. FIG. 28(F) illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504, and the GPU or the chip described in the above embodiment can be mounted on the substrates.

The supercomputer 5500 is a large computer mainly used for scientific computation. In scientific computation, an enormous amount of arithmetic operation needs to be processed at a high speed; hence, power consumption is high and chips generate a large amount of heat. Using the GPU or the chip of one embodiment of the present invention in the supercomputer 5500 can achieve a low-power-consumption supercomputer. Moreover, heat generation from a circuit can be reduced owing to low power consumption; thus, the influence of heat generation on the circuit, the peripheral circuit, and the module can be reduced.

Although a supercomputer is illustrated as an example of a large computer in FIG. 28(E) and FIG. 28(F), a large computer using the GPU or the chip of one embodiment of the present invention is not limited thereto. Examples of a large computer using the GPU or the chip of one embodiment of the present invention include a computer that provides service (a server) and a large general-purpose computer (a mainframe).

[Moving Vehicle]

The GPU or the chip of one embodiment of the present invention can be used in an automobile, which is a moving vehicle, and around a driver's seat in the automobile.

Figure 28G:
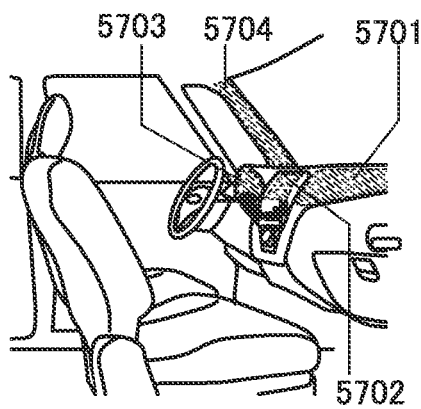

FIG. 28(G) illustrates the periphery of a windshield inside an automobile, which is an example of a moving vehicle. FIG. 28(G) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, a mileage, a fuel meter, a gear-shift indicator, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided on the outside of the automobile. That is, displaying an image taken by the imaging device provided on the outside of the automobile leads to compensation for the blind spot and enhancement of safety. In addition, showing an image for compensating for the area that cannot be seen makes it possible to confirm the safety more naturally and comfortably. The display panel 5704 can also be used as a lighting device.

Since the GPU or the chip of one embodiment of the present invention can be used as a component of artificial intelligence, the chip can be used in an automatic driving system of the automobile, for example. The chip can also be used for a system for navigation, risk prediction, or the like. The display panel 5701 to the display panel 5704 may display information regarding navigation, risk prediction, or the like.

Although an automobile is described above as an example of a moving vehicle, a moving vehicle is not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Electrical Appliance]

Figure 28H:
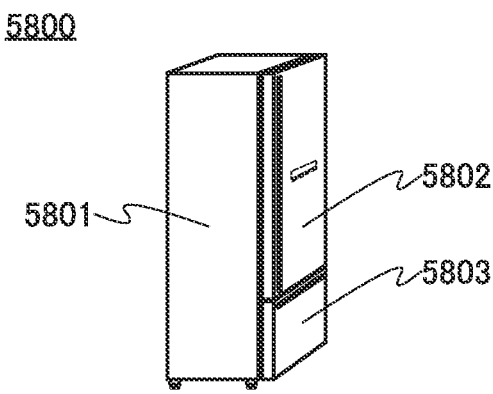

FIG. 28(H) illustrates an electric refrigerator-freezer 5800, which is an example of an electrical appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an example of an electrical appliance, other examples of an electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, application examples of artificial intelligence and its effects, and the like described in this embodiment can be combined as appropriate with the description of another electronic device.

This embodiment can be implemented in an appropriate combination with the structures described in the other embodiments, the examples, and the like.

REFERENCE NUMERALS

200: transistor, 200a: transistor, 200b: transistor, 205: conductor, 205a: conductor, 205b: conductor, 205c: conductor, 210: insulator, 212: insulator, 214: insulator, 216: insulator, 222: insulator, 224: insulator, 230: oxide, 230a: oxide, 230A: oxide film, 230b: oxide, 230B: oxide film, 230c: oxide, 230c1: oxide, 230c2: oxide, 230C: oxide film, 234: region, 240: conductor, 240a: conductor, 240b: conductor, 241: insulator, 245: conductor, 247: conductor, 247a: conductor, 247b: conductor, 247c: conductor, 248: opening, 249: region, 249a: region, 249b: region, 250: insulator, 250A: insulating film, 252: mask, 256: insulator, 256A: insulating film, 257: dopant, 258: insulator, 258A: insulating film, 258B: insulator, 260: conductor, 260a: conductor, 260A: conductive film, 260b: conductor, 260B: conductive film, 262: dummy gate, 262A: dummy gate, 272: insulator, 274: insulator, 276: insulator, 280: insulator, 280A: insulating film, 281: insulator, 282: insulator

The invention claimed is:

1. A semiconductor device comprising:
a first conductor and a second conductor;
a first insulator and a second insulator; and
a first oxide and a second oxide,
wherein the first oxide is disposed over the first insulator and the first conductor,
wherein a first opening reaching the first conductor is provided in the first oxide,
wherein the second oxide is disposed over the first oxide,
wherein the second oxide is in direct contact with a top surface of the first conductor via the first opening,
wherein the second insulator is disposed over the second oxide, and
wherein the second conductor is disposed over the second insulator.

2. The semiconductor device according to claim 1, wherein the first oxide and the second oxide comprise In, an element M (M is Al, Ga, Y, or Sn), and Zn.

3. The semiconductor device according to claim 1, wherein a capacitor is provided under the first conductor, and
wherein one electrode of the capacitor is electrically connected to the first conductor.

4. The semiconductor device according to claim 3, wherein a transistor formed over a silicon substrate is provided under the capacitor.

5. The semiconductor device according to claim 1, wherein a top surface of the first insulator and the top surface of the first conductor are aligned with each other.

* * * * *